United States Patent
Mori et al.

(10) Patent No.: US 9,834,859 B2
(45) Date of Patent: Dec. 5, 2017

(54) METHOD FOR PRODUCING GROUP III NITRIDE CRYSTAL, GROUP III NITRIDE CRYSTAL, AND SEMICONDUCTOR DEVICE

(71) Applicant: OSAKA UNIVERSITY, Suita-shi, Osaka (JP)

(72) Inventors: Yusuke Mori, Suita (JP); Mamoru Imade, Suita (JP); Masashi Yoshimura, Suita (JP); Mihoko Hirao, Suita (JP); Masayuki Imanishi, Suita (JP)

(73) Assignee: OSAKA UNIVERSITY, Osaka (JP)

( * ) Notice: Subject to any disclaimer, the term of this patent is extended or adjusted under 35 U.S.C. 154(b) by 415 days.

(21) Appl. No.: 14/371,607

(22) PCT Filed: Jan. 10, 2013

(86) PCT No.: PCT/JP2013/050342
§ 371 (c)(1),
(2) Date: Jul. 10, 2014

(87) PCT Pub. No.: WO2013/105618
PCT Pub. Date: Jul. 18, 2013

(65) Prior Publication Data
US 2014/0328742 A1    Nov. 6, 2014

(30) Foreign Application Priority Data
Jan. 11, 2012 (JP) .................. 2012-003637

(51) Int. Cl.
*C30B 19/02* (2006.01)
*C30B 19/12* (2006.01)
(Continued)

(52) U.S. Cl.
CPC .............. *C30B 19/02* (2013.01); *C30B 19/12* (2013.01); *C30B 29/403* (2013.01);
(Continued)

(58) Field of Classification Search
None
See application file for complete search history.

(56) References Cited

U.S. PATENT DOCUMENTS 6,413,627 B1    7/2002    Motoki et al.
6,693,021 B1    2/2004    Motoki et al.
(Continued)

FOREIGN PATENT DOCUMENTS

CN    1283306    2/2001
CN    1877877    12/2006
(Continued)

OTHER PUBLICATIONS

Office Action of corresponding Korean Patent Application No. 10-2014-7016998 dated Jul. 27, 2015 with its partial English translation.
(Continued)

*Primary Examiner* — Guinever S Gregorio
(74) *Attorney, Agent, or Firm* — Hamre, Schumann, Mueller & Larson, P.C.

(57) ABSTRACT

The present invention provides a method for producing a Group III nitride crystal, capable of producing a Group III nitride crystal in a large size with few defects and high quality. The method is a method for producing a Group III nitride crystal (13), including: a seed crystal selection step of selecting plural parts of a Group III nitride crystal layer (11) as seed crystals for generation and growth of Group III nitride crystals (13); a contact step of causing the surfaces of the seed crystals to be in contact with an alkali metal melt; a crystal growth step of causing a Group III element and nitrogen to react with each other under a nitrogen-containing atmosphere in the alkali metal melt to generate and grow the Group III nitride crystals (13), wherein the seed crystals are hexagonal crystals, in the seed crystal selection step, the seed crystals are arranged so that m-planes of the respective
(Continued)

crystals grown from the seed crystals that are adjacent to each other do not substantially coincide with each other, and in the crystal growth step, the plural Group III nitride crystals (13) grown from the plural seed crystals by the growth of the Group III nitride crystals (13) are bound.

11 Claims, 35 Drawing Sheets

(51) Int. Cl.
  *H01L 21/02* (2006.01)
  *C30B 29/40* (2006.01)
  *H01L 29/20* (2006.01)
  *H01L 33/00* (2010.01)

(52) U.S. Cl.
  CPC ...... *H01L 21/0242* (2013.01); *H01L 21/0254* (2013.01); *H01L 21/02609* (2013.01); *H01L 21/02625* (2013.01); *H01L 21/02639* (2013.01); *H01L 21/02645* (2013.01); *H01L 21/02647* (2013.01); *H01L 29/2003* (2013.01); *H01L 33/007* (2013.01)

(56) References Cited

U.S. PATENT DOCUMENTS

| | | | |
|---|---|---|---|
| 2003/0227026 A1* | 12/2003 | Goto | H01L 29/045 257/103 |
| 2004/0183090 A1 | 9/2004 | Kitaoka et al. | |
| 2005/0064206 A1* | 3/2005 | Akita | C30B 25/02 428/446 |
| 2006/0272572 A1 | 12/2006 | Uematsu et al. | |
| 2008/0264331 A1 | 10/2008 | Iwata et al. | |
| 2009/0155989 A1 | 6/2009 | Uematsu et al. | |
| 2009/0236694 A1* | 9/2009 | Mizuhara | C30B 29/403 257/615 |
| 2010/0044718 A1* | 2/2010 | Hanser | C30B 25/02 257/76 |
| 2010/0148212 A1 | 6/2010 | Fujito et al. | |
| 2012/0111264 A1 | 5/2012 | Shimodaira et al. | |
| 2012/0164386 A1* | 6/2012 | Pimputkar | C30B 7/105 428/156 |

FOREIGN PATENT DOCUMENTS

| | | |
|---|---|---|
| EP | 2 154 272 | 2/2010 |
| JP | 2000-012900 | 1/2000 |
| JP | 2007-254258 | 10/2007 |
| JP | 2008-143772 | 6/2008 |
| JP | 2009-029639 | 2/2009 |
| JP | 2010-222254 | 10/2010 |
| JP | 2012-006772 | 1/2012 |
| JP | 4588340 B | 12/2012 |
| KR | 10-2007-0018952 | 2/2007 |
| WO | 2011/004904 | 1/2011 |

OTHER PUBLICATIONS

Extended European Search Report of the corresponding European Patent Application No. 13736325.5 dated Jul. 31, 2015.

Imanishi, et al., "Coalescence Growth of Dislocation-Free GaN Crystals by the Na-Flux Method", Applied Physics Express, vol. 5, No. 9, pp. 095501-1-095501-03, 2012.

Abstract of Kawamura, et al., "Study of the metastable region in the growth of GaN using the Na flux method", Journal of Crystal Growth, vol. 311, issue 22, Nov. 1, 2009, pp. 4647-4651.

Office Action issued in corresponding Chinese Application No. 20138005328.6, dated Feb. 6, 2016, 6 pages.

Office Action issued in corresponding Japanese Patent Application No. 2013-553314 dated Jul. 13, 2015 with its partial English translation.

Iwahashi, et al., "Liquid Phase Epitaxy Growth of *m*-Plane GaN Substrate Using the Na Flux Method", Japanese Journal of Applied Physics, vol. 46, No. 10, pp. L227-L229 (2007).

Imade, et al., "Growth of Large GaN Single Crystals on High-Quality GaN Seed by Carbon-Added Na Flux Method", Applied Physics Express, vol. 3, p. 075501 (1-3) (2010).

* cited by examiner (a)

(b)

(c)

(d)

(e)

(f)

(a)

(b)

(c)

| Substrate | c-plane template |
|---|---|
| Growth temperature [°C] | 870 |
| Growth pressure [MPa] | 3.6 |
| Growth time [h] | 96 |
| Ga:Na (Double amount) | 10:90 |
| C concentration [mol%] | 0.5 |
| The number of holes | 2 | ary
METHOD FOR PRODUCING GROUP III NITRIDE CRYSTAL, GROUP III NITRIDE CRYSTAL, AND SEMICONDUCTOR DEVICE

TECHNICAL FIELD

The present invention relates to a method for producing a Group III nitride crystal, a Group III nitride crystal, and a semiconductor device.

BACKGROUND ART

A Group III nitride semiconductor (Group III nitride compound semiconductor or a GaN semiconductor) such as gallium nitride (GaN) has been used widely as materials of various semiconductor elements such as a laser diode (LD) and a light-emitting diode (LED). For example, the laser diode (LD) that emits blue light is applied to a high-density optical disc or a display, and a light-emitting diode (LED) that emits blue light is applied to a display or illumination. Moreover, an ultraviolet LD is expected to be applied to biotechnology and the like, and an ultraviolet LED is expected as an ultraviolet source of a fluorescent lamp.

As a general method for producing a Group III nitride (e.g., GaN) crystal substrate, there is vapor-phase epitaxial growth, for example. As a method capable of producing a Group III nitride single crystal with higher quality, a crystal growth method in a liquid phase is performed. This liquid phase epitaxy method (LPE: Liquid Phase Epitaxy) has had a problem in that the method was required to be performed under high temperature and high pressure. However, with recent improvements, the method could be performed under relatively low temperature and relatively low pressure and became a method suitable for mass production.

A method in which a Group III nitride crystal layer is deposited on a sapphire substrate by an organometallic vapor phase epitaxy (MOCVD: Metalorganic Chemical Vapor Deposition), and thereafter, the Group III nitride crystal thus obtained is further grown by the liquid phase epitaxy method has been reported. Specifically, in Patent Document 1, plural parts of the Group III nitride semiconductor layer formed over the sapphire substrate by MOCVD or the like are selected as seed crystals, and the seed crystals are caused to be in contact with an alkali metal melt to grow the Group III nitride crystal.

PRIOR ART DOCUMENT

Patent Document

Patent Document 1: Japanese Patent No. 4588340

SUMMARY OF INVENTION

Problem to be Solved by the Invention

However, as described below, it is really difficult to produce a Group III nitride crystal in a large size with few defects such as a distortion, a dislocation, and warping and high quality by the conventional method for producing a Group III nitride crystal.

That is, first, when a Group III nitride crystal is produced by vapor-phase epitaxial growth or the like, a substrate for epitaxial growth is required. As this substrate, a low-cost sapphire substrate generally is used. However, there is a large difference in lattice constant, thermal expansion coefficient, and the like between the sapphire substrate and the Group III nitride crystal. Therefore, defects such as a distortion, a dislocation, and warping are generated in the Group III nitride crystal. The problems of the defects become significant as the size of the crystal increases. In the present invention, "sapphire" indicates a crystal containing an aluminum oxide crystal or an aluminum oxide as a main component, unless otherwise mentioned.

Further, in order to solve the problem of the difference in lattice constant, it is considered that the Group III nitride crystal is grown from a Group III nitride seed crystal in a large size with few defects, as a substitute for the sapphire substrate. More specifically, for example, it is considered that a Group III nitride substrate is used as a seed crystal as a substitute for the sapphire substrate. However, the Group III nitride seed crystal in a large size such as a Group III nitride substrate is really expensive, so that the costs are increased. In the conventional art, it is almost impossible to obtain a Group III nitride seed crystal in a large size with few defects such as a distortion, a dislocation, and warping and high quality. Therefore, the grown Group III nitride crystal receives crystal defects of the seed crystal, and it is difficult to fundamentally solve the problems.

Moreover, as a method for producing a Group III nitride crystal in a large size with few defects, a method in which a fine seed crystal is grown in a liquid phase for a long period of time is considered. However, it is really difficult to obtain a crystal in a large size by this method.

Furthermore, as mentioned above, the Patent Document 1 describes that Group III nitride crystals are grown using plural parts of a Group III nitride semiconductor layer as seed crystals. In this case, plural Group III nitride crystals grown from the plural seed crystals are grown and bound to (associated with) each other. However, there is a possibility that the plural Group III nitride crystals do not orderly bind (associate with) each other at the boundaries, and crystal defects are generated.

Therefore, the present invention is intended to provide a method for producing a Group III nitride crystal, capable of producing a Group III nitride crystal in a large size with few defects and high quality, a Group III nitride crystal produced thereby, and a semiconductor device using the same.

Means for Solving Problem

In order to achieve the aforementioned object, the method for producing a Group III nitride crystal of the present invention (hereinafter also referred to as the Group III nitride crystal production method of the present invention or the production method of the present invention) is a method for producing a Group III nitride crystal, including: a seed crystal selection step of selecting plural parts of previously-provided Group III nitride as seed crystals for generation and growth of Group III nitride crystals; a contact step of causing the surfaces of the seed crystals to be in contact with an alkali metal melt; a crystal growth step of causing a Group III element and nitrogen to react with each other under a nitrogen-containing atmosphere in the alkali metal melt to generate and grow Group III nitride crystals, wherein the seed crystals are hexagonal crystals, in the seed crystal selection step, the seed crystals are arranged so that m-planes of the respective crystals grown from the seed crystals that are adjacent to each other do not almost coincide with each other, and in the crystal growth step, the plural Group III nitride crystals grown from the plural seed crystals by the growth of the Group III nitride crystals are bound.

The Group III nitride crystal of the present invention is a Group III nitride crystal produced by the production method of the present invention or a Group III nitride crystal produced by further growing the Group III nitride crystal.

The semiconductor device of the present invention is a semiconductor device including the Group III nitride crystal of the present invention being a semiconductor.

Effects of the Invention

According to the present invention, a method for producing a Group III nitride crystal, capable of producing a Group III nitride crystal in a large size with few defects and high quality, a Group III nitride crystal produced thereby, and a semiconductor device using the same can be provided.

DESCRIPTION OF EMBODIMENTS

Figure 1:
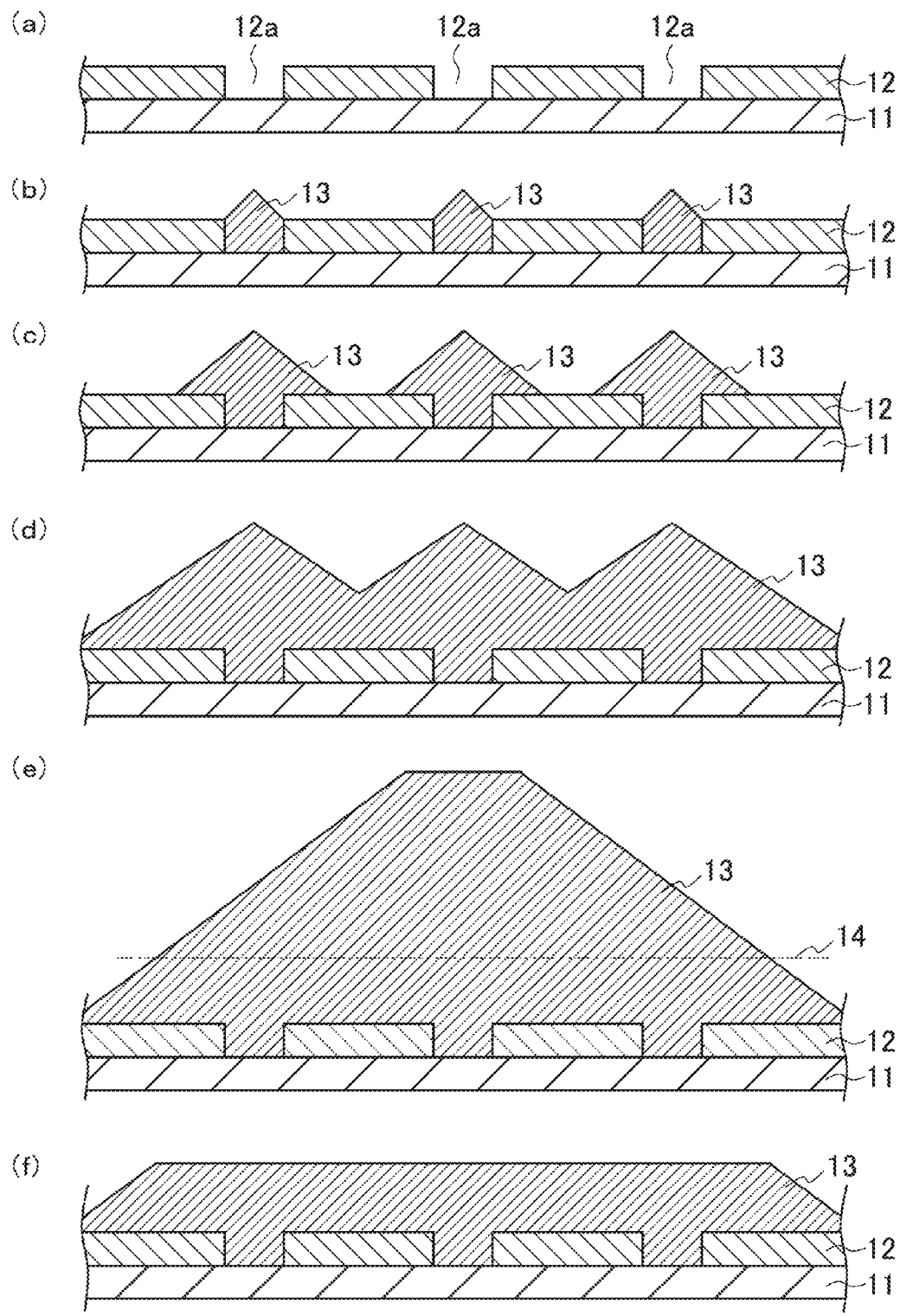
FIG. 1 shows step cross-sectional views showing an example of the first production method of the present invention (method for producing a Group III nitride crystal using units in each of which a mask having plural dot-shaped through holes is formed over a Group III nitride crystal layer).

Next, the present invention is described below with reference to examples. The present invention, however, is not limited by the following description.

<1. Production Method of the Present Invention>

The Group III nitride crystal production method of the present invention is, as mentioned above, a method for producing a Group III nitride crystal, including: a seed crystal selection step of selecting plural parts of previously-provided Group III nitride as seed crystals for generation and growth of Group III nitride crystals; a contact step of causing the surfaces of the seed crystals to be in contact with an alkali metal melt; a crystal growth step of causing a Group III element and nitrogen to react with each other under a nitrogen-containing atmosphere in the alkali metal melt to generate and grow Group III nitride crystals, wherein the seed crystals are hexagonal crystals, in the seed crystal selection step, the seed crystals are arranged so that m-planes of the respective crystals grown from the seed crystals that are adjacent to each other do not almost coincide with each other, and in the crystal growth step, the plural Group III nitride crystals grown from the plural seed crystals by the growth of the Group III nitride crystals are bound.

In the production method of the present invention, it is preferred that the seed crystals are arranged so that the a-axes or the c-axes of the seed crystals that are adjacent to each other almost coincide with each other. In a hexagonal crystal, the number of "a-axes" is three including a1, a2, and a3 that are equivalent to one another. In the present invention, the state where a-axes of two seed crystals that are adjacent to each other almost coincide with each other indicates the state where any one of the three a-axes of one of the two seed crystals almost coincides with any one of the three a-axes of the three a-axes of the other. Moreover, in the present invention, "almost coinciding" or "substantially coinciding" encompasses both of the case of completely coinciding and the case of substantially coinciding with a slight deviation. The same applies to the case of being represented by "almost" or "substantially" in the other states.

As mentioned above, when a Group III nitride crystal is grown from Group III nitride seed crystals in large sizes, the grown Group III nitride crystal receives crystal defects of the seed crystals. In order to solve this problem, the inventors of the present invention found that a Group III nitride crystal is grown to be large from small Group III nitride seed crystals. By using small Group III nitride seed crystals as described above, defects in the grown Group III nitride crystal can be reduced. Although the reason of this is not always clear, the reason is considered that the grown Group III nitride crystal tends not to receive crystal defects of the seed crystals, compared with the case where large Group III nitride seed crystals are used.

However, in the case of using small Group III nitride seed crystals, the sizes of the Group III nitride crystals obtained by the growth have limitations. Thus, it is considered to bind plural Group III nitride crystals grown from plural seed crystals by the growth in order to obtain a large crystal. However, as the result of studies, the inventors of the present invention found that there is a possibility that, in the course of binding the plural crystals by the growth, defects are generated in binding sites. In order to solve this problem, the inventors of the present invention conducted further studies and then found that m-places of crystals grown from hexagonal seed crystals are caused not to be substantially joined with each other, i.e., the seed crystals are arranged so that m-planes of crystals grown from seed crystals that are adjacent to each other do not almost coincide with each other. Thus, defects in the binding site of the two seed crystals can be prevented or reduced. Moreover, the inventors of the present invention found that a crystal with fewer defects and higher quality can be produced by arranging the seed crystals so that a-axes or c-axes of the seed crystals that are adjacent to each other almost (substantially) coincide with each other.

In the Group III nitride crystal produced by the Group III nitride crystal production method of the present invention (the Group III nitride crystal of the present invention), the dislocation density is not particularly limited and is, preferably $1.0 \times 10^4$ m$^{-2}$ or less, more preferably $1.0 \times 10^3$ cm$^{-2}$ or less, yet more preferably $1.0 \times 10^2$ cm$^{-2}$ or less. Although the dislocation density is ideally 0, it is generally impossible for the dislocation density to be 0. Thus, for example, the dislocation density is a value more than 0 and is particularly preferably a measurement limit or less of a measurement device. The dislocation density may be, for example, an average value of the entire crystal, and more preferably, the maximum value in the crystal is the above-described value or less. In the Group III nitride crystal of the present invention, the half width of each of a symmetric reflection component (002) and an asymmetric reflection component (102) by XRC is, for example, 100 seconds or less, preferably 30 seconds or less, ideally 0.

The Group III nitride crystal production method of the present invention may further include a crystal re-growth step of further growing the produced Group III nitride crystal. Specifically, for example, in the crystal re-growth step, the produced Group III nitride crystal is cut so that any plane (e.g., c-, m-, or a-plane or another nonpolar plane) is exposed, and the Group III nitride crystal is further grown using the plane as a crystal growth plane. Thus, a Group III nitride crystal with a large area of any plane and a large thickness can be produced.

<2. Arrangement Relationship, Shape, Size, and the Like of Seed Crystal>

As mentioned above, in the Group III nitride crystal production method of the present invention, the seed crystals are arranged so that m-planes of crystals grown from the seed crystals that are adjacent to each other do not almost coincide with each other. Moreover, it is preferred that the seed crystals are arranged so that a-axes or c-axes of the seed crystals that are adjacent to each other almost coincide with each other. The arrangement in which m-planes of crystals grown from the seed crystals that are adjacent to each other do not almost coincide with each other and the arrangement in which a-axes or c-axes of the seed crystals that are adjacent to each other almost coincide with each other are described using FIGS. 37A to 42C. FIGS. 37A to 42C, however, are mere examples and do not limit the present invention. Hereinafter, the conditions where m-planes of crystals grown from seed crystals that are adjacent to each other do not almost coincide with each other are also referred to as the "conditions (M)", the conditions where a-axes of two seed crystals that are adjacent to each other almost (substantially) coincide with each other is also referred to as the "conditions (A)", and the conditions where c-axes of two seed crystals that are adjacent to each other almost (substantially) coincide with each other is also referred to as the "conditions (C)".

First, the conditions (the conditions (A)) where a-axes of two seed crystals that are adjacent to each other almost (substantially) coincide with each other and the conditions (the conditions (M)) where m-planes of crystals grown from seed crystals that are adjacent to each other do not almost coincide with each other are described using FIGS. 37A to 37E as examples. In the present invention, the crystal growth plane of each seed crystal is not particularly limited and may be, for example, any of c-, m-, and a-planes and any other plane and is preferably a nonpolar plane, more preferably a c- or m-plane. The case where c-planes of seed crystals (c-plane seed crystals) having the c-planes are selected as crystal growth planes, and crystals are grown from the c-planes is shown in FIGS. 37A to 37E.

Each of FIGS. 37A to 37E is a plan view showing an arrangement of two seed crystals that are adjacent to each other as an example. In each of FIGS. 37A to 37E, a c-plane (crystal growth plane) is parallel with a plane of paper. Each of FIGS. 37A to 37E shows crystals in the case where two hexagonal crystals are grown from two dot-like seed crystals, for the sake of convenience. Three a-axes of these crystals coincide with the respective three diagonal lines that pass through the center of the hexagon and match with the respective a-axes of seed crystals from which these crystals are derived.

Figure 37A:
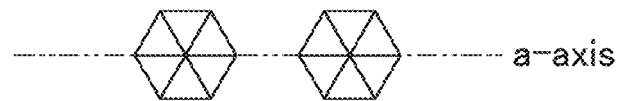
FIGS. 37A to 37E are plan views showing examples of an arrangement of two seed crystals that are adjacent to each other in c-plane seed crystals.
Figure 37B:
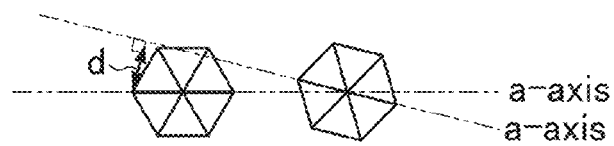

First, the conditions (A) are described. FIG. 37A shows the state where a-axes of two seed crystals that are adjacent to each other completely coincide with each other as an example of the arrangement satisfying the conditions (A). In the Group III nitride crystal production method of the present invention, the two seed crystals that are adjacent to each other are ideally made in such arrangement. The conditions (A), however, are satisfied as long as a-axes of the seed crystals that are adjacent to each other almost coincide with each other. In the conditions (A), the state where the a-axes almost (substantially) coincide with each other encompasses the state where the a-axes completely coincide with each other as shown in FIG. 37A and is, however, not limited to only this and encompasses the state where the a-axes substantially coincide with each other with a slight deviation, for example. Specifically, for example, as shown in FIG. 37B, an a-axis of one of the seed crystals may be slightly tilted relative to an a-axis of the other seed crystal. The arrangement is not limited to the arrangement where a-axes of two seed crystals coincide or intersect with each other as shown in FIGS. 37A and 37B and may be in the state where a-axes of two seed crystals are parallel with each other and are slightly apart from each other as shown in FIG. 37E.

In the conditions (A), an angle formed between the a-axes is less than 30° (degree) and preferably as small as possible. The angle formed between the a-axes is preferably 5° or less, more preferably 1° or less, yet more preferably 0.1° or less, yet further more preferably 0.02° or less, particularly preferably 0°. In the case where the a-axes completely coincide with each other as shown in FIG. 37A and in the case where the a-axes are parallel with each other as shown in FIG. 37E, the angle formed between the a-axes is 0°. However, the angle formed between the a-axes generally is not exactly 0°, and directions of the a-axes are slightly deviated from each other.

Each of the two seed crystals is a hexagonal crystal. Thus, each seed crystal has three a-axes. When whether or not the conditions (A) of the present invention are satisfied is determined, a-axes and the angle formed between the a-axes are defined by the following (1) to (3):

(1) Any one of three a-axes of each of two seed crystals that are adjacent to each other is selected. The number of combinations of a-axes by this selection is 3×3=9.

(2) The two a-axes selected in (1) form an angle.

(3) Among 9 combinations in (1), a combination of a-axes with the minimum angle of (2) is used as a-axes, and the angle (of (2)) formed between the a-axes in the combination is used as the angle formed between the a-axes.

When the distance between the a-axes of the two seed crystals that are adjacent to each other is too large, the a-axes do not substantially coincide with each other. Thus, the conditions (A) are not satisfied. When the a-axes are parallel with each other, the distance is, for example, a length represented by a sign d in each of FIGS. 37C and 37E. When the a-axes are not parallel with each other, the distance between the a-axes is, for example, in the case where a line perpendicular to one of the a-axes toward the other a-axis coincides with either of the two seed crystals in at least one point, a length of the longest perpendicular line (e.g., a length of a sign d in each of FIGS. 37B and 37D assuming that a hexagon shown in each of FIGS. 37B and 37D is a seed crystal). In the conditions (A), the distance between the a-axes is, for example, 1 mm or less, preferably 0.5 mm or less, more preferably 0.3 mm or less, yet more preferably 0.1 mm or less, particularly preferably 0.05 mm or less, ideally 0. The case where the distance between the a-axes is 0 is the case where the a-axes completely coincide with each other (e.g., FIG. 37A).

Figure 37C:
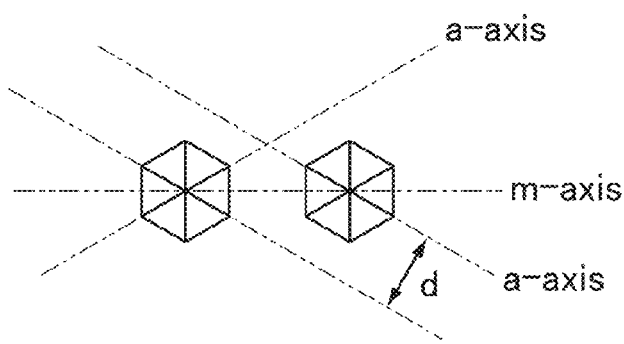
Figure 37D:
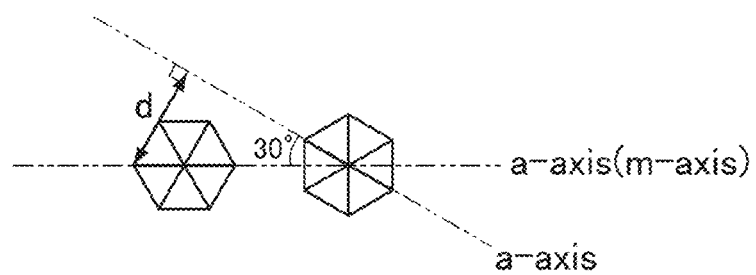
Figure 37E:
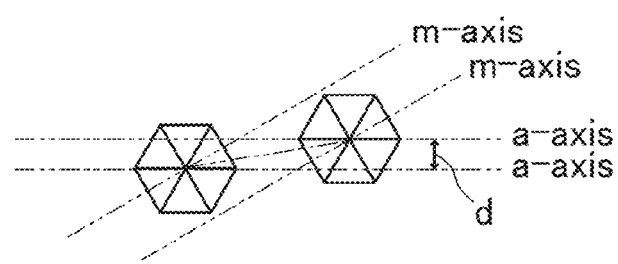

An example in which the conditions (A) are not satisfied is shown in FIGS. 37C and 37D. In FIG. 37C, although a-axes of two seed crystals that are adjacent to each other are parallel with each other, the distance d between the a-axes is too large. Thus, the a-axes do not substantially coincide with each other. In FIG. 37C, m-axes of the two seed crystals coincide with each other. Thus, m-planes (sides of hexagon shown in FIG. 37C) of crystals generated from the two seed crystals face to each other. When two seed crystals that are adjacent to each other are arranged as described above, for example, as shown in the comparative examples described below, two crystals grown from the two seed crystals are associated with (bound to) each other in the state where m-planes of the two crystals face to (coincide with) each other. That is, m-planes of the crystals grown from the two seed crystals that are adjacent to each other coincide with each other, and thus, the conditions (M) are not satisfied. In such a case, crystal defects are generated in the plane in which the association (binding) occurs, and thus, a Group III nitride crystal with high quality cannot be obtained, and the object of the present invention cannot be achieved. That is, it is required that m-planes of two crystals grown from two seed crystals that are adjacent to each other do not substantially face to each other (do not substantially coincide with each other) in the present invention. In FIG. 37E, the distance d between the a-axes is small as shown in FIG. 37E. Thus, when the two crystals are grown, an area in which the m-planes face to (coincide with) each other is small. When an area in which the m-planes face to (coincide with) each other is really small, it can be said that the m-planes do not substantially face to each other (do not substantially coincide with each other). In the present invention, for example, by satisfying the conditions (A), the conditions where m-planes of two crystals grown from two seed crystals that are adjacent to each other do not substantially face to each other (do not almost coincide with each other) can be satisfied. In the case where a-axes of two seed crystals that are adjacent to each other completely coincide with each other as shown in FIG. 37A, when crystals grown from these seed crystals are associated with (bound to) each other, the association (binding) does not occur in the state where m-planes face to (coincide with) each other as described below.

In FIG. 37D, the angle formed between a-axes of two seed crystals that are adjacent to each other is 30°, so that the conditions (A) are not satisfied. It is preferred that the angle formed between the a-axes is as small as possible, and the angle is specifically as mentioned above.

In each of FIGS. 37C and 37D, the center of the left seed crystal coincides with the m-axis of the right seed crystal. In the present invention, when each seed crystal has a dot shape, it is preferred that the center of one of the seed crystals does not coincide with the m-axis of the other seed crystal (e.g., FIGS. 37C and 37D).

In the Group III nitride crystal production method of the present invention, the shape of each seed crystal is not particularly limited and is, for example, preferably a dot shape. The dot shape is not particularly limited, and examples thereof include a circle, an equilateral polygon, and shapes close thereto. Examples of the equilateral polygon include an equilateral triangle, a square, an equilateral pentagon, and an equilateral hexagon. Among them, a circle or an equilateral hexagon is particularly preferable from the viewpoint of few defects in a produced crystal (grown from the seed crystal) (isotropy or the like). The size of the seed crystal having a dot shape is not particularly limited and is preferably as small as possible from the viewpoint of producing a Group III nitride crystal with few defects and high quality. It is to be noted that the size of the seed crystal having a dot shape is preferably not too small from the viewpoint of production efficiency (growth efficiency) of the Group III nitride crystal. The diameter of a crystal growth plane (e.g., a c-plane in a c-plane seed crystal) of the seed crystal having a dot shape is, for example, 10 mm or less, preferably 5 mm or less, more preferably 3 mm or less, yet more preferably 1.5 mm or less, particularly preferably 1 mm or less. The lower limit of the diameter is, for example, 0.01 mm or more, preferably 0.05 mm or more, more preferably 0.1 mm or more, yet more preferably 0.3 mm or more, particularly preferably 0.5 mm or more. In the present invention, in the case where the shape of the seed crystal or the Group III nitride crystal is other than a circle (a perfect circle), the "diameter" represents "the major axis (the longest diameter)".

The shape of each seed crystal is not limited to the dot shape and may be, for example, any of a rectangle, an ellipse, a stripe shape, and shapes close to them, and any other shapes. The shape is preferably a dot shape from the viewpoint of few defects in a produced crystal (grown from the seed crystal) (isotropy or the like). The size of the seed crystal having a rectangle, an ellipse, a stripe shape, or the like is not particularly limited, and from the viewpoint of few defects in a produced crystal (grown from the seed crystal), the width is, for example, 10 mm or less, preferably 5 mm or less, yet more preferably 3 mm or less, yet further more preferably 1.5 mm or less, particularly preferably 1 mm or less. The lower limit of the width is, for example, 0.01 mm or more, preferably 0.05 mm or more, more preferably 0.1 mm or more, yet more preferably 0.3 mm or more, and particularly preferably 0.5 mm or more.

Figure 38A:
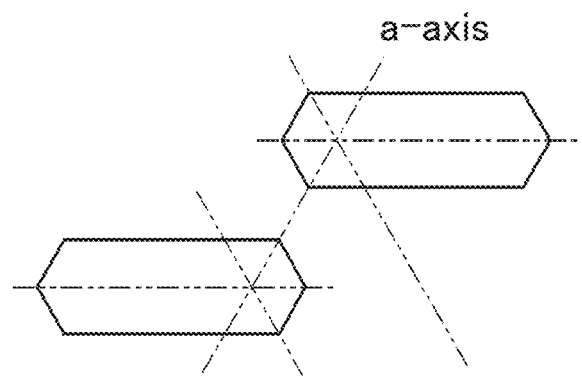
FIGS. 38A and 38B are plan views showing another example of an arrangement of two seed crystals that are adjacent to each other in c-pane seed crystals.
Figure 38B:
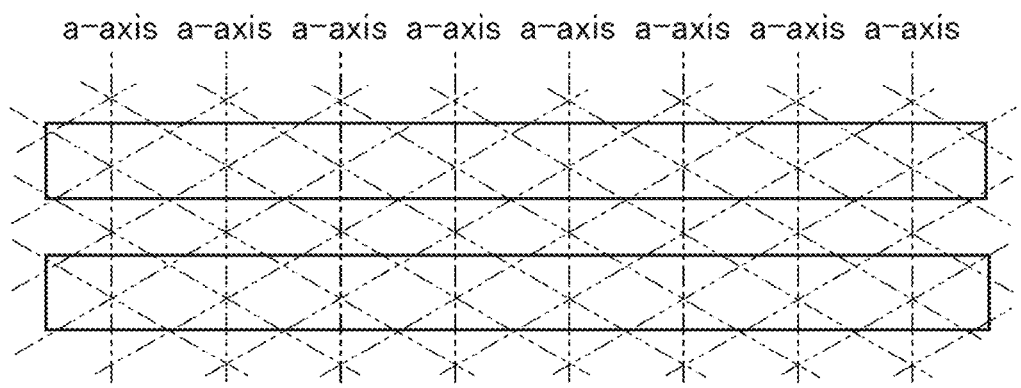

Another example of the arrangement of plural seed crystals (c-plane seed crystals) each having a c-plane is shown in FIGS. 38A and 38B. In each of FIGS. 38A and 38B, a c-plane (crystal growth plane) is parallel with a plane of paper. An example in which long and thin hexagonal crystals grown from seed crystals having a rectangle, an ellipse, or the like are adjacent to each other is shown in FIG. 38A. In such case, whether the conditions (A) are satisfied may be determined considering the angle formed between a-axes of the seed crystals that are adjacent to each other and the distance between the a-axes as in the description of FIGS. 37A to 37E. FIG. 38A is an example in which the a-axes completely coincide with each other, and apexes of grown hexagonal crystals are associated with (bound to) each other. FIG. 38B is an example in which the long side of a stripe-shaped seed crystal is almost (or completely) perpendicular to its a-axis. In such case, it can be considered that the a-axis is present at any position in the direction almost (or completely) perpendicular to the direction of the seed crystal. Thus, whether the conditions (A) are satisfied can be determined considering only the angle formed between the seed crystals that are adjacent to each other without considering the distance between the seed crystals.

In the Group III nitride crystal production method of the present invention, the distance between seed crystals that are adjacent to each other is not particularly limited and is preferably not too small from the viewpoint of obtaining a crystal with few defect and high quality. This is because it is difficult to receive defects of the seed crystals and a crystal with few defects and high quality can be easily obtained when crystals are bound to each other after sufficiently growing the seed crystals. From the viewpoint of production efficiency of a Group III nitride crystal, the distance between seed crystals is not too large. The upper limit of the distance between seed crystals that are adjacent to each other is, for example, 50 mm or less, preferably 40 mm or less, more preferably 30 mm or less, yet more preferably 20 mm or less, particularly preferably 10 mm or less. The lower limit of the distance between seed crystals that are adjacent to each other is, for example, 0.05 mm or more, preferably 0.1 mm or more, more preferably 0.3 mm or more, yet more preferably 0.5 mm or more, particularly preferably 1 mm or more.

In FIGS. 37A to 38B, the case where crystals are grown from c-planes of the seed crystals each having a c-plane (c-plane seed crystal) is described. In the case where the crystal growth plane is any plane (e.g., m-plane or the like) other than the c-plane, the sizes of the seed crystals and the numerical range of the distance between the seed crystals or the like are not particularly limited and are, for example, the same as those in the case where the crystal growth plane is the c-plane, for example.

The conditions (M), i.e., the conditions where m-planes of crystals grown from seed crystals that are adjacent to each other do not almost coincide with each other, are not particularly limited and are, for example, as follows.

In the case where m-axes of seed crystals that are adjacent to each other are almost parallel with each other (i.e., the angle formed between the m-axes is almost 0°), the conditions (M) may be, for example, conditions where the m-axis of each seed crystal does not pass through the inside of the other seed crystal, for example. Examples of satisfying these conditions include FIGS. 37A and 37E. When m-axes of seed crystals that are adjacent to each other coincide with each other (in this case, the angle formed between the m-axes is 0°), the m-axis of each seed crystal certainly passes through the inside of the other seed crystal as shown in FIG. 37C as an example. In FIG. 37C, as mentioned above, m-planes of crystals grown from the two seed crystals that are adjacent to each other coincide with each other. Thus, the conditions (M) are not satisfied.

Moreover, the conditions (M) may be conditions satisfying the conditions (A) regardless of whether or not the m-axis passes through the inside of the other adjacent seed crystal. This is because, as described for FIGS. 37A, 37B, and 37E and 38A and 37B, when the conditions (A) are satisfied, m-planes of crystals grown from seed crystals that are adjacent to each other do not substantially coincide with each other. Furthermore, as shown in FIGS. 39A to 40C as examples mentioned below, when the conditions (C) (c-axes of seed crystals that are adjacent to each other almost coincide with each other) are satisfied, m-planes of crystals grown from seed crystals that are adjacent to each other do not almost coincide with each other. Thus, the conditions (M) may be conditions satisfying the conditions (C) regardless of whether or not the m-axis passes through the inside of the other adjacent seed crystal.

In the case where the m-axes almost parallel with each other, the angle formed between the m-axes is, for example, 1° or less, preferably 0.1° or less, particularly preferably 0.02° or less, ideally 0°. In the case where the m-axes of seed crystals that are adjacent to each other are not parallel with each other, for example, as shown in FIG. 37D, it is obvious that m-planes (sides of hexagons in FIG. 37D) of crystals grown from the seed crystals do not coincide with each other, and the conditions (M) are satisfied. In this case, the angle formed between the m-axes is, for example, 5° or more, preferably 10° or more, more preferably 20° or more, particularly preferably 25° or more. In the present invention, the seed crystals are hexagonal crystals, and thus, each seed crystal has three m-axes. In the present invention, when the angle formed between m-axes of seed crystals that are adjacent to each other is defined, the angle is defined according to the same procedures as in (1) to (3) of the conditions (A) except that the a-axes are changed to the m-axes.

In the examples of FIGS. 37A to 38B, c-planes are parallel with the plane of paper (i.e., c-axes of crystals are perpendicular to the plane of paper). Thus, the seed crystals that are adjacent to each other do not satisfy the conditions (C) (i.e., the c-axes almost coincide with each other). However, when the conditions (M) are satisfied, and preferably, the conditions (A) are further satisfied, a Group III nitride crystal in a large size with few defects and high quality can be produced.

Subsequently, examples of the arrangements of plural m-plane seed crystals and a-plane seed crystals are described.

Figure 39A:
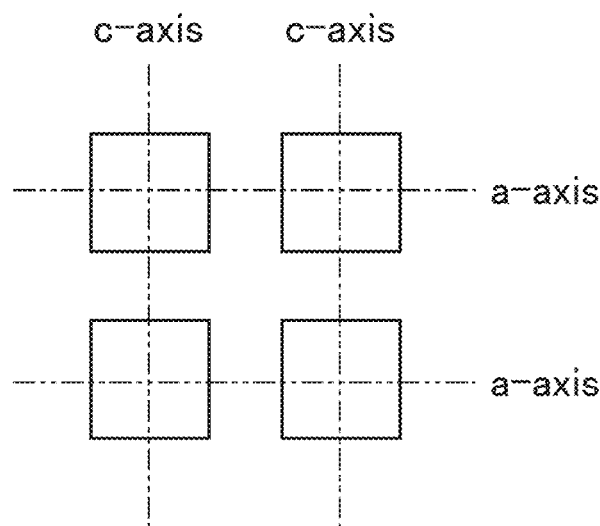
FIGS. 39A to 39C are drawings showing an example of an arrangement of seed crystals in m-plane seed crystals.
Figure 39B:
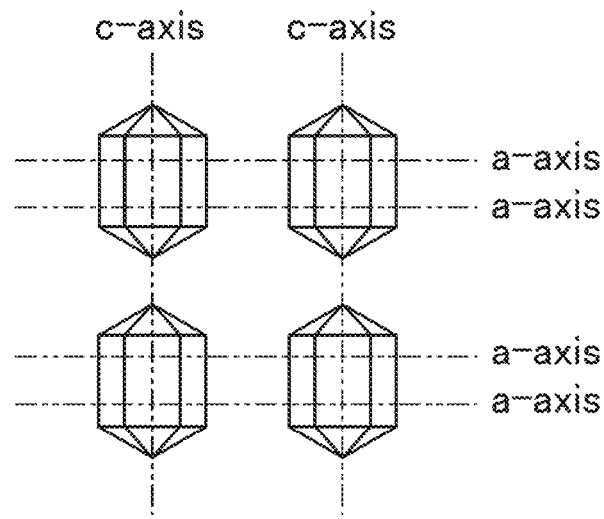
Figure 39C:
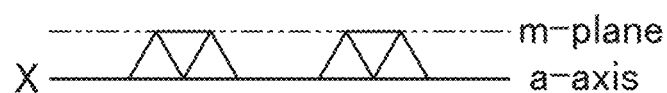

An example of the arrangement of plural m-plane seed crystals is shown in FIGS. 39A to 39C. In FIGS. 39A and 39B, each m-plane (crystal growth plane) is parallel with the plane of paper. FIG. 39C is a drawing viewed from below the plane of paper of FIG. 39B. In FIG. 39C, the c-plane is parallel with the plane of paper.

FIG. 39A is a drawing schematically showing an example of an arrangement of four square seed crystals in two rows×two columns. As shown in FIG. 39A, c-axes of seed crystals that are adjacent to each other in the top and bottom direction on the plane of paper coincide with each other. Thus, the conditions (C) and (M) are satisfied. Moreover, a-axes of seed crystals that are adjacent to each other in the left and right direction on the plane of paper coincide with each other. Thus, the conditions (A) and (M) are satisfied.

In the conditions (A) of the present invention, the angle formed between a-axes of seed crystals that are adjacent to each other and the distance between the a-axes may be the same as those in the case of the c-plane seed crystal (crystal growth plane is the c-plane) even when the crystal growth planes of the seed crystals are any planes (e.g., m-planes) other than c-plane. Moreover, in the conditions (C) of the present invention, the angle formed between c-axes of seed crystals that are adjacent to each other and the distance between the c-axes may be the same as those in the conditions (A) except that the a-axes are changed to c-axes even when the crystal growth planes are any planes (e.g., a-planes) other than m-planes.

Seed crystals in FIG. 39A are hexagonal crystals. Thus, the crystal forms of crystals grown from the hexagonal crystals are as shown in FIG. 39B. FIG. 39B however merely shows an example, and the present invention is not limited thereby. As shown in FIG. 39B, the a-axes of the crystals can be regarded as being placed at any position at which the crystals intersect with each other in the left and right direction on the plane of paper. The same applies to the seed crystals of FIG. 39A.

As shown in FIG. 39C, in these seed crystals and crystals grown therefrom, the m-planes are parallel with the crystal growth planes. Thus, the m-planes do not coincide with each other. In FIG. 39C, the straight line X represents a plane parallel with the crystal growth planes of the seed crystals.

Figure 40A:
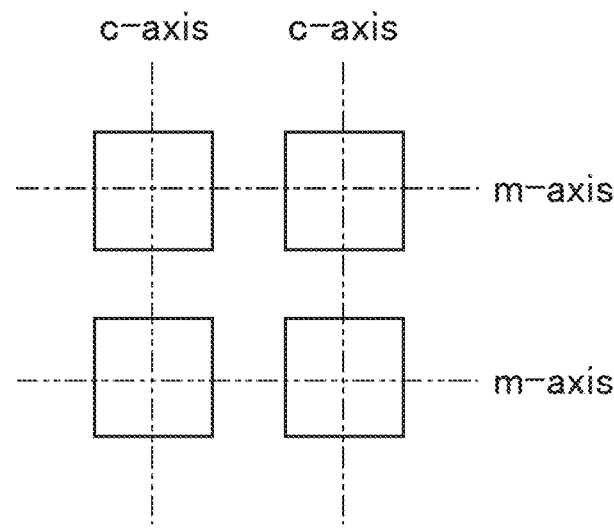
FIGS. 40A to 40C are drawings showing an example of an arrangement of seed crystals in a-plane seed crystals.
Figure 40B:
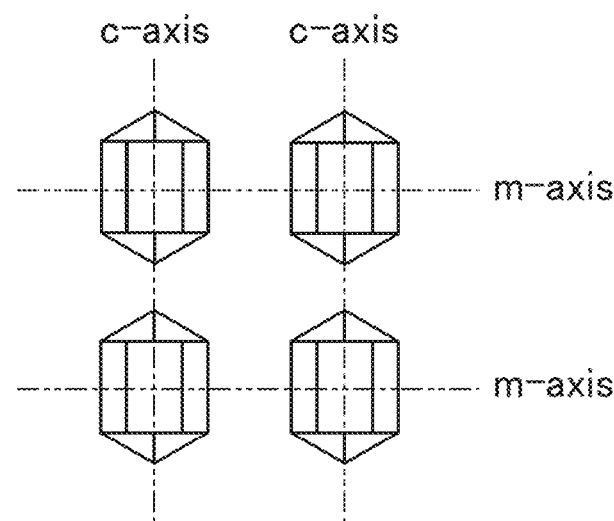
Figure 40C:
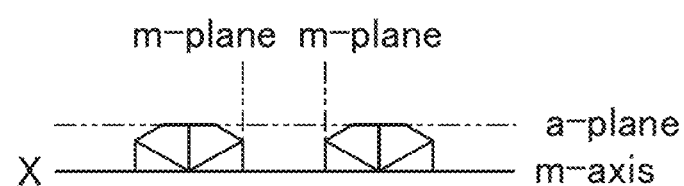

Next, an example of the arrangement of plural a-plane seed crystals is shown in FIGS. 40A to 40C. In FIGS. 40A and 40B, each a-plane (crystal growth plane) is parallel with the plane of paper. FIG. 40C is a drawing viewed from below the plane of paper of FIG. 40B. In FIG. 40C, the c-plane is parallel with the plane of paper.

FIG. 40A is a drawing schematically showing an example of an arrangement of four square seed crystals in two rows×two columns. As shown in FIG. 40A, c-axes of seed crystals that are adjacent to each other in the top and bottom direction on the plane of paper coincide with each other. Thus, the conditions (C) and (M) are satisfied. Moreover, m-axes of seed crystals that are adjacent to each other in the left and right direction on the plane of paper coincide with each other. Thus, the conditions (A) and (C) are not satisfied.

Seed crystals in FIG. 40A are hexagonal crystals. Thus, the crystal forms of crystals grown from the hexagonal crystals are as shown in FIG. 40B. FIG. 40B however merely shows an example, and the present invention is not limited thereby. In FIG. 40B, each a-plane is exposed by cutting an upper part of each crystal at a plane parallel with the crystal growth plane. When the a-plane is viewed from below the plane of paper, as shown in FIG. 40C, m-planes of the seed crystals that are adjacent to each other in the left and right direction on the plane of paper face to each other. Thus, it is understood that the conditions (M) are satisfied. In FIG. 40C, the straight line X represents the plane parallel with the crystal growth planes of the seed crystals.

In the present invention, although it is preferred that all of seed crystals that are adjacent to each another satisfy the conditions of the present invention, only some of them may satisfy the conditions of the present invention. For example, as shown in FIGS. 40A and 40B, the seed crystals that are adjacent to each other in the left and right direction on the plane of paper may not satisfy the conditions (M) of the present invention, and only seed crystals that are adjacent to each other in the top and bottom direction on the plane of paper may satisfy the conditions (M) of the present invention. In the case of FIG. 40A or 40B, the seed crystals that are adjacent to each other in the top and bottom direction on the plane of paper satisfy the conditions (M) and (C). Thus, generation of defects at sites at which crystals are bound (associated) can be prevented or reduced.

In the case of a-plane seed crystal, in order for the m-planes of the grown crystals not to face (coincide with)

each other, for example, plural stripe-shaped seed crystals that are parallel with the m-axis (the left and right direction on the plane of paper in FIGS. 40A and 40B) may be arranged so that the c-axes of the seed crystals almost coincide with each other. In this case, the c-axes are regarded as being placed at any positions perpendicular to the longitudinal direction of the stripe.

Figure 41A:
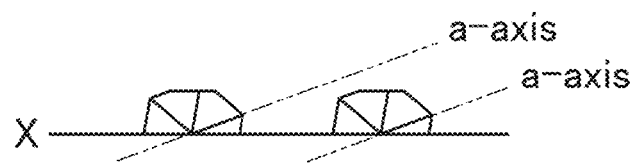
FIGS. 41A and 41B are drawings showing examples of an arrangement of seed crystals in which the a-axes or c-axes are tilted relative to a crystal growth plane.
Figure 41B:
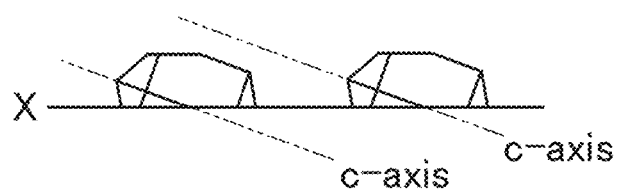

In the present invention, the crystal growth plane is not limited to a c-, m-, or a-plane and may be any plane tilted relative to any of these planes. Examples of the plane tilted relative to any of these planes are shown in FIGS. 41A and 41B. In FIGS. 41A and 41B, the straight line X represents a plane parallel with the crystal growth planes. In FIG. 41A, a-axes are slightly tilted relative to the crystal growth planes. In FIG. 41B, the c-axes are slightly tilted relative to the crystal growth planes.

Figure 42A:
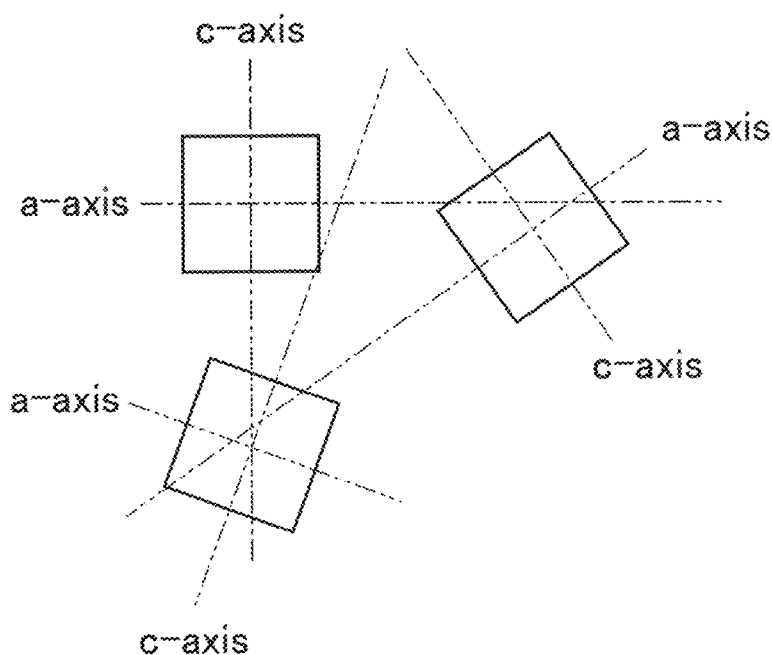
FIGS. 42A to 42C are drawings showing examples of an arrangement of seed crystals that are adjacent to each other in which a-axes or c-axes are tilted relative to one another.
Figure 42B:
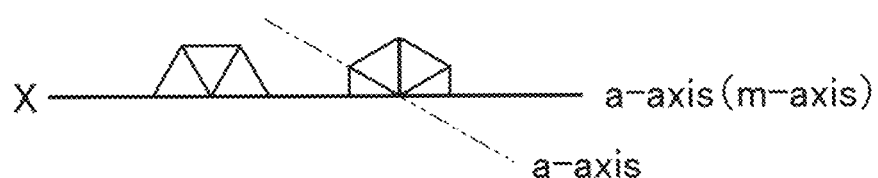
Figure 42C:
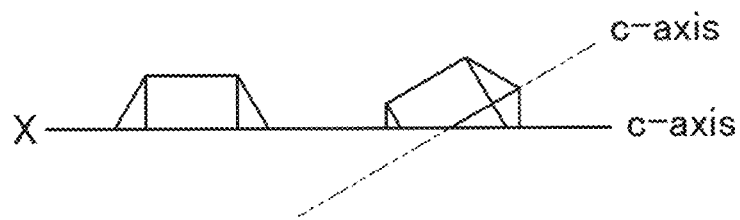

Each of FIGS. 42A to 42C shows an example in which a-axes, m-axes, or c-axes of the seed crystals that are adjacent to each other are tilted relative to each other. FIG. 42A shows the state where the a-axes or c-axes of the m-plane seed crystals that are adjacent to each other are tilted relative to each other, and the m-planes (crystal growth planes) are parallel with the plane of paper. Each of FIGS. 42B and 42C is a drawing schematically showing an example in which the crystal growth planes of the seed crystals that are adjacent to each other are different from each other. In each of FIGS. 42B and 42C, the straight line X represents a plane parallel with the crystal growth planes. In FIG. 42B, the crystal growth planes are parallel with the a-axis of the left seed crystal and are parallel with the m-axis of the right seed crystal. In FIG. 42C, the crystal growth plane is parallel with the c-axis of the left crystal and is tilted relative to the c-axis of the right crystal.

In the present invention, the case where all of the a-axes, the c-axes, or the m-axes of the seed crystals that are adjacent to each other are aligned in almost the same direction (i.e., parallel with each other, FIGS. 37A, 39A to 39C, 40A to 40C, and the like) is preferable rather than the case where the a-axes, the c-axes, or the m-axes of the seed crystals that are adjacent to each other are tilted relative to each other (FIGS. 37D and 42A to 42C). The "being aligned in almost the same direction (being parallel with each other)" represents the angle formed between the a-axes, the c-axes, or the m-axes is, for example, 5° or less, preferably 1° or less, more preferably 0.03° or less, particularly preferably 0.005° or less, ideally 0°. It is to be noted that even when all of the axes are aligned in almost the same direction, for example, if the conditions (M) of the present invention are not satisfied as in FIG. 37C, the conditions of the present invention are not satisfied. That is, in the Group III nitride crystal production method of the present invention, it is preferred that the conditions (M) are satisfied, and all of the a-axes, the c-axes, or the m-axes of seed crystals that are adjacent to each other are aligned in almost the same direction.

As to the conditions (A), FIGS. 37A, 37B, and 37E and 38A and 38B are described above as examples of satisfying the conditions (A) of the Group III nitride crystal production method of the present invention, and FIGS. 37C and 37D are described above as examples of not satisfying the conditions (A). However, these drawings are merely schematic drawings for the sake of convenience of the description. Thus, the angle formed between a-axes, the distance between the a-axes, and the like under the conditions (A) of the present invention are not at all limited by these drawings. Similarly, the angles, the distances, and the like under the conditions (M) and (C) also are not at all limited by these drawings.

<3. Composition of Group III Nitride Crystal and the Like>

In the Group III nitride crystal production method of the present invention, the previously-provided Group III nitride (seed crystal) is not particularly limited as long as it is a hexagonal crystal and can be, for example, Group III nitride represented by $Al_xGa_yIn_{1-x-y}N (0 \leq x \leq 1, 0 \leq y \leq 1, x+y \leq 1)$. Examples of the previously-provided Group III nitride (seed crystal) include AlGaN, InGaN, InAlGaN, and GaN, each represented by the above-described composition, and GaN is particularly preferable.

In the crystal growth step, the Group III element to be caused to react with the nitrogen is, for example, at least one selected from the group consisting of gallium (Ga), indium (In), and aluminum (Al) and is particularly preferably Ga.

The Group III nitride crystals generated and grown in the crystal growth step are not particularly limited and can be, for example, Group III nitride crystals represented by $Al_xGa_yIn_{1-x-y}N (0 \leq x \leq 1, 0 \leq y \leq 1, x+y \leq 1)$. Examples thereof include AlGaN, InGaN, InAlGaN, and GaN, each represented by the above-described composition, and GaN is particularly preferable. The composition of each Group III nitride crystal generated and grown in the crystal growth step may be identical to or different from the seed crystal, and the same composition as in the seed crystal is preferable from the viewpoint of obtaining a Group III nitride crystal with few defects and high quality.

More specifically, examples of the Group III nitride crystal production method of the present invention include the following first production method and the following second production method.

<4. First Production Method>

The first production method of the present invention is the Group III nitride crystal production method of the present invention, wherein in the seed crystal selection step, the previously-provided Group III nitride is a Group III nitride crystal layer. A mask having plural through holes is arranged on the Group III nitride crystal layer, and planes of the Group III nitride crystal layer exposed from the respective through holes are selected as seed crystals.

As mentioned above, in the production method of the present invention, the crystal growth plane is not particularly limited. In the first production method of the present invention, for example, the Group III nitride crystal layer may be a Group III nitride crystal layer having a c-plane, the mask may be arranged on the c-plane, and parts of the c-plane exposed from the respective through holes may be selected as the seed crystals (crystal growth planes of the seed crystals). Alternatively, the Group III nitride crystal layer may be a Group III nitride crystal layer having an m-plane, the mask may be arranged on the m-plane, and parts of the m-plane exposed from the respective through holes may be selected as the seed crystals (crystal growth planes of the seed crystals). The case where the crystal growth plane is the c-plane is mainly described below. However, the Group III nitride crystal may be produced in the same manner except that the crystal growth plane is replaced by another plane such as the m-plane.

Steps of producing a Group III nitride crystal by the first production method of the present invention are schematically shown in the step cross-sectional views of (a) to (f) of FIG. 1 as an example. That is, first, as shown in (a) of FIG. 1, a mask 12 having plural through holes 12a is arranged on the c-plane of a Group III nitride crystal layer 11 that is a hexagonal crystal. Parts of the c-plane of the Group III nitride crystal layer 11 exposed from these through holes 12a become seed crystals. That is, it can be said that this step of arranging a mask 12 is a seed crystal selection step of selecting seed crystals for generation and growth of Group III nitride crystals. The Group III nitride crystal layer 11 is not particularly limited and may be, for example, a Group III nitride crystal substrate or the like. From the viewpoint of the costs and the convenience, the Group III nitride crystal layer 11 is preferably formed over an independent substrate (not shown). From the viewpoint of producing a Group III nitride crystal with few defects and high quality, the Group III nitride crystal layer 11 is preferably a Group III nitride substrate with high quality. The Group III nitride substrate may be, for example, an independent substrate (free-standing substrate) which is not formed on an independent substrate. It is to be noted that, according to the present invention, even by using a Group III nitride crystal formed over an independent substrate, a Group III nitride crystal with few defects and high quality can be produced as mentioned above. The thickness of the Group III nitride crystal layer 11 also is not particularly limited and is, for example, from 1 to 100 μm, preferably from 2 to 100 μm, more preferably from 5 to 50 μm. The independent substrate is not particularly limited, and examples thereof include a sapphire substrate and a silicon carbide substrate. Although the mask 12 may be formed over the c-plane of the Group III nitride crystal layer by deposition, application, or the like, it is preferred that mask 12 having plural through holes 12a is previously formed and merely arranged on the Group III nitride crystal layer 11 because of the convenience. It is preferred that the mask 12 does not adhere to the Group III nitride crystal layer 11 for the reason that the mask 12 easily can be reused and the like. The material of the mask 12 also is not particularly limited and is preferably a material that is difficult to react with an alkali metal melt, and examples thereof include a carbon-based material and oxide. The mask may contain at least one selected from the group consisting of $Al_xGa_{1-x}N$ ($0<x\leq1$), an oxide of the $Al_xGa_{1-x}N$ ($0<x\leq1$), diamond-like carbon, silicon nitride, silicon oxide, silicon oxynitride, aluminum oxide, aluminum oxynitride, silicon carbide, yttrium oxide, yttrium aluminum garnet (YAG), tantalum, rhenium, and tungsten. In the present invention, the mask 12 is particularly preferably a sapphire mask from the viewpoint of the costs, the convenience, and the like. The thickness of the mask 12 also is not particularly limited and is, for example, from 0.0005 to 2 mm, preferably from 0.01 to 1 mm, more preferably from 0.05 to 0.5 mm.

Subsequently, the parts (seed crystals) of the c-plane of the Group III nitride crystal layer 11 exposed from the respective through holes 12a are caused to be in contact with an alkali metal melt (contact step). Further, a Group III element and nitrogen are caused to react with each other under a nitrogen-containing atmosphere in the alkali metal melt to generate and grow Group III nitride crystals (crystal growth step). This crystal growth step is shown in (b) to (e) of FIG. 1. As shown in (b) and (c) of FIG. 1, Group III nitride crystals 13 are generated and grown from the surfaces of the seed crystals. By causing the Group III nitride crystals 13 to be further grown and to be bound as shown in (d) and (e) of FIG. 1, a Group III nitride crystal in a large size with few defects and high quality can be produced. This Group III nitride crystal can be used as in (f) of FIG. 1 by cutting it at the plane (indicated by a dotted line 14 in (e) of FIG. 1) parallel with the c-plane, for example. Although (f) of FIG. 1 shows a lower part of the Group III nitride crystal after the cutting, an upper part also can be used. By cutting (also referred to as dicing) as described above, the Group III nitride crystal easily can be used as a semiconductor substrate for semiconductor device or the like, for example.

Moreover, for example, the cut plane (c-plane) of the Group III nitride crystal shown in (f) of FIG. 1 as a crystal growth plane may be further grown to increase the thickness thereof. This step corresponds to the above-mentioned "crystal re-growth step".

Figure 2:
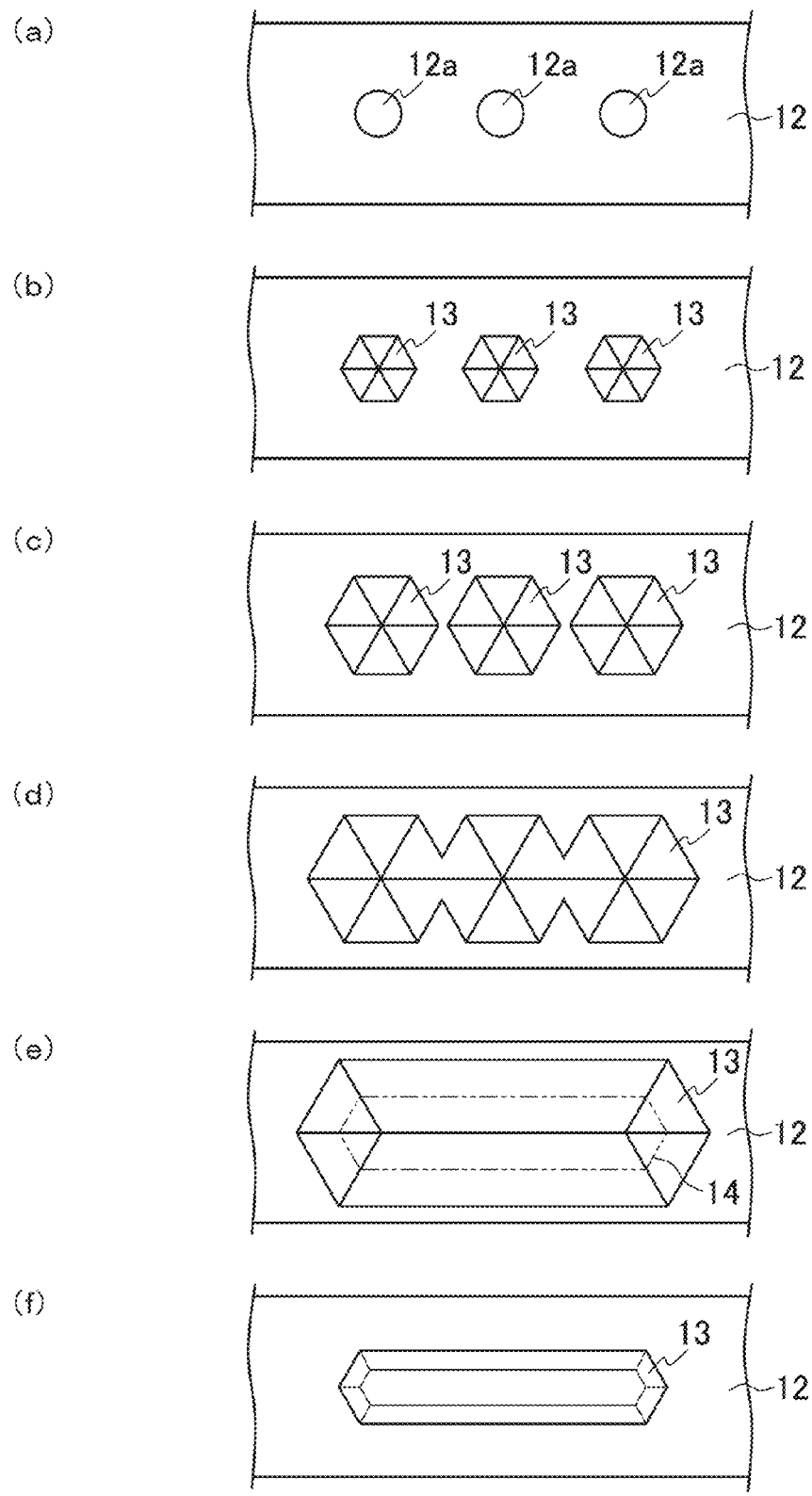
FIG. 2 shows plan views showing the production method according to the step cross-sectional views in (a) to (f) of FIG. 1.

The plan views of (a) to (f) of FIG. 2 are drawings viewed from above the steps of (a) to (f) of FIG. 1. In (a) to (f) of FIG. 2, the identical parts to those in (a) to (f) of FIG. 1 are denoted by the identical reference numerals. As shown in (a) to (e) of FIG. 2, through holes 12a are dot-shaped through holes, and Group III nitride crystals generated from seed crystals are equilateral hexagons. These Group III nitride crystals are bound by growing as shown in (d) to (e) of FIG. 2. As shown in (a) of FIG. 2, three dots (seed crystals) 12a are aligned on a straight line. Thus, after binding the three crystals, a long and thin hexagonal crystal as in (e) of FIG. 2 is obtained.

The sizes of the dots of the through holes 12a (i.e., the sizes of dots that are the seed crystals), the arrangement relationship between a-axes of the seed crystals that are adjacent to each other, the distance between the dots, and the like are the same as those described in "2. Arrangement relationship, shape, size, and the like of seed crystal". The a-axis direction of the Group III nitride crystal layer can be checked by XRD (X-ray diffraction method), for example. Thus, based on the direction, the arrangement of the through holes 12a can be determined. In the case of (a) to (f) of FIG. 1, plural seed crystals exposed from the respective through holes 12a are plural parts of the Group III nitride crystal layer 11 of one piece. Therefore, for example, the through holes 12a are arranged so as to align in a the a-axis direction of the Group III nitride crystal layer 11.

Figure 3:
FIG. 3 shows plan views showing another example of the first production method of the present invention.
Figure 3:
Figure 3:
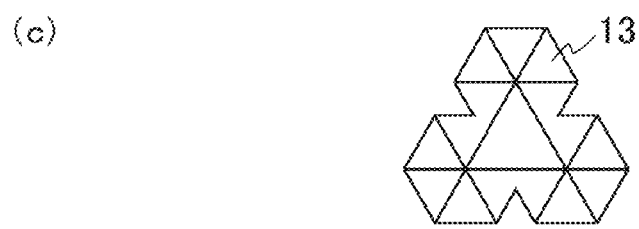
Figure 3:
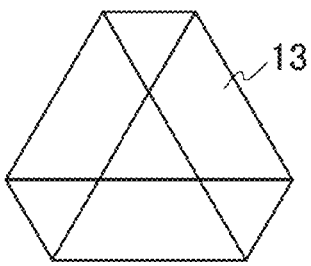
Figure 3:
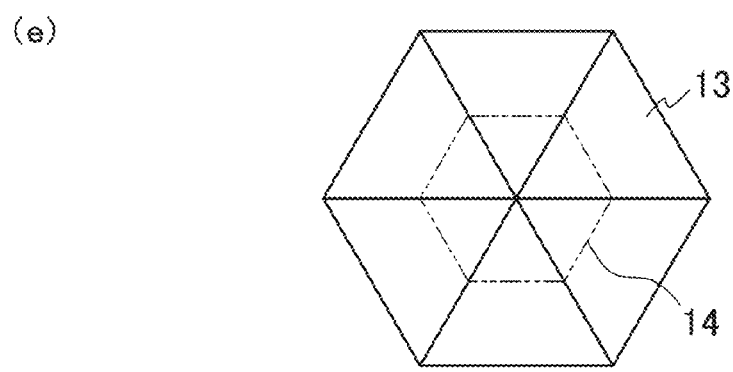
Figure 3:
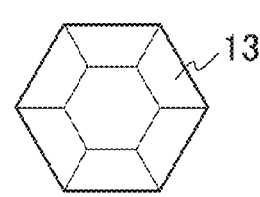
Figure 4:
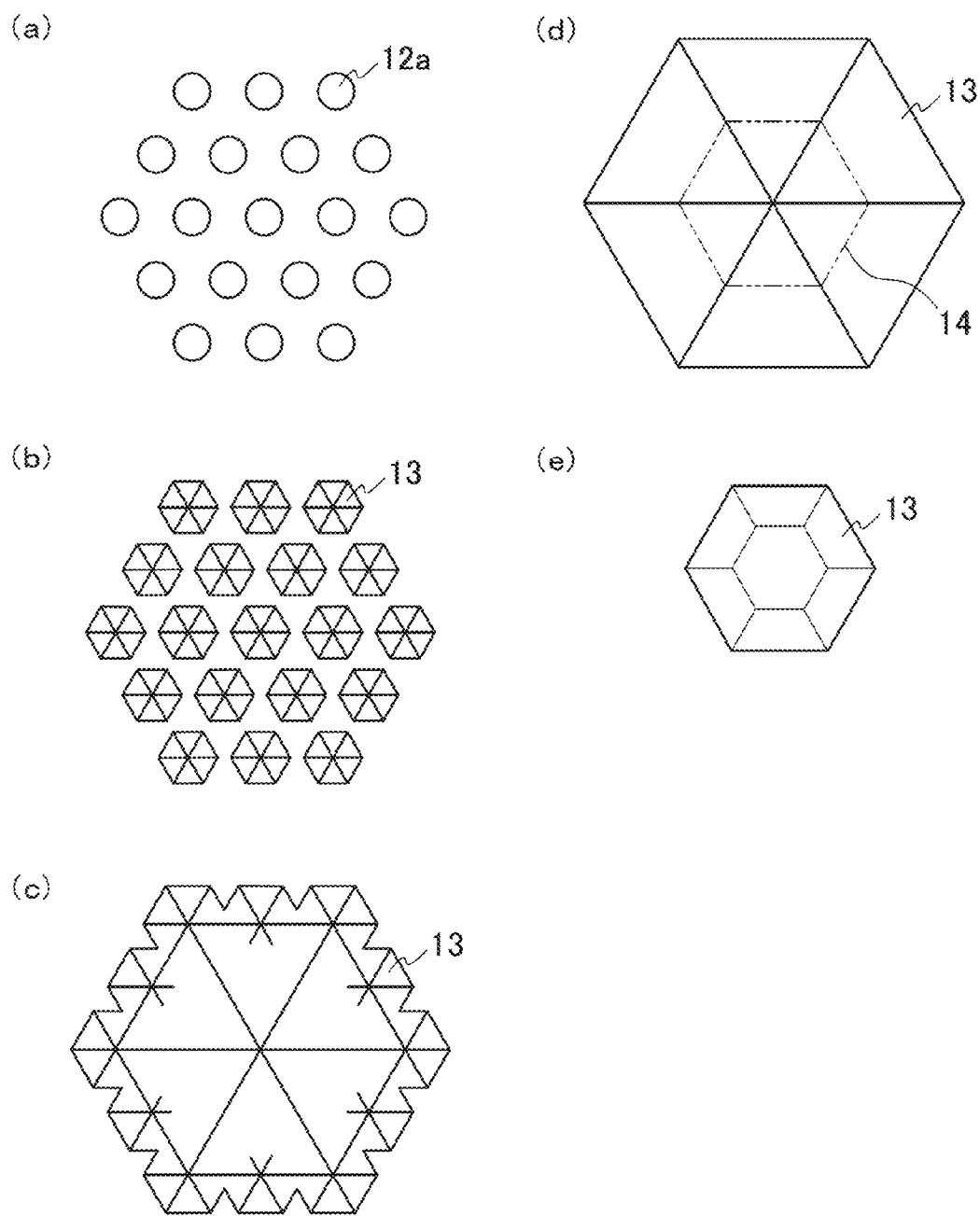
FIG. 4 shows plan views showing yet another example of the first production method of the present invention.

The arrangement of the through holes 12a is not limited by the arrangement shown in (a) to (f) of FIG. 1. For example, as shown in plan views of (a) to (f) of FIG. 3, three dots may be arranged on the respective apexes of an equilateral triangle, or many dots further may be arranged as shown in (a) to (e) of FIG. 4 by repeating the pattern. By increasing the number of dots as described above, a Group III nitride crystal in a larger size can be produced. In (a) to (e) of FIG. 3, identical parts to those shown in (a) to (f) of FIG. 1 are denoted by identical reference numerals.

Figure 6:
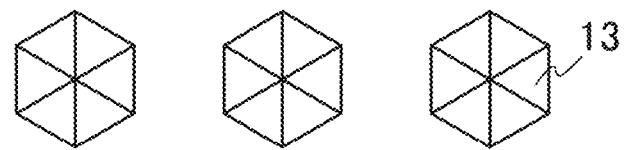
FIG. 6 is a plan view schematically showing an example of a production method in which m-planes are associated with each other.

As shown in FIG. 6, the arrangement of facing (coinciding) the m-planes (sides of an equilateral hexagon) of Group III nitride crystals 13 is not preferable because defects are generated at sites at which the m-planes are associated (bound) when the m-planes are associated by crystal growth. This is as described in the section "2. Arrangement relationship, shape, size, and the like of seed crystal".

Figure 46:
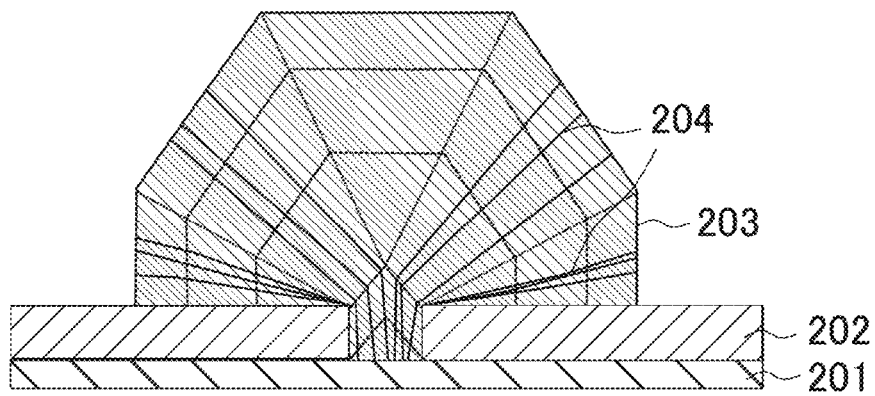
FIG. 46 is a cross-sectional view schematically showing an example of a mechanism of crystal growth from a through hole in a mask.

In the production method of the present invention, as mentioned above, a Group III nitride crystal with few defects and high quality can be produced by using plural small Group III nitride seed crystals. In the first production method of the present invention, it is also possible to produce a Group III nitride crystal with fewer defects and higher quality by using the mask. Although the reason of this is unclear, it is considered that, for example, defects such as a dislocation of crystal and the like are extended laterally and are not extended vertically when crystals are laterally grown out from the through holes in the course of growing the crystals. An example of this is shown in FIG. 46. In FIG. 46, a Group III nitride (e.g., GaN) crystal layer is represented by the numeral 201. A mask (e.g., a sapphire mask) formed over the Group III nitride crystal layer 201 is represented by the numeral 202. As shown in FIG. 46, a part of the surface of the Group III nitride crystal 201 is exposed from a small through hole formed in the mask 202, and a Group III nitride crystal 203 is grown using the exposed small part as a seed crystal. Thus, it is considered that crystal defects 204 are extended laterally, and the crystal defects tend not to be generated in an upper part of the grown Group III nitride crystal 203. FIG. 46 however schematically shows a mere example of an assumable mechanism, and the present invention is not at all limited by the drawing and the description thereof.

Figure 8A:
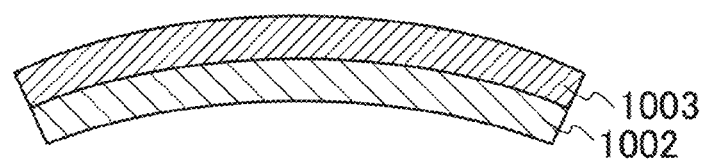
FIG. 8A is a cross-sectional view showing a distortion of a Group III nitride crystal grown on a substrate as an example.

According to the conventional method for producing a Group III nitride crystal, for example, in the case where there is a difference in thermal expansion coefficient between a substrate and a crystal, there is a possibility of generating warping, a distortion, cracking, and the like in the crystal by warping of the substrate while producing or using the crystal. An example of this is schematically shown in the cross-sectional view of FIG. 8A. As shown in FIG. 8A, a GaN crystal 1003 is formed over a sapphire substrate 1002. The GaN crystal 1003 is warped together with the sapphire substrate 1002 by the difference in thermal expansion coefficient between them. By the warping, a distortion is generated in the GaN crystal 1003, and there is a possibility of generating cracking in some cases. However, it is considered that according to the first production method of the present invention, such problem can be prevented or reduced.

That is, according to the first production method of the present invention, the produced Group III nitride crystal and the Group III nitride crystal layer (seed crystal) do not directly in contact with each other at points other than the through holes and are separated by the mask. Therefore, even if warping is generated in the independent substrate and the like that are present in or below the Group III nitride crystal layer (seed crystal) that is below the mask, there is less possibility of generating warping, a distortion, cracking, and the like in the Group III nitride crystals formed over the mask. Moreover, according to the first production method of the present invention, the seed crystals are not formed over the mask, and thus, the Group III nitride crystals grown from the seed crystals and the mask do not directly in contact with each other. Therefore, even in the case where there is a difference in thermal expansion coefficient between the mask and the Group III nitride crystals (e.g., the mask is sapphire, and the Group III nitride crystals are GaN), there is less possibility of generating warping, a distortion, cracking, and the like in the Group III nitride crystals by the warping of the mask.

<5. Second Production Method>

The second production method of the present invention is the Group III nitride crystal production method of the present invention, wherein in the seed crystal selection step, the previously-provided Group III nitride includes plural Group III nitride crystals arranged on a substrate, and the plural Group III nitride crystals are selected as the seed crystals.

In the second production method of the present invention, the crystal growth plane is not particularly limited as in the first production method.

Figure 5:
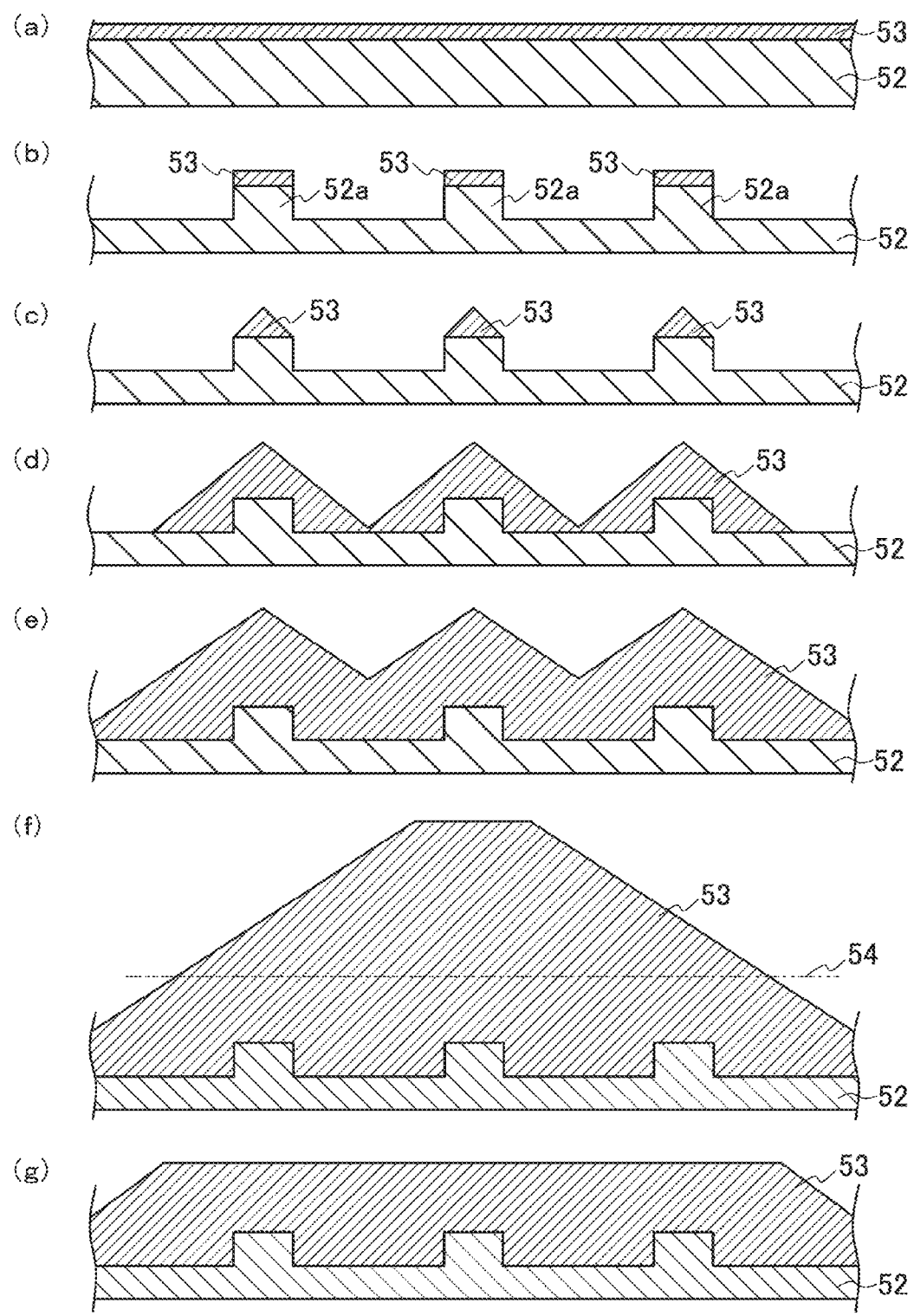
FIG. 5 shows step cross-sectional views showing an example of the second production method of the present invention (production method using plural Group III nitride crystals formed over a substrate).

An example of the second production method of the present invention is shown in the step cross-sectional views of (a) to (g) of FIG. 5. First, as shown in (a) of FIG. 5, a Group III nitride crystal layer 53 that is to be seed crystals is formed over a substrate 52. Although a method of this is not particularly limited, this method may be, for example, a vapor growth method such as MOCVD. The thickness of the Group III nitride crystal layer 53 also is not particularly limited and is, for example, from 1 to 100 µm, preferably from 2 to 100 µm, more preferably from 5 to 50 µm. The material of the substrate 52 also is not particularly limited and may contain at least one selected from the group consisting of $Al_xGa_{1-x}N$ ($0 < x \leq 1$), an oxide of the $Al_xGa_{1-x}N$ ($0 < x \leq 1$), diamond-like carbon, silicon nitride, silicon oxide, silicon oxynitride, aluminum oxide, aluminum oxynitride, silicon carbide, yttrium oxide, yttrium aluminum garnet (YAG), tantalum, rhenium, and tungsten. The substrate 52 is particularly preferably a sapphire substrate from the viewpoint of the costs, the convenience, and the like.

Then, as shown in (b) of FIG. 5, upper parts of the substrate 52 and the Group III nitride crystal layer 53 on the upper parts are removed by etching or the like to cause the plural convex portions 52a of the substrate 52 and plural Group III nitride crystal layers (seed crystals) 53 arranged thereon to remain. These seed crystals are grown and bound as in (c) to (f) of FIG. 5. The crystal can be used by cutting it at a plane parallel with the c-plane as shown in (g) of FIG. 5 (shown by a dotted line (cross-section) 54 in (f) of FIG. 5). Moreover, for example, the cut plane (c-plane) 54 of the Group III nitride crystal shown in (g) of FIG. 5 as a crystal growth plane may be further grown to increase the thickness thereof. This step corresponds to the above-mentioned "crystal re-growth step".

The shape, size, arrangement, space (distance between seed crystals that are adjacent to each other) of the seed crystals 53 may be the same as those of the seed crystals in the first production method of the present invention, for example. For example, in FIGS. 2 to 4, the second production method of the present invention can be schematically shown by substituting the substrate 52 for the mask 12, convex portions 52a for the through holes 12a, and the crystals 53 for the Group III nitride crystals (seed crystals) 13. Although the plural seed crystals 53 are arranged on the plural convex portions 52a of the substrate in (a) to (g) of FIG. 5, the second production method of the present invention is not limited thereby. For example, the plural seed crystals may be arranged on a flat even substrate, or portions in which the plural seed crystals are arranged may be concave portions as substitute for the convex portions. It is considered that the produced crystal is difficult to be directly in contact with the substrate other than the convex portions by forming the plural seed crystals on the convex portions of the substrate as shown in (a) to (g) of FIG. 5. Thus, for example, it is possible to reduce or prevent warping, a distortion, cracking, and the like of the crystal, caused by the difference in thermal expansion coefficient between the substrate and the crystal as mentioned above.

It is considered that the second production method of the present invention is superior in crystal growth efficiency by arranging seed crystals directly on a substrate without using a mask and through holes. Further, as mentioned above, for example, it is considered that, in the first production method of the present invention, by using a mask and through holes, an effect of being difficult to extend a dislocation in the grown crystal is enhanced, and a Group III nitride crystal with fewer defects and higher quality can be obtained. For example, the first production method of the present invention or the second production method of the present invention may be used as desired according to the purpose, for example.

<6. Contact Step and Crystal Growth Step and Devices Used Therein>

Group III nitride crystal production method of the present invention is, as mentioned above, a method for producing a Group III nitride crystal, including: a seed crystal selection step of selecting plural parts of previously-provided Group III nitride as seed crystals for generation and growth of Group III nitride crystals; a contact step of causing the surfaces of the seed crystals to be in contact with an alkali metal melt; and a crystal growth step of causing a Group III element and nitrogen to react with each other under a nitrogen-containing atmosphere in the alkali metal melt to generate and grow Group III nitride crystals, wherein the seed crystals are hexagonal crystals, in the seed crystal selection step, the seed crystals are arranged so that a-planes of the the seed crystals that are adjacent to each other substantially coincide with each other, and in the crystal growth step, the plural Group III nitride crystals grown from the plural seed crystals by the growth of the Group III nitride crystals are bound. Specifically, the Group III nitride crystal production method of the present invention is as described in the sections from "1. Production method of the present invention" to "5. Second production method", for example. Other than this, the Group III nitride crystal production method of the present invention is not particularly limited and can be performed in the same manner as in a method for producing a Group III nitride crystal by a general liquid phase epitaxy method (LPE) using an alkali metal melt, for example, and an example of this is described below.

For example, there is a sodium flux method (Naflux method) as a method for producing gallium nitride (GaN) used in a semiconductor substrate of LED or a power device. In this method, for example, first, a seed crystal (e.g., a GaN thin film formed over a sapphire substrate) is set in a crucible. In addition to the seed crystal, sodium (Na) and gallium (Ga) at an appropriate ratio are stored in the crucible. Then, the sodium and the gallium in the crucible were melted under high-temperature (e.g., 800° C. to 1000° C.) and high-pressure (e.g., several tens of atmospheres) atmosphere to cause nitrogen gas ($N_2$) to be melted in the melt thus obtained. Thus, the GaN seed crystal in the crucible can be grown, and an intended GaN crystal can be produced.

In the Group III nitride crystal production method of the present invention, for example, the seed crystal set in the crucible may be provided as described in the sections from "1. Production method of the present invention" to "5. Second production method" according to the seed crystal selection step, for example. The subsequent steps may be performed by the same method as in the general sodium flux method or the same method with appropriate changes, for example. For example, any of the other Group III elements may be used as a substitute for Ga. More specifically, for example, the Group III nitride crystal is as described in the section "3. Composition of Group III nitride crystal and the like".

In the Group III nitride crystal production method of the present invention, the crystal growth step is, as mentioned above, performed under a nitrogen-containing atmosphere. Under "nitrogen-containing atmosphere", the form of nitrogen is not particularly limited, and examples thereof include gas, a nitrogen molecule, a nitrogen compound, and the like. The "nitrogen-containing atmosphere" is preferably nitrogen-containing gas atmosphere because the nitrogen-containing gas is melted in the flux and becomes a material for growing a Group III nitride crystal. As the nitrogen-containing gas, any of the other nitrogen-containing gases such as an ammonia gas and the like may be used in addition to or as a substitute for the above-mentioned nitrogen gas ($N_2$). In the case of using a mixed gas of a nitrogen gas and an ammonia gas, the ratio of the nitrogen gas and the ammonium gas to be mixed may be any ratio. Using an ammonia gas is particularly preferable because the reaction pressure can be reduced.

As the alkali metal melt (flux), any of the other alkali metals such as lithium and the like may be used in addition to or as a substitute for the sodium. More specifically, the alkali metal melt contains at least one selected from the group consisting of lithium (Li), sodium (Na), potassium (K), rubidium (Rb), cesium (Cs), and francium (Fr) and may be, for example, a mixed flux of Na and Li, or the like. The alkali metal melt is particularly preferably a sodium melt. The alkali metal melt may or may not contain one or more kinds of components in addition to the alkali metal. The component in addition to the alkali metal is not particularly limited, and examples thereof include any of the alkali earth metals. Examples of the alkali earth metals include calcium (Ca), magnesium (Mg), strontium (Sr), barium (Ba), and radium (Ra), and among them, Ca and Mg are preferable, and Ca is more preferable. As a component in addition to the alkali metal, carbon (carbon alone or a carbon compound) may or may not be contained. Preferably, the melt contains carbon alone that generates cyan (CN) or a carbon compound that generates cyan (CN). The carbon may be an organic substance in the form of gas. Examples of such carbon alone or carbon compound include cyanide, graphite, diamond, fullerene, carbon nanotube, methane, ethane, propane, butane, and benzene. The content of the carbon is not particularly limited and is, for example, in the range from 0.01% to 20% by atom (at.), from 0.05% to 15% by atom (at.), from 0.1% to 10% by atom (at.), from 0.1% to 5% by atom (at.), from 0.25% to 7.5% by atom (at.), from 0.25% to 5% by atom (at.), from 0.5% to 5% by atom (at.), from 0.5% to 2.5% by atom (at.), from 0.5% to 2% by atom (at.), from 0.5% to 1% by atom (at.), from 1% to 5% by atom (at.), or from 1% to 2% by atom (at.) relative to the total of the melt, the Group III element, and the carbon. Among them, from 0.5% to 5% by atom (at.), from 0.5% to 2.5% by atom (at.), from 0.5% to 2% by atom (at.), from 0.5% to 1% by atom (at.), from 1% to 5% by atom (at.) or from 1% to 2% by atom (at.) is preferable.

The ratio of the alkali metal to be added to the Group III element is, for example, from 0.1% to 99.9% by mol, preferably from 1% to 99% by mol, more preferably from 5% to 98% by mol. The molar ratio in the case of using a mixed flux of an alkali metal and an alkali earth metal is, for example, the alkali metal : the alkali earth metal =from 99.99 to 0.01: from 0.01 to 99.99, preferably from 99.9 to 0.05: from 0.1 to 99.95, more preferably from 99.5 to 1: from 0.5 to 99. A high purity of the melt is preferable. For example, the purity of Na is preferably 99.95% or more. As a flux component (e.g., Na) with a high purity, a commercially available product with a high purity may be used, or a substance obtained by purchasing a commercially available product and increasing the purity thereof by a method such as distillation may be used.

The reaction temperature and the reaction pressure of the Group III element and the nitrogen-containing gas are not limited to the above-described numerals and can be set as appropriate. Although an appropriate reaction temperature and an appropriate reaction pressure vary depending on the component of the melt (flux), the component of atmosphere gas, and the pressures thereof, the reaction temperature and the reaction pressure are, for example, a temperature from 100° C. to 1500° C. and a pressure from 100 Pa to 20 MPa, preferably a temperature from 300° C. to 1200° C. and a pressure from 0.01 to 20 MPa, more preferably a temperature from 500° C. to 1100° C. and a pressure from 0.1 to 10 MPa, yet more preferably a temperature from 700° C. to 1100° C. and a pressure from 0.1 to 10 MPa. The reaction time, i.e., the time for growing a crystal, is not particularly limited and can be set as appropriate so as to grow to an appropriate size and is, for example, from 1 to 1000 hr, preferably from 5 to 600 hr, more preferably from 10 to 400 hr.

In the production method of the present invention, there is a possibility of melting the seed crystals before the concentration of nitrogen is increased according to the flux in some cases. In order to prevent this, nitride may be caused to be present in the flux at least during the early stage of the reaction. Examples of the nitride include $Ca_3N_2$, $Li_3N$, $NaN_3$, BN, $Si_3N_4$, and InN, and these nitrides can be used alone or in a combination of two or more of them. The proportion of the nitride in the flux is, for example, from 0.0001% to 99% by mol, preferably from 0.001% to 50% by mol, more preferably from 0.005% to 10% by mol.

In the production method of the present invention, an impurity may be caused to be present in the mixed flux. By causing an impurity to be present in the mixed flux, an impurity-containing GaN crystal can be produced. Example of the impurity include silicon (Si), alumina ($Al_2O_3$), indium (In), aluminum (Al), indium nitride (InN), silicon oxide ($SiO_2$), indium oxide ($In_2O_3$), zinc (Zn), magnesium (Mg), zinc oxide (ZnO), magnesium oxide (MgO), and germanium (Ge).

The production method of the present invention may further include a step of stirring the melt. The stage of performing the step of stirring the melt is not particularly limited and is, for example, at least one of the stage before the crystal growth step, the stage that is the same as the crystal growth step, the stage after the crystal growth step. More specifically, for example, the step of stirring the melt may be performed before the crystal growth step, at the same time as the crystal growth step, or both of them.

A device used in the Group III nitride crystal production method of the present invention is not particularly limited and may be the same as a device used in a general liquid phase epitaxy method (LPE device) and is, for example, specifically a LPE device or the like described in Patent Document 1 (Japanese Patent No. 4588340). The LPE device is described below with reference to FIGS. 43A to 45.

Figures 43A, 43B:
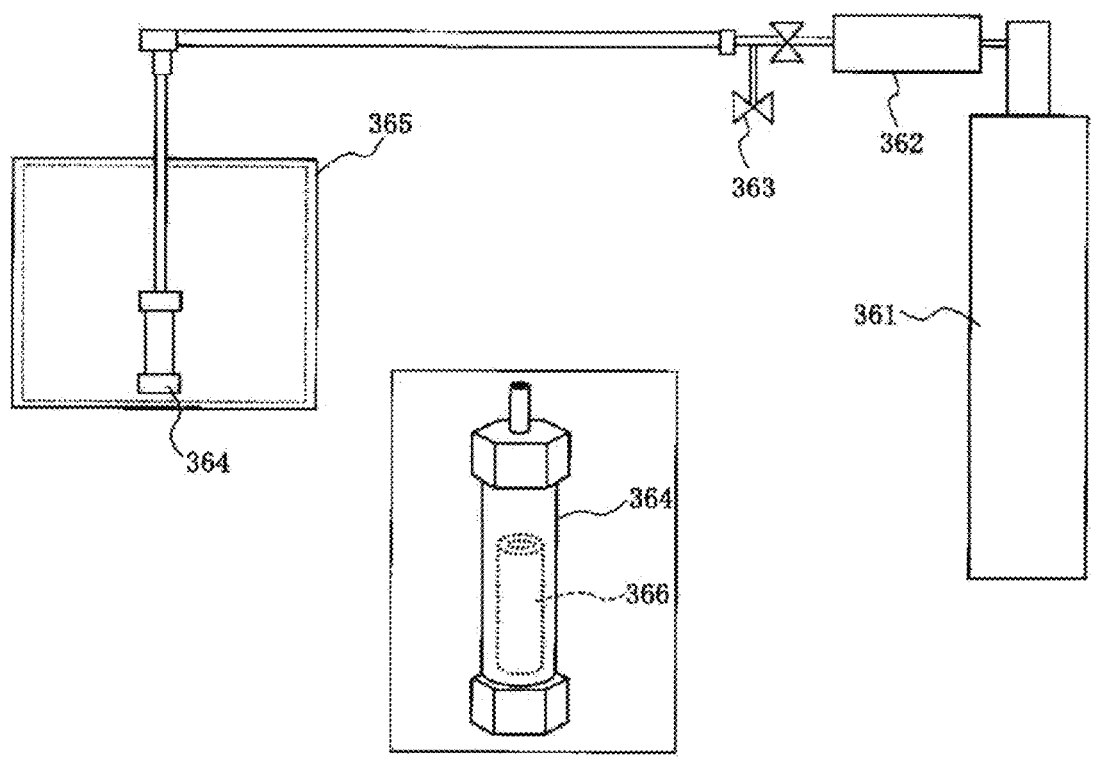
FIGS. 43A and 43B are schematic views showing a configuration of an example of a device used in the production method of the present invention.

The schematic views of FIGS. 43A and 43B show an example of a configuration of the LPE device. A LPE device of FIG. 43A includes: a raw material gas tank 361 for supplying, as a raw material gas, a nitrogen gas or a mixed gas of an ammonia gas ($NH_3$ gas) and a nitrogen gas; a pressure adjuster 362 for adjusting a pressure of the growth atmosphere; a valve for leakage 363; a stainless container 364 for growing a crystal; and an electric furnace 365. FIG. 43B is an enlarged view of the stainless container 364, and a crucible 366 is set in the stainless container 364. The crucible 366 is composed of boron nitride (BN), alumina ($Al_2O_3$), yttrium aluminum garnet (YAG), or the like. The temperature of the crucible 366 can be controlled in the range from 600° C. to 1000° C. The atmospheric pressure from (100 atm ($100×1.013×10^5$ Pa) to 150 atm ($150×1.013×10^5$ Pa)) supplied from the raw material gas tank 361 can be controlled in the range from 100 atm ($100×1.013×10^5$ Pa) or less by the pressure adjuster 362.

Figure 44:
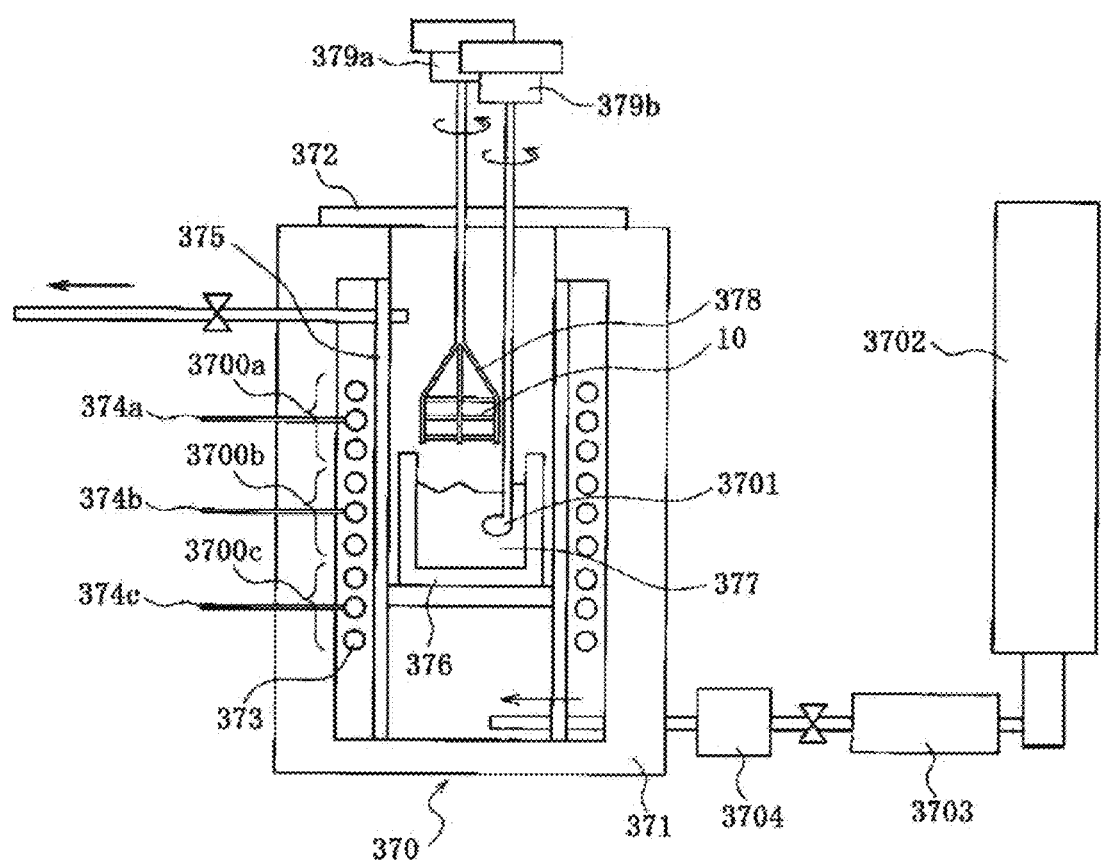
FIG. 44 is a schematic view showing a configuration of another example of a device used in the production method of the present invention.

FIG. 44 shows an example of a large-size LPE device (electric furnace). As shown in FIG. 44, this LPE device includes an electric furnace 370 that includes a chamber 371 made of stainless and a furnace cover 372 and is configured to withstand the atmospheric pressure of 10 atm ($10×1.013×10^5$ Pa). A heater for heating 373 is arranged in the chamber 371. The chamber 371 is composed of three zones 3700a to 3700c, and thermocouples 374a to 374c are attached to the zones 3700a to 3700c, respectively. The three zones are controlled to be in the temperature range of ±0.1° C., and the temperature in the furnace is controlled to be uniform. A furnace tube 375 is provided in order to improve the temperature uniformity in the furnace and prevent impurities from the heater 373 being mixed in.

A crucible 376 made of nitride boron (BN) is arranged in the furnace tube 375. Materials are placed in the crucible 376, and then, the temperature of the crucible is increased. Thus, a melt 377 is prepared. A substrate 10 that is to be seed crystals is attached to a substrate-fixing part 378. In the device of FIG. 44, plural substrates 10 can be fixed in the substrate-fixing part 378. The substrate 10 is rotated by a rotating motor 379a. A propeller 3701 for stirring can be immersed in the melt 377. The propeller 3701 is rotated by a rotating motor 379b. For example, although a general rotating motor may be used in the case where the atmospheric pressure is 10 atm ($10×1.013×10^5$ Pa) or less, an electromagnetic induction rotating mechanism is preferably used at the atmospheric pressure of 10 atm ($10×1.013×10^5$ Pa) or more. An atmospheric gas (raw material gas) is supplied from a gas source 3702. The pressure of the atmospheric gas is controlled by a pressure adjuster 3703. The atmospheric gas is transferred to the furnace after removing impurities in a gas purification part 3704.

Figure 45:
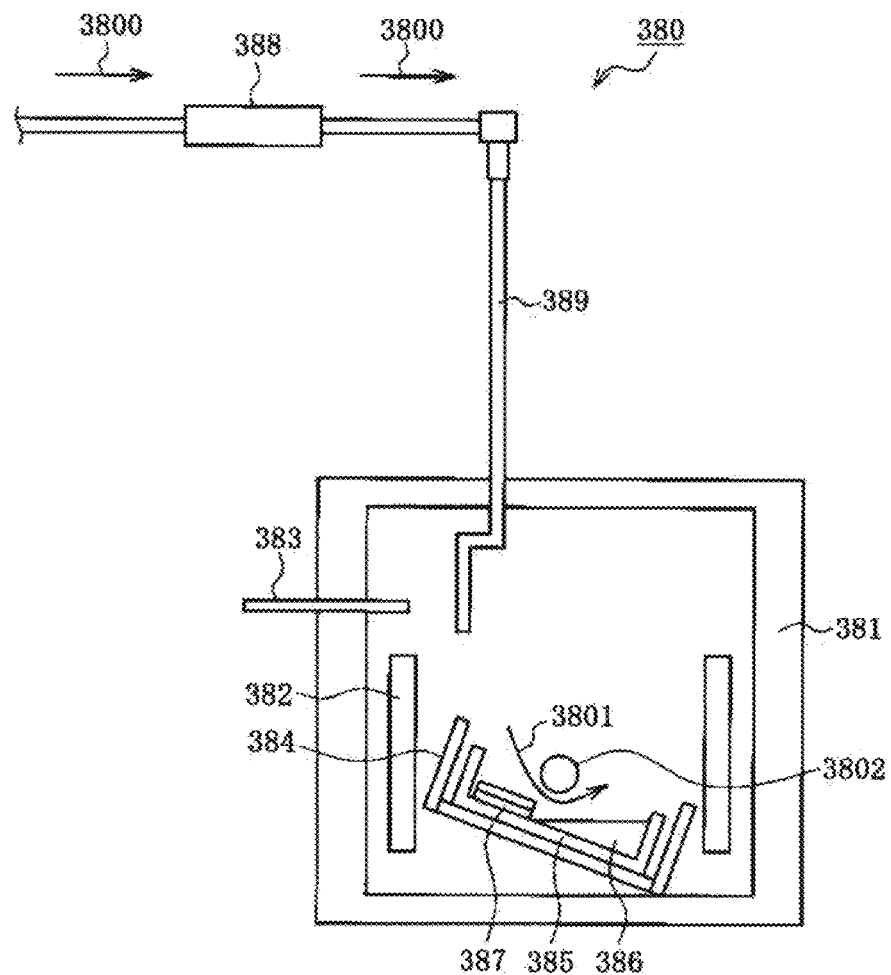
FIG. 45 is a schematic view showing a configuration of yet another example of a device used in the production method of the present invention.

FIG. 45 shows an example of a rocking-type LPE device. As shown in FIG. 45, this rocking-type LPE device 380 includes: a growth furnace 381 made of stainless; and a flow rate adjuster 388, and the growth furnace 381 and the flow rate adjuster 388 are linked with each other through a pipe 389. A heater 382 for heating and a thermocouple 383 are arranged in the growth furnace 381 and configured so as to withstand an atmospheric pressure of 50 atm ($50×1.013×10^5$ Pa). Further, there is a crucible-fixing stage 384 in the growth furnace 381, and a mechanism of rotating a rotation axis 3802 in a direction of an arrow (rotation direction) 3801 is attached thereto. A crucible 385 made of boron nitride (BN) is fixed in the crucible-fixing stage 384, and a melt 386 and a seed crystal 387 are arranged in the crucible 385. A melt 386 in the crucible 385 moves from side to side by rotating the crucible-fixing stage 384, and thus, the growth direction on the seed crystal is controlled to be constant. In the present example, it is desirable that the seed crystal (GaN seed crystal substrate) 387 is fixed so that the direction in which the melt 386 rocks is parallel to a stripe-shaped mask film on the GaN seed crystal substrate 387. The atmospheric pressure is adjusted by the flow rate adjuster 388. An atmospheric gas supplied from a raw material gas tank for supplying, as a raw material gas, a nitrogen gas or a mixed gas of an ammonia gas ($NH_3$ gas) and a nitrogen gas in an direction of an arrow 3800 (direction in which the atmospheric gas is supplied) in FIG. 45 is transferred to the growth furnace 381 after removing impurities in a gas purification part.

<7. Third Production Method (Method for Producing Larger-size Group III Nitride Crystal and the Like)>

Plural units each composed of the Group III nitride crystal layer and the mask may be used in the first production method of the present invention, or plural units each composed of the substrate and the Group III nitride crystal may be used in the second production method of the present invention. More specifically, in the seed crystal selection step, the contact step, and the crystal growth step, the units are adjacently arranged in parallel, and in the crystal growth step, the Group III nitride crystals grown from the respective units that are adjacent to each other are bound by the growth of the Group III nitride crystals. Hereinafter, this production method is referred to as the third production method of the present invention.

Figure 8B:
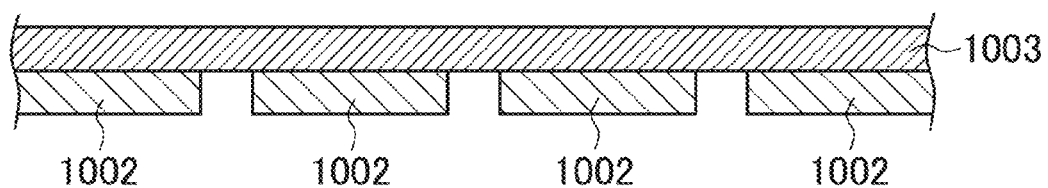
FIGS. 8B to 8D are cross-sectional views showing the state of solving the distortion using plural units as examples.

As described with reference to FIG. 8A, in the case where there is a difference in thermal expansion coefficient between the substrate and the crystal or the like, there is a possibility of generating warping, a distortion, cracking and the like in the crystal by warping of the substrate in production or use of the crystal. However, for example, it is considered that, as shown in FIG. 8B, when the sapphire substrate 1002 is separated into plural parts, warping, a distortion, cracking, and the like of the GaN crystal 1003 caused by warping of the sapphire substrate 1002 can be prevented or reduced. According to the third production method of the present invention, for example, an effect of preventing or reducing warping, a distortion, cracking, and the like of the produced Group III nitride crystal can be obtained. It is possible to divide (crack) the Group III nitride crystal by inventionally causing the substrate or the mask to be warped utilizing the difference in thermal expansion coefficient between the substrate (or the mask) and the Group III nitride crystal and the like consciously without using the third production method of the present invention (i.e., without using plural units).

Figure 7:
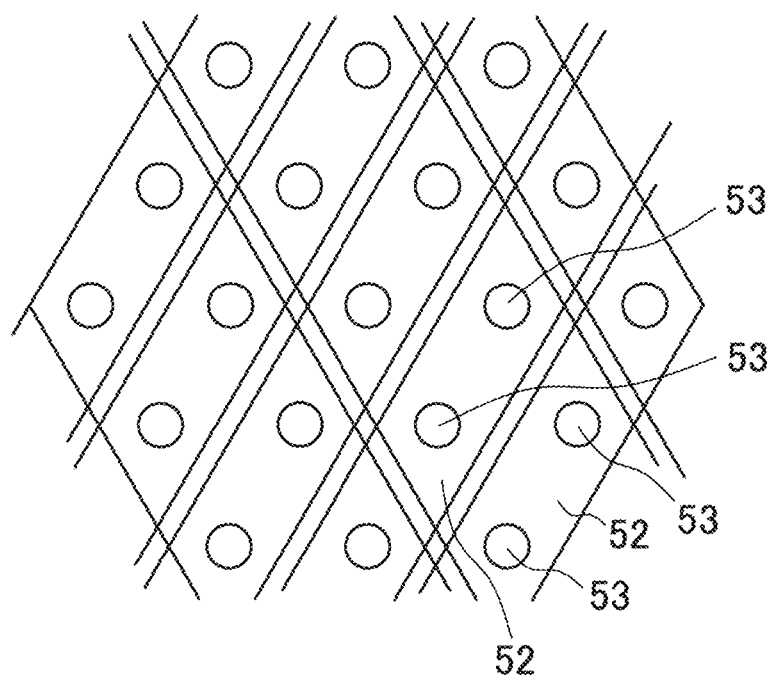
FIG. 7 is a drawing schematically showing units used in the third production method of the present invention as an example.
Figure 8C:
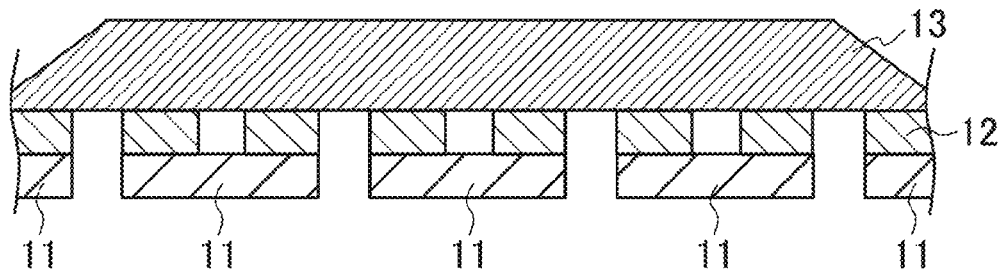
Figure 8D:
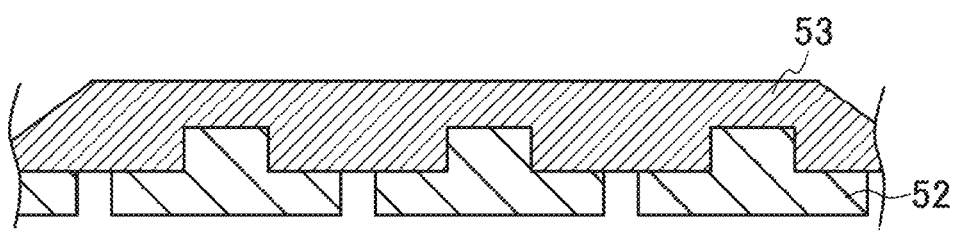

The plan view of FIG. 7 shows an example of a unit used in the third production method of the present invention. FIG. 7 shows a state where plural units each composed of a substrate 52 and a Group III nitride crystal (seed crystal) 53 are adjacently arranged in parallel in the second production method of the present invention. In the first production method of the present invention, for example, the arrangement may be an arrangement in which Group III nitride crystal layer 11 is used as a substitute for the substrate 52 of FIG. 7, and seed crystal (through hole) 12a is used as a substitute for the seed crystal 53 of FIG. 7. Although the number of seed crystals arranged on a substrate (unit) is two in FIG. 7, the number is not limited to this and may be any number of 1 or more. Furthermore, the size of each substrate also is not particularly limited and can be set as appropriate considering the production efficiency of the Group III nitride crystal, an effect of preventing or reducing warping, a distortion, cracking, and the like of the produced crystal, and the like. The cross-sectional views of FIGS. 8C and 8D schematically show examples of producing a Group III nitride crystal by the third production method of the present invention. FIG. 8C is an example using the first production method of the present invention. FIG. 8C is the same as (f) of FIG. 1 except that plural units each composed of the Group III nitride crystal layer 11 and the mask 12 are adjacently arranged in parallel, and the Group III nitride crystals 13 grown from the units that are adjacent to each other are bound. FIG. 8D is an example using the second production method of the present invention. FIG. 8D is the same as (g) of FIG. 5 except that plural units each composed of the substrate 52 and the Group III nitride crystal (seed crystal) 53 are adjacently arranged in parallel, and Group III nitride crystals 53 grown from the units that are adjacent to each other are bound. Thus, warping, a distortion, cracking, and the like of the produced crystal can be prevented or reduced. In the units that are adjacent to each other, seed crystals that are adjacent to each other are required to satisfy the conditions (M) and preferably further satisfy the conditions (A) or (C).

Figure 9:
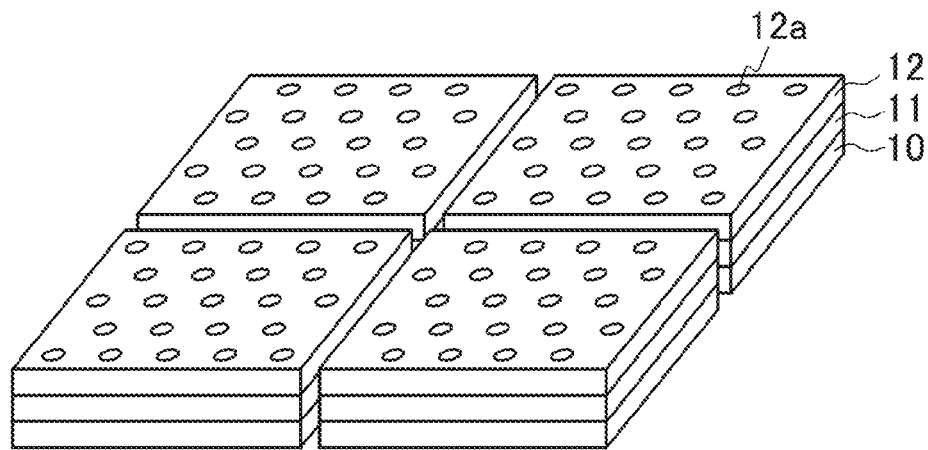
FIG. 9 shows perspective views showing a case where plural units are adjacently arranged in parallel in the first production method of the present invention as examples.
Figure 9:
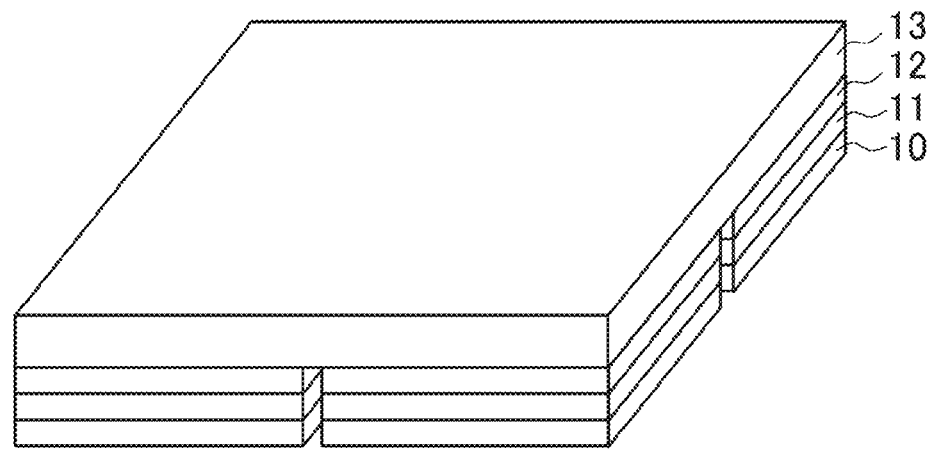
Figure 9:
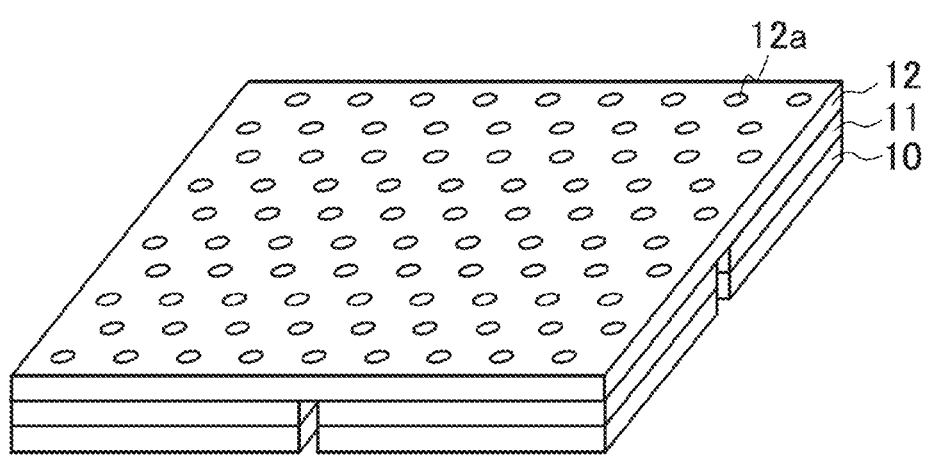

As mentioned above, according to the Group III nitride crystal production method of the present invention, a Group III nitride crystal in a large size with few defects and high quality can be produced. According to the third production method of the present invention, for example, a Group III nitride crystal in a larger size with few defects and high quality can also be produced. The perspective views of (a) to (c) of FIG. 9 schematically show an example thereof. In FIG. 9, (a) to (c) show an example of using the first production method of the present invention in the third production method of the present invention. First, as shown in (a) of FIG. 9, plural units each formed of a Group III nitride crystal layer 11 and a mask 12 formed thereon are adjacently arranged in parallel. Plural holes 12a are formed in each mask 12. The Group III nitride crystal layer 11, the mask 12, and the through holes 12 are as described in the sections "2. Arrangement relationship, shape, size, and the like of seed crystal " and "4. First production method", for example. In this case, not only seed crystals (through holes 12a) in each unit, but also seed crystals (through holes 12a) that are adjacent to each other between the units that are adjacent to each other satisfy the conditions (M), i.e., the conditions where m-planes of crystals grown from the seed crystals that are adjacent to each other do not almost coincide with each other, and preferably, the seed crystals that are adjacent to each other further satisfy the conditions (A) or (C). That is, (a) of FIG. 9 represents a part of the seed crystal selection step.

As show in (a) of FIG. 9, in this example, a Group III nitride crystal layer 11 is formed over an independent substrate 10, which forms a unit together with a Group III nitride crystal layer 11 and a mask 12. The material of the independent substrate 10 is not particularly limited and is, for example, the same as the substrate in the second production method of the present invention and is particularly preferably sapphire or the like from the viewpoint of the costs and the convenience.

In the state of (a) of FIG. 9, the contact step and the crystal growth step are performed to grow a Group III nitride crystal 13. Thus, the grown crystals in each unit and between the units shown in (a) of FIG. 9 are bound, and as shown in (b) of FIG. 9, one large Group III nitride crystal 13 can be produced.

By the recent advances in technology, a large-size semiconductor crystal can be produced, and thus, there are more choices of designing a semiconductor device. For example, in a silicon semiconductor substrate or the like, large-size crystals with a diameter of 6 inch (about 15 cm), 8 inch (about 20 cm), and the like are put to practical use. However, in a Group III nitride crystal such as GaN, it was impossible to produce such large-size crystal. As mentioned above, according to a conventional method for producing a Group III nitride crystal, there is a possibility of generating warping, a distortion, cracking, and the like caused by warping of the substrate in production or use of the crystal by the difference in thermal expansion coefficient between a substrate (sapphire substrate 1002 in FIG. 8A) and a crystal (GaN crystal 1003 in FIG. 8A) and the like. The problem becomes more significant when a large-size Group III nitride crystal is produced by using a large-size substrate. For example, it is considered that the crystal is prone to be cracked, and in addition, a crystal defect received by the crystal grown from the seed crystal becomes larger by warping, a distortion, and the like of the crystal. A Group III nitride crystal such as GaN has been produced using a 2-inch substrate (diameter: about 5 cm), a Group III nitride crystal that is larger than the substrate has not been produced.

However, in the third production method of the present invention, for example, as shown in (a) to (c) of FIG. 9, a large-size crystal can be produced while reducing the problem of warping, a distortion, cracking, and the like of the crystal caused by warping of the substrate by arranging the plural units in parallel. Further, it is considered that the third production method of the present invention can further reduce the problem by combining with the first production method of the present invention.

In FIG. 9, (a) to (c) show an example using the first production method of the present invention. The third production method of the present invention can be performed in the same manner as described above except that the units of the second production method of the present invention are used as substitute for the units of the first production method of the present invention. Although the number of the units arranged lengthwise and crosswise is 2×2=4 in (a) to (c) of FIG. 9, the number is not limited by this and can be any number. The number may be, for example, 1×2=2, 1×3=3, or 3×3=9.

In the third production method of the present invention, the units that are adjacent to each other may be partially connected with each other. Specifically, in the first production method of the present invention, it is preferred that the masks are connected to each other between the units that are adjacent to each other because the seed crystals that are adjacent to each other can be set easily to satisfy the conditions (M) (more preferably, the seed crystals that are adjacent to each other can be easily set to further satisfy the conditions (A) or (C)). For example, in (a) of FIG. 9, as a mask 12, a mask is used for each unit. However, the masks may be connected to form a large mask as a whole as shown in (c) of FIG. 9, for example.

The size of the Group III nitride crystal produced by the production method of the present invention is not particularly limited, and the major axis is preferably 15 cm (about 6 inch) or more, more preferably 20 cm (about 8 inch) or more, particularly preferably 25 cm (about 10 inch) or more. The height of the Group III nitride crystal also is not particularly limited and is, for example, 1 cm or more, preferably 5 cm or more, more preferably 10 cm or more. Although such large-size Group III nitride crystal may be produced without using the third production method of the present invention, it is preferably produced by the third production method of the present invention. Specifically, a Group III nitride crystal with a large diameter (in a large lateral size) is preferably produced by the third production method of the present invention. The production method of the present invention, however, is not limited by the production of such large-size Group III nitride crystal and can be used to produce a Group III nitride crystal in a conventional size with higher quality, for example.

<8. Group III Nitride Crystal and Semiconductor Device>

The Group III nitride crystal of the present invention is a Group III nitride crystal produced by the production method of the present invention or a Group III nitride crystal produced by further growing the Group III nitride crystal. The Group III nitride crystal of the present invention is, for example, a Group III nitride crystal in a large size with few defects and high quality. Although the quality is not particularly limited, the dislocation density is, for example, preferably in the numerical range described in the section "1. Production method of the present invention". The size of the Group III nitride crystal also is not particularly limited and is, for example, as mentioned above. The use of the Group III nitride crystal of the present invention also is not particularly limited and can be used in a semiconductor device because of having properties of a semiconductor, for example.

According to the present invention, as mentioned above, a Group III nitride (e.g., GaN) crystal with a diameter of 6 inches or more, which has not been produced by a conventional technique, can be provided. Accordingly, for example, by using Group III nitride as a substitute for Si in a semiconductor device such as a power device generally required to have a large diameter of Si (silicon), LED, or the like, the performance can be further improved. Therefore, the present invention exerts a great impact on the semiconductor industry. The Group III nitride crystal of the present invention is not limited thereby and is applicable to other semiconductor devices such as solar battery and the like and other applications besides the semiconductor devices.

EXAMPLES

The examples of the present invention are described below. The present invention, however, is not limited thereby.

In production (growth) of crystals in all of the following examples, reference examples, and comparative examples except Examples 5, 6, and 8, an LPE device having a structure shown in FIG. 43 was used. As a crucible, a crucible made of YAG, i.e., Ytterium Aluminum Garnet was used in all of the following examples, reference examples, and comparative examples except Examples 5, 6, and 8. Ga:Na represents the ratio of the amounts of gallium and sodium to be used by mole (the ratio by mole).

Reference Example 1

Figure 12:
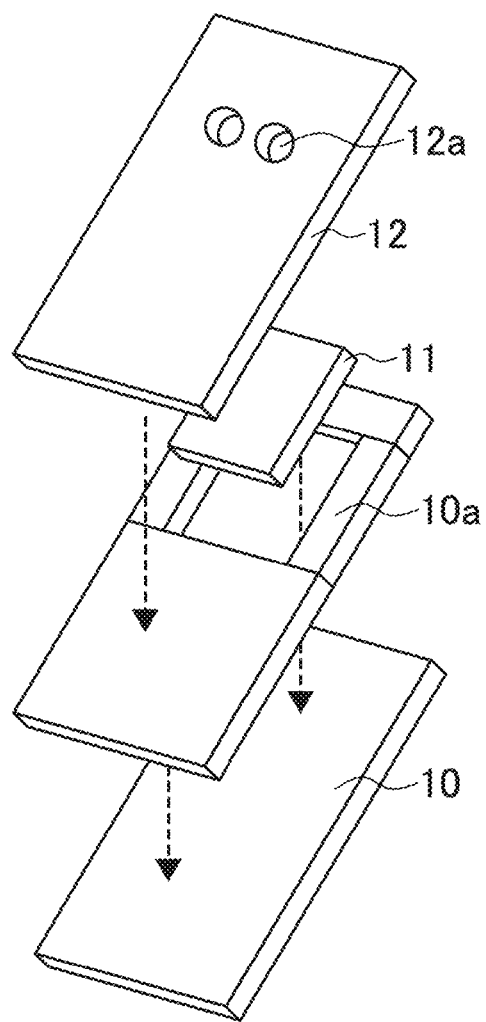
FIG. 12 is a perspective view schematically showing a unit used in the examples.

A GaN crystal was produced using a unit having a structure shown in a schematic view of FIG. 12. As shown in FIG. 12, this unit is configured so that a c-plane GaN template substrate (Group III nitride crystal layer) 11 is fixed on a sapphire substrate 10 with a sapphire jig 10a, and a sapphire mask 12 (manufactured by Disco) is placed thereon. A through hole 12a is formed in the sapphire mask 12, and c-plane of the GaN template substrate 11 is exposed from the through hole 12a. The number of through holes 12a is one in the present reference example, and the shape and the diameter of the through hole 12a are a circle and 1.2 mm, respectively.

Crystal growth was performed under a nitrogen gas atmosphere using this unit under the following conditions to produce a GaN crystal. The following "C [mol %] 0.5" represents addition of a 0.5% by mole carbon powder relative to the total amount of gallium (Ga), sodium (Na), and the carbon powder by mole. As an operation, first, a crucible 366 was placed in a stainless container 364, and the stainless container 364 was placed in an electric furnace (heat-and-pressure-resistant container) 365. Heating is started by a heater (not shown) to cause the electric furnace (heat-and-pressure-resistant container) 365 to be under high-temperature and high-pressure conditions at 870° C. and 36 atom (about 3.6 MPa) at the same time as introducing a nitrogen gas from a raw material gas tank 361 into the stainless container 364, and a reaction was performed for 200 hours to perform the crystal growth. Thus, an intended GaN crystal was produced.

| Temperature [° C.] | 870 |
|---|---|
| Pressure [MPa] | 3.6 |
| Time [h] | 200 |
| Ga:Na | 15:85 |
| C [% by mol] | 0.5 |
| Crucible | YAG |

Figure 10:
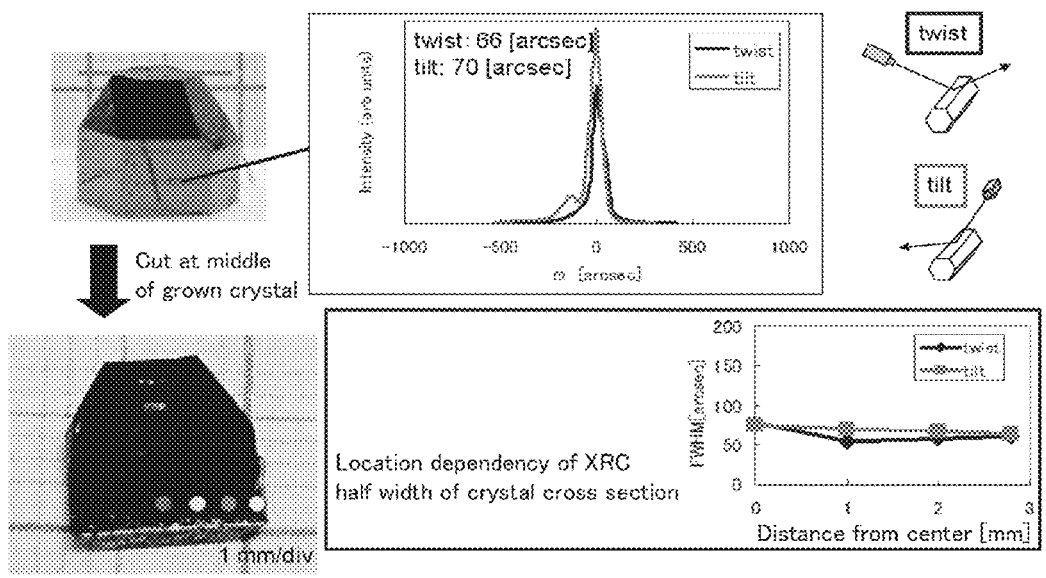
FIG. 10 shows photographs of a crystal produced in Reference Example 1 (by a point seed method) and XRC (X-ray rocking curve method) profiles.
Figure 11:
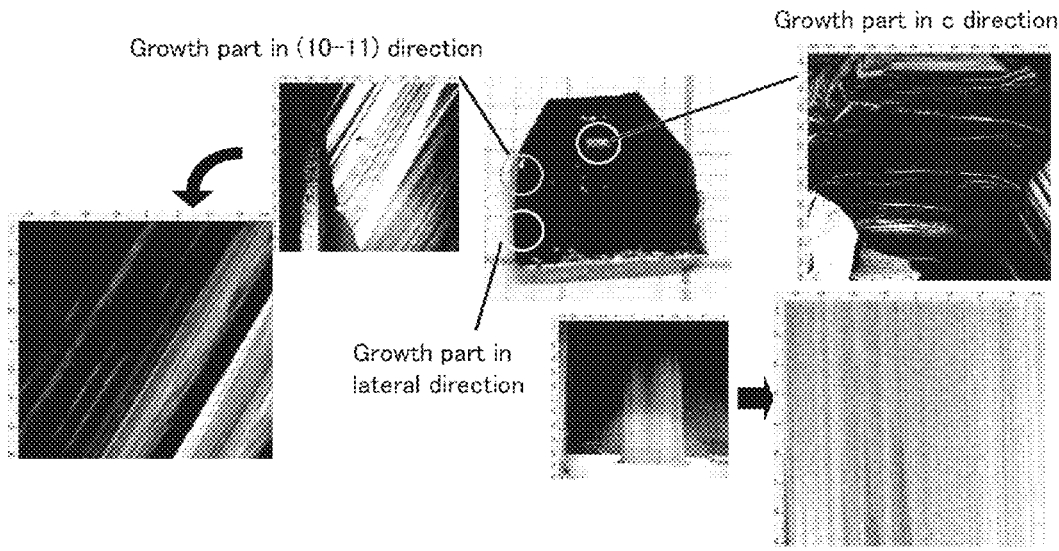
FIG. 11 shows photographs indicating cross-sections of the crystal in FIG. 10.

FIG. 10 shows photographs of the produced GaN crystal and graphs of a measurement result of the GaN crystal by XRC together. As shown in the photographs, the produced crystal has a hexagonal shape of tapering toward the upper part. The upper graph shows a measurement result of the surface of the crystal by XRC, the horizontal axis indicates a half width (FWHM), and the vertical axis indicates the intensity thereof. The "arcsec" means the same as the inverse of second ($s^{-1}$). The same applies hereinafter. The lower graph is an XRC profile of the longitudinal cross-section of the crystal, the horizontal axis indicates the distance from the center of the crystal, and the vertical axis indicates a half width (FWHM). As shown in the graphs, it was demonstrated that a GaN crystal with very few dislocations throughout the entire crystal, homogeneity, and high quality could be obtained. FIG. 11 shows enlarged photographs of parts of the longitudinal cross-section of this GaN crystal. As shown in FIG. 11, growth striations parallel with the respective planes were observed in a growth part in the (10-11) plane direction and a growth part in the lateral direction. A dark spot was not observed in any of the parts. Thus, it was demonstrated that there were very few defects such as a dislocation and the like.

Figure 33:
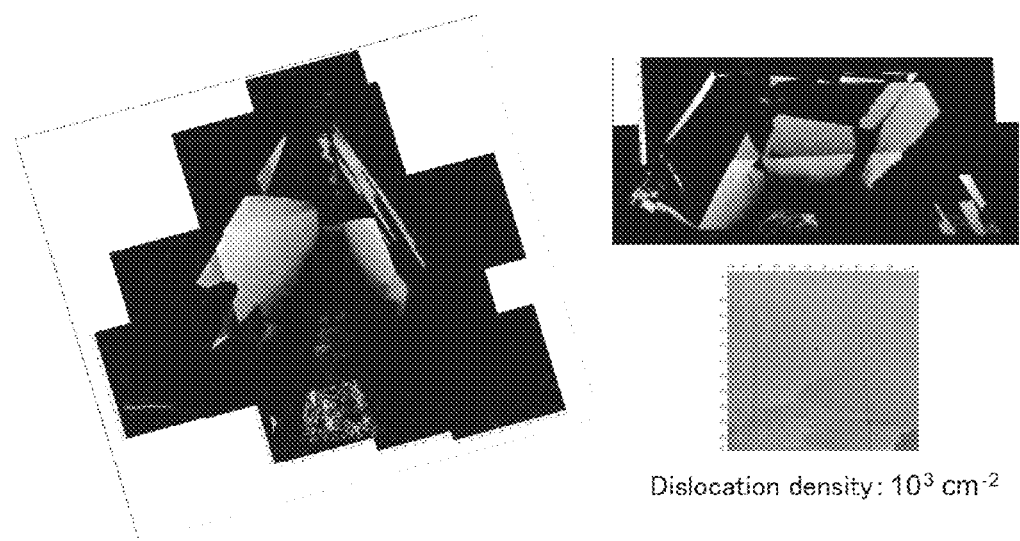
FIG. 33 shows an example of a CL (cathode luminescence) image of a crystal produced in Reference Example 1.

FIG. 33 shows CL images of the produced GaN crystal. As shown in FIG. 33 the dislocation density was $10^3$ $cm^{-2}$, which was really small.

Examples 1 to 2

A GaN crystal was produced with a crystal growth time of 200 hr in the same manner as in Reference Example 1 except that two through holes 12a (FIG. 12) were used, the distance between the through holes 12a was 0.5 mm, and a-axes of seed crystals (c-planes of GaN crystal layers 11) exposed from the through holes 12a completely coincided with each other (Example 1). Further, a GaN crystal was produced in the same manner as in Example 1 except that the double amounts of Ga and Na of Example 1 with the same ratio Ga:Na of 15:85 by mole as in Example 1 were used, and the crystal growth time was 96 hours. In the following examples and the comparative examples, each through hole 12 was a circle through hole with a diameter of 1.2 mm, and the distance between the through holes 12a that were adjacent to each other was 0.5 mm, unless otherwise mentioned. In all of the examples, the through holes 12a were arranged so that m-planes of crystals grown from seed crystals that were adjacent to each other did not coincide with (do not face) each other, and a-axes of seed crystals that were adjacent to each other overlapped with each other (apexes of a hexagon of the grown crystal associate with each other as shown in FIGS. 2 to 4 and 37A).

Figure 13:
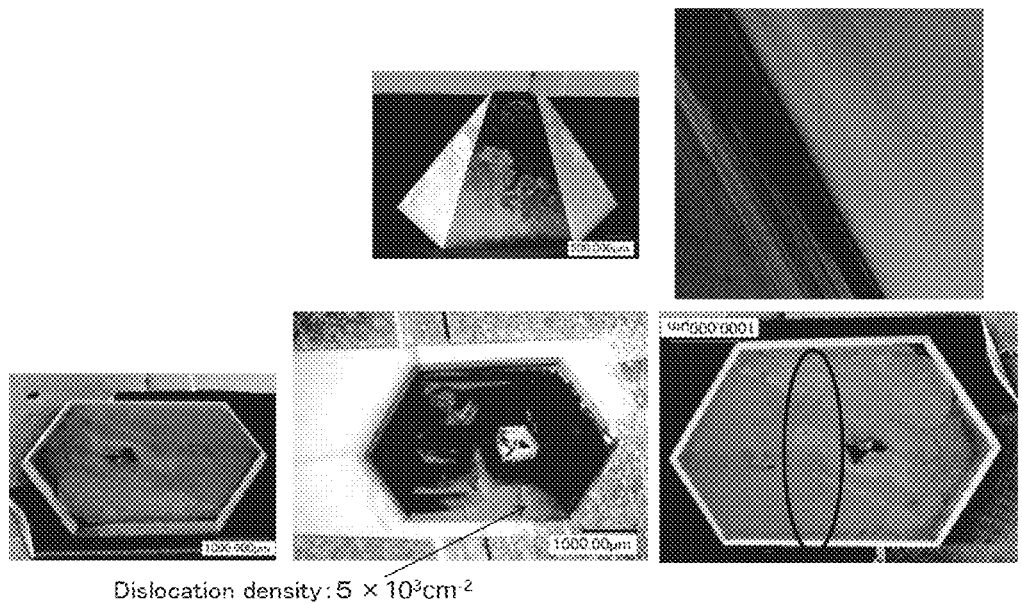
FIG. 13 shows photographs indicating an example of a crystal produced in Example 2.
Figure 14:
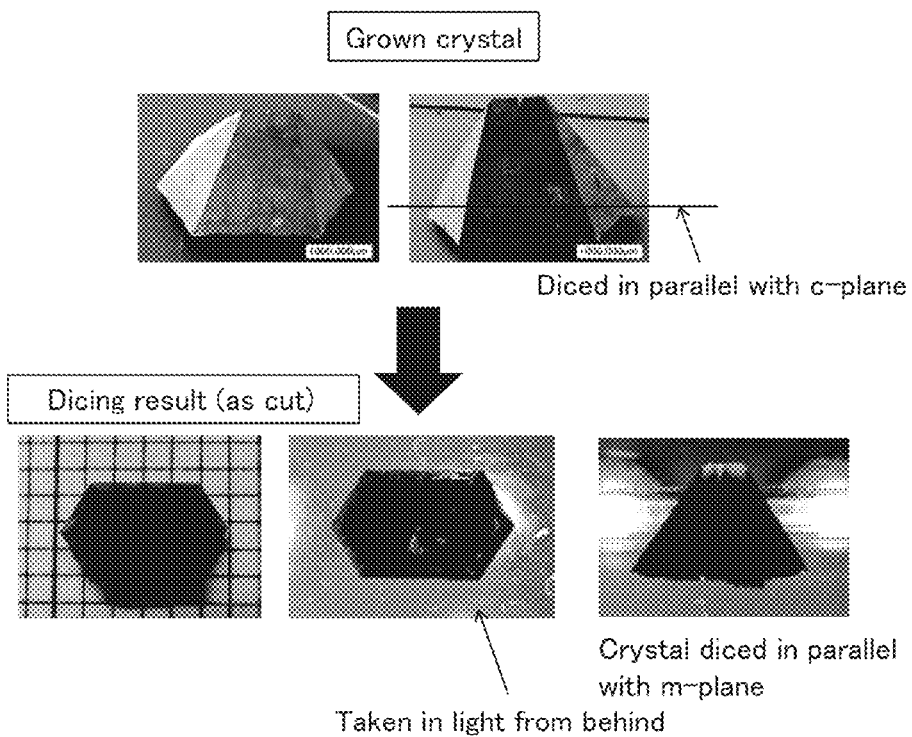
FIG. 14 shows photographs indicating another example of a crystal produced in Example 1.
Figure 15:
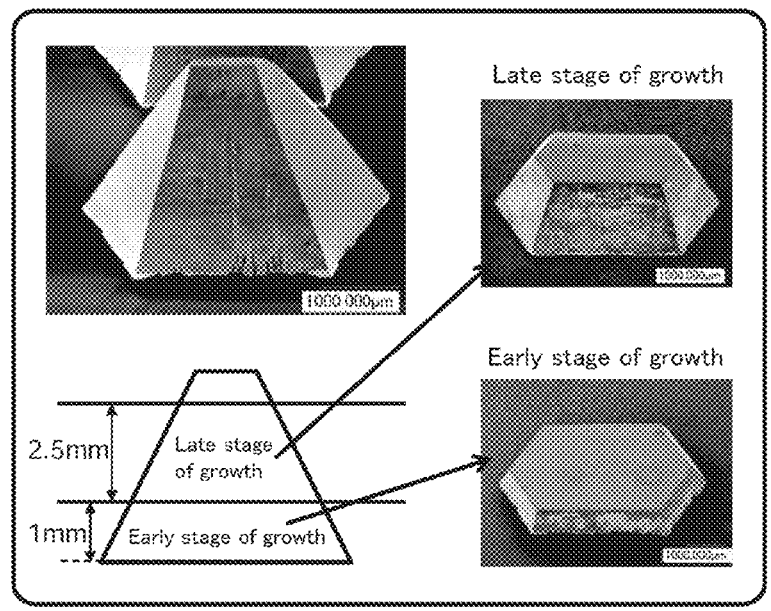
FIG. 15 shows photographs indicating yet another example of a crystal produced in Example 1.
Figure 16:
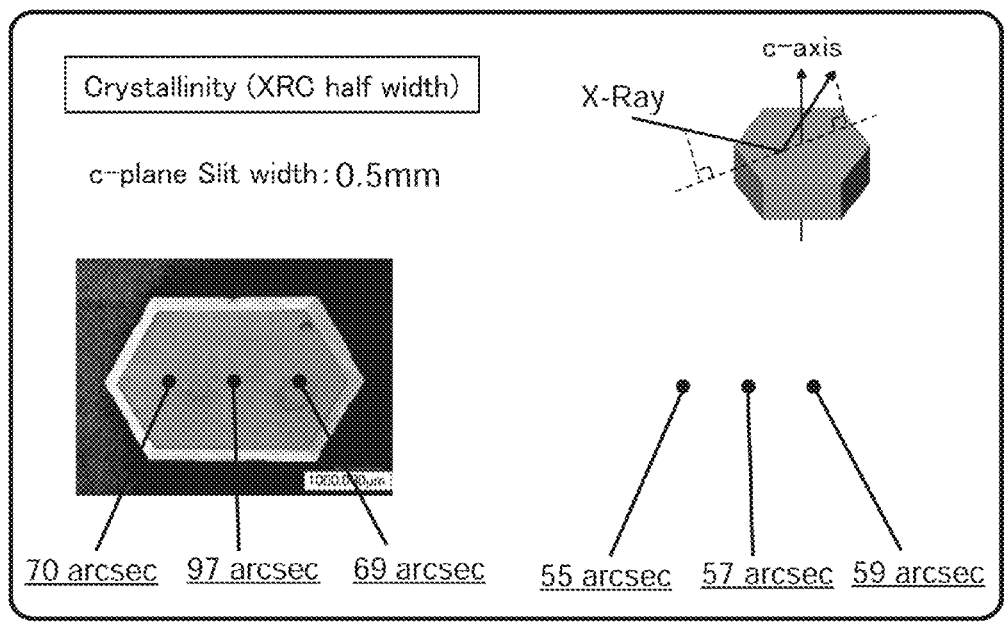
FIG. 16 shows photographs indicating yet another example of a crystal produced in Example 1.

FIGS. 13 to 16 show photographs of crystals produced in the present examples and photographs of cross-sections the respective crystals are cut (diced) in parallel with the c-planes (crosswise) or m-planes (lengthwise). FIG. 13 shows photographs of the crystal produced in Example 2, and FIGS. 14 to 16 show photographs of the crystal produced in Example 1. As shown in FIGS. 13 to 16, each of these crystals was formed by binding (association) of two crystals through the growth of the two crystals and thus had a shape approximating to a horizontally-long hexagonal pyramid. As shown in the cross-sectional photographs FIG. 13, no crystal defect such as an inclusion or the like could be observed in an association (binding) site of the two crystals (in an ellipse of a lower right photograph). According to XRC, the dislocation density was $5 \times 10^3$ $cm^{-2}$ which was really small. The defects in the crystal (FIGS. 14 to 16) of Example 1, grown for 200 hr, were less compared with the crystal of Example 2, grown for 96 hr using double amounts of Ga and Na.

As shown in the lower middle photograph of FIG. 13 and FIG. 14, noinclusion or the like was observed in an association site of two crystals even though each produced crystal was diced in parallel with the c-plane or m-plane and each photograph was taken in light.

Figure 18:
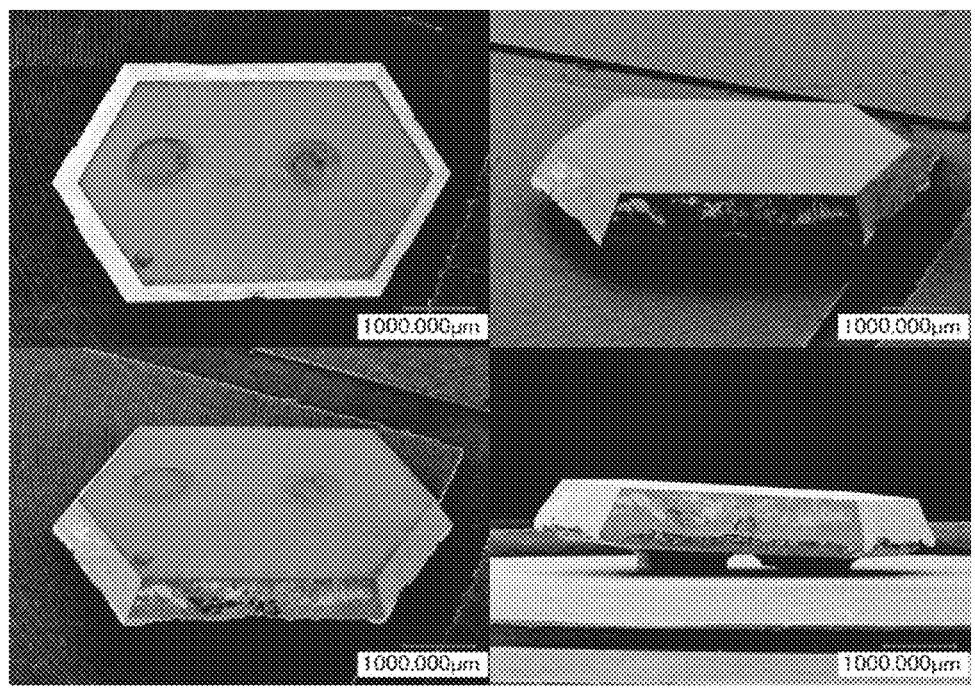
FIG. 18 shows photographs indicating yet another example of a crystal produced in Example 1.
Figure 19:
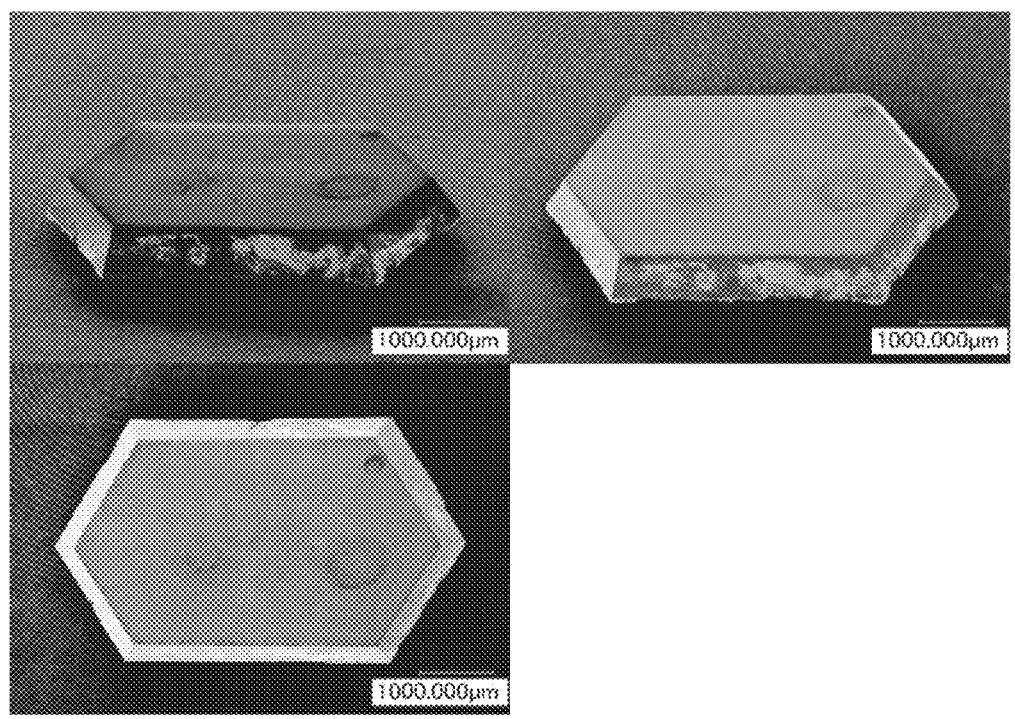
FIG. 19 shows photographs indicating yet another example of a crystal produced in Example 1.
Figure 20:
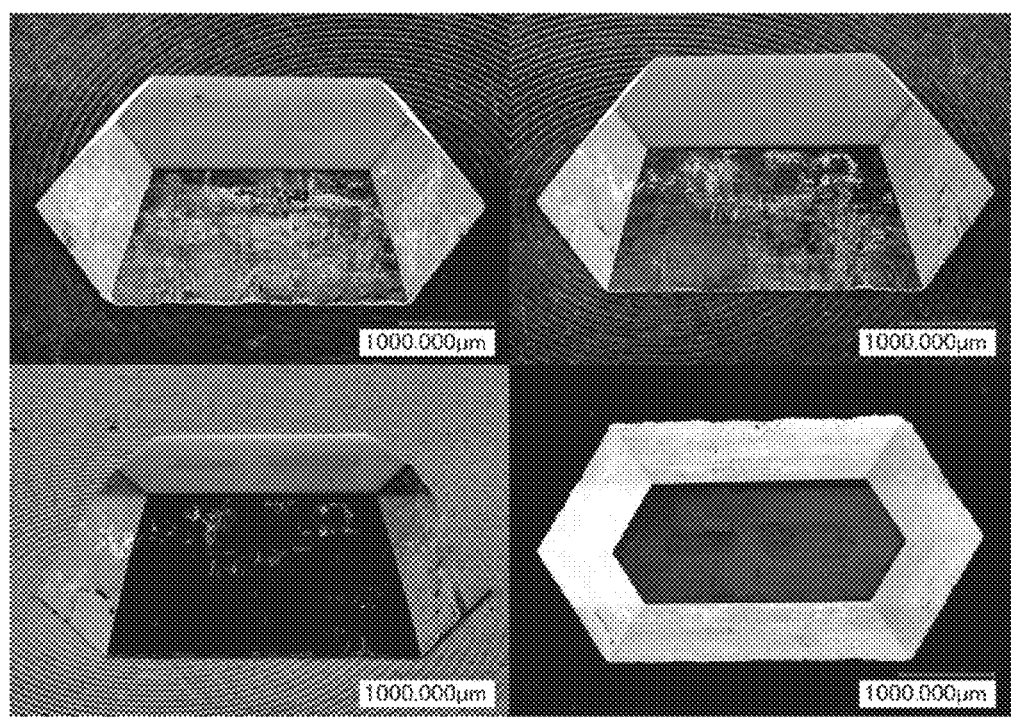
FIG. 20 shows photographs indicating yet another example of a crystal produced in Example 1.

Further, as shown in FIG. 15, the produced crystal was separated into a lower part (early stage of crystal growth) and an upper part (late stage of crystal growth) by dicing it in parallel with the c-plane, and the size of each crystal defect in each of the lower part and the upper part was measured by XRC half width. The results are shown in FIG. 16. As shown in FIG. 16, a really small half width was shown in each of the early stage of crystal growth (left side of FIG. 16) and the late stage of crystal growth (right side of FIG. 16). Thus, it was demonstrated that each crystal was a crystal with few defects and high quality. Specifically, the half width in the late stage of crystal growth was smaller than that in the early stage of crystal growth. Thus, it was demonstrated that a crystal in the late stage of crystal growth was a crystal with fewer defects and higher quality. FIGS. 18 and 19 show enlarged photographs of the photographs of the lower part (early stage of crystal growth) of the crystal in FIGS. 15 and 16. FIG. 20 shows enlarged photographs of the photographs of the upper part (late stage of crystal growth) of the crystal in FIGS. 15 and 16.

Example 3

Figure 17:
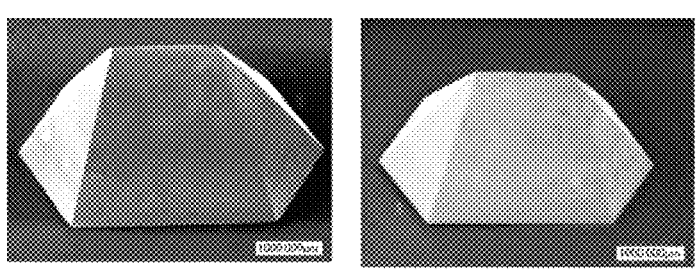
FIG. 17 shows photographs indicating yet another example of a crystal produced in Example 3.

A GaN crystal was produced in the same manner as in Example 2 except that each through hole 12a (FIG. 12) was a circle through hole with a diameter of 1.0 mm. FIG. 17 shows the photographs of the GaN crystal. As shown in FIG. 17, although the obtained crystal was small because the diameter of the through hole was smaller than that of Example 2, a crystal with no observed crystal defect and high quality could be obtained by binding two crystals.

Example 4

Figure 21:
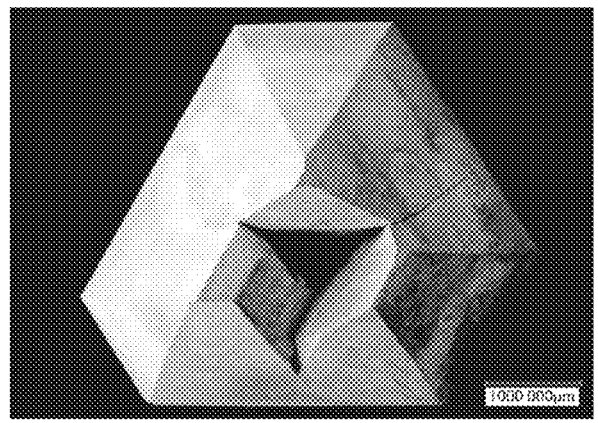
FIG. 21 shows photographs indicating yet another example of a crystal produced in Example 4.
Figure 21:
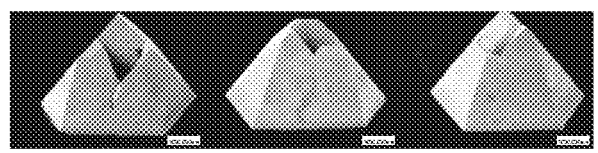
Figure 22:
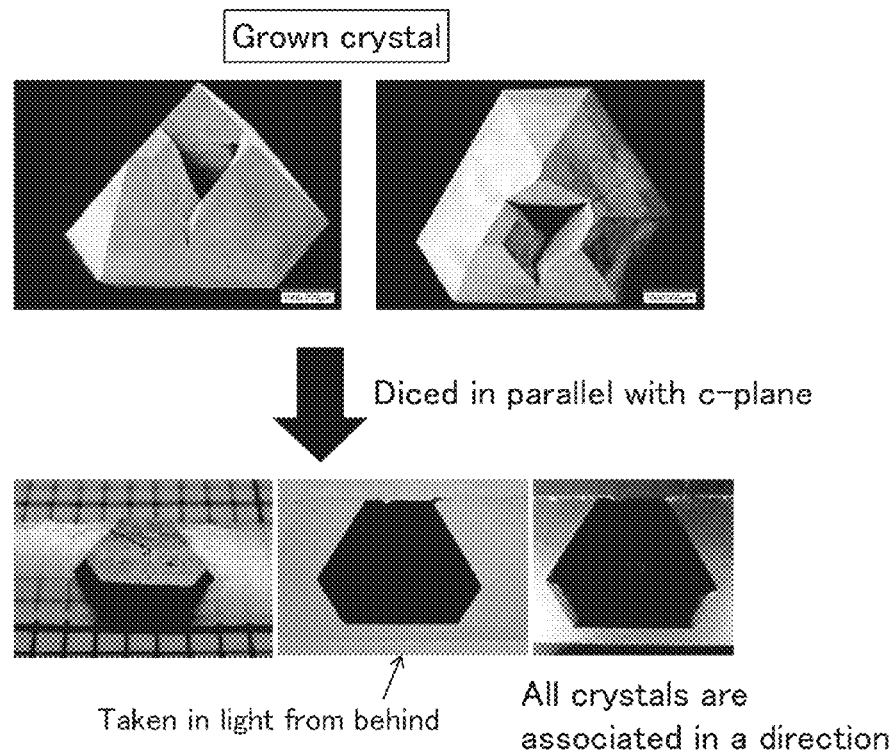
FIG. 22 shows photographs indicating yet another example of a crystal produced in Example 4.
Figure 23:
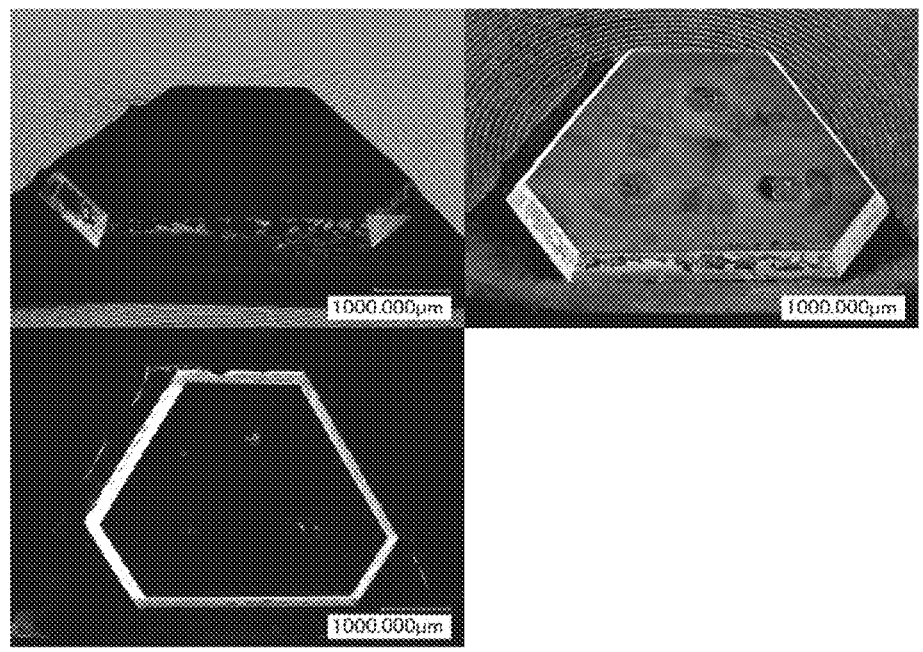
FIG. 23 shows photographs indicating yet another example of a crystal produced in Example 4.

A GaN crystal was produced in the same manner as in Example 1 except that three through holes 12a (FIG. 12) were arranged at the respective apexes of an equilateral triangle, the double amounts of Ga and Na of Example 1 with the same ratio Ga:Na of 15:85 by mole as in Example 1 were used, and the crystal growth time was 120 hours. FIG. 21 and an upper part of FIG. 22 show the photographs of the GaN crystal. The cross-sectional photographs of the lower part (early stage of crystal growth) of the GaN crystal after dicing it in parallel with the c-plane are shown on the lower side of FIG. 22 and FIG. 23. As shown in the lower photograph of FIG. 22 and the photographs of FIG. 23, a crystal with very few defects and high quality could be obtained. No defect such as an inclusion or the like was observed in an association site (binding site) of three crystals even though the diced cross-section was taken in light from behind.

Examples 5 to 6

Figure 24:
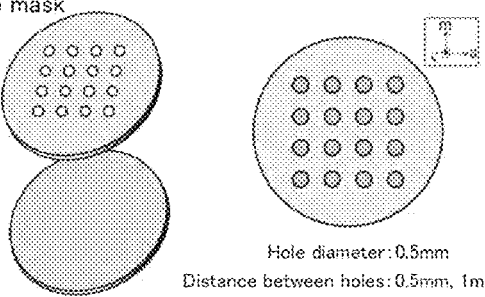
FIG. 24 shows photographs indicating yet another example of a crystal produced in Examples 5 and 6.
Figure 24:
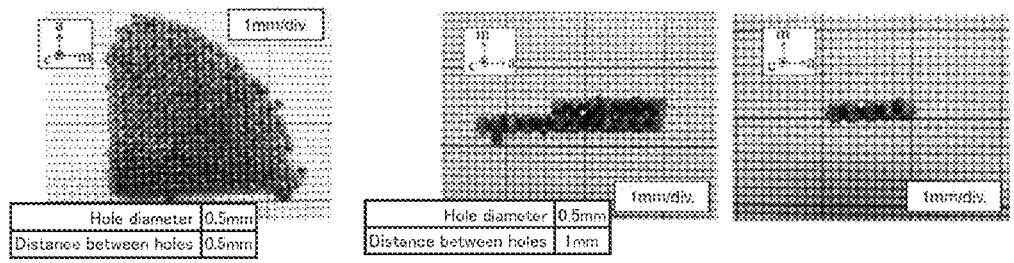

A GaN crystal was produced in the same manner as in Example 1 except that a LPE device having a structure shown in FIG. 44 was used, reaction conditions shown in the upper left table of FIG. 24 were used, an alumina crucible was used, and a c-plane GaN template substrate and a sapphire mask (diameter of each through hole: 0.5 mm, distance between through holes that were adjacent to each other: 0.5 mm) shown in upper light drawings of FIG. 24 were used (Example 5). Further, a GaN crystal was produced in the same manner as in Example 5 except that the distance between through holes that were adjacent to each other was 1.0 mm (Example 6). In the upper left table of FIG. 24, "Ga:Na (Double amount)" represents using the double amounts of Ga and Na relative to Example 1. As the sapphire mask, a mask having plural through holes was used. The through holes were arranged so that plural through holes were aligned in directions of the a-axis and m-axis of the c-plane GaN template substrate at equal intervals, as schematically shown in the upper right drawings of FIG. 24.

A photograph obtained by taking the GaN crystal produced in Example 5 from the direction of the c-axis is shown on the lower left side of FIG. 24. A SEM (Scanning Electron Microscope) image of the same crystal is shown in a photograph on the upper side of FIG. 25. As shown in the photograph on the upper side of FIG. 25, GaN crystals grown from the respective through holes were bound on the sapphire mask and could be free-standing GaN crystals by removing them from the sapphire mask. From the XRC images and the CL images (not shown), it was demonstrated that specifically, a crystal with few defects in the association site (binding site) of crystals in the a-axis direction (direction in which the a-axes of the crystals that are adjacent to each other almost coincide with each other) and high quality could be obtained.

Figure 25:
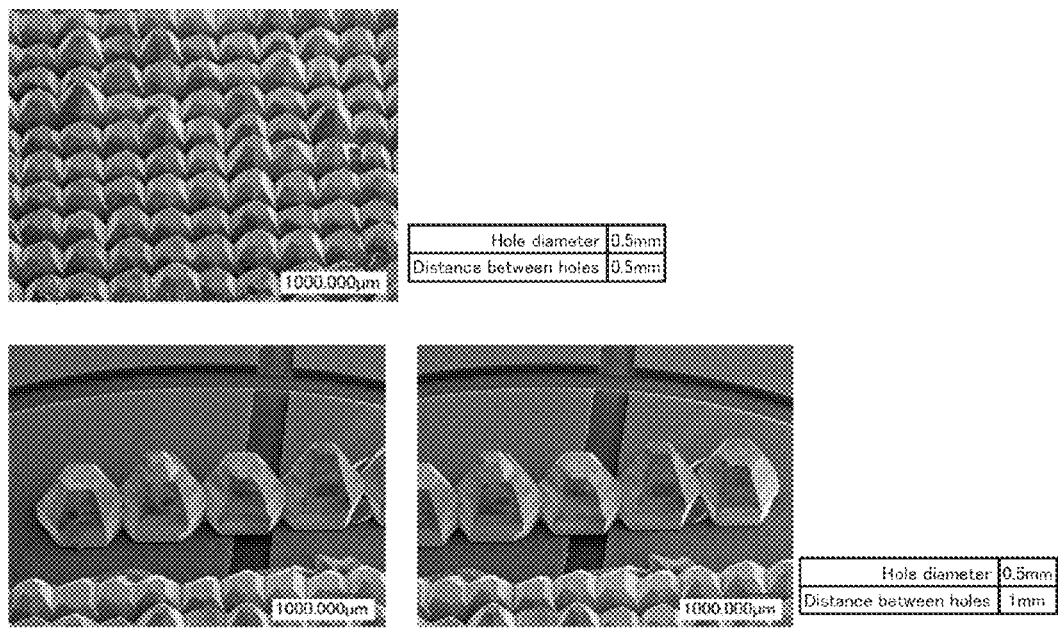
FIG. 25 shows photographs indicating yet another example of a crystal produced in Examples 5 and 6.
Figure 26:
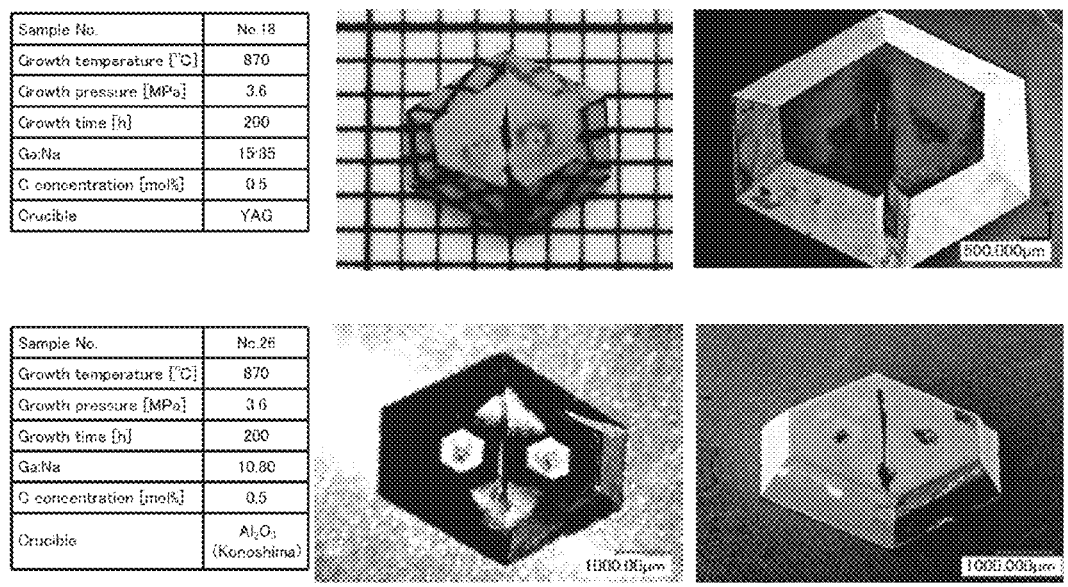
FIG. 26 shows photographs indicating an example of a crystal produced in Comparative Examples 1 and 2.

Photographs of (two) GaN crystals produced in Example 6, observed from the direction of the c-axis are shown on the lower right side of FIG. 24. As shown on the lower side of FIG. 24, the GaN crystals grown from the respective through holes were bound on the sapphire mask and could be free-standing GaN crystals by removing them from the sapphire mask, as in Example 5. From the XRC images and CL images (not shown), it was demonstrated that a crystal with few defects in the association site (binding site) of crystals in the a-axis direction and high quality could be obtained. However, the crystal had a large defect in the association site (binding site) of crystals and a weak strength and thus was cracked easily in the m-axis direction (direction in which the m-axes of the crystals that are adjacent to each other almost coincide with each other). The SEM images of the GaN crystal produced in Example 6 are shown in the photographs on the lower side of FIG. 25. The photograph on the upper part of FIG. 25 shows the GaN crystal produced in Example 6, and the photographs on the lower part of FIG. 25 show the GaN crystal produced in Example 5. As shown in FIG. 25, crystals grown from the respective seed crystals were bound in the state of growing to a larger size according to Example 6, compared with Example 5. This suggested that a GaN crystal with fewer defects and higher quality could be obtained.

Comparative Examples 1 to 4

A GaN crystal was produced in the same manner as in Example 1 except that two seed crystals (c-planes of GaN crystal layer 11 exposed from through holes 12a) were arranged so that the m-axes of the seed crystals coincided with each other (i.e., the m-planes of the grown crystals coincided and associated with each other in the state of facing each other as schematically shown in FIG. 37C as an example) (Comparative Example 1).

A GaN crystal was produced in the same manner as in Comparative Example 1 except that the ratio of Ga:Na by mole was 10:80, and a crucible made of alumina was used (Comparative Example 2).

A GaN crystal was produced in the same manner as in Comparative Example 1 except that the crystal growth time was 96 hours as substitute for 200 hours (Comparative Example 3).

A GaN crystal was produced in the same manner as in Comparative Example 1 except that the ratio of Ga:Na by mole was 10:90, and the crystal growth time was 96 hours as substitute for 200 hours (Comparative Example 4).

Figure 27:
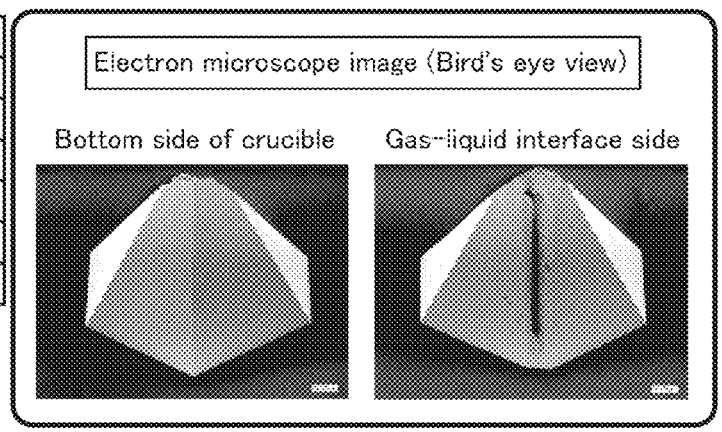
FIG. 27 shows photographs indicating another example of a crystal produced in Comparative Example 3.
Figure 28:
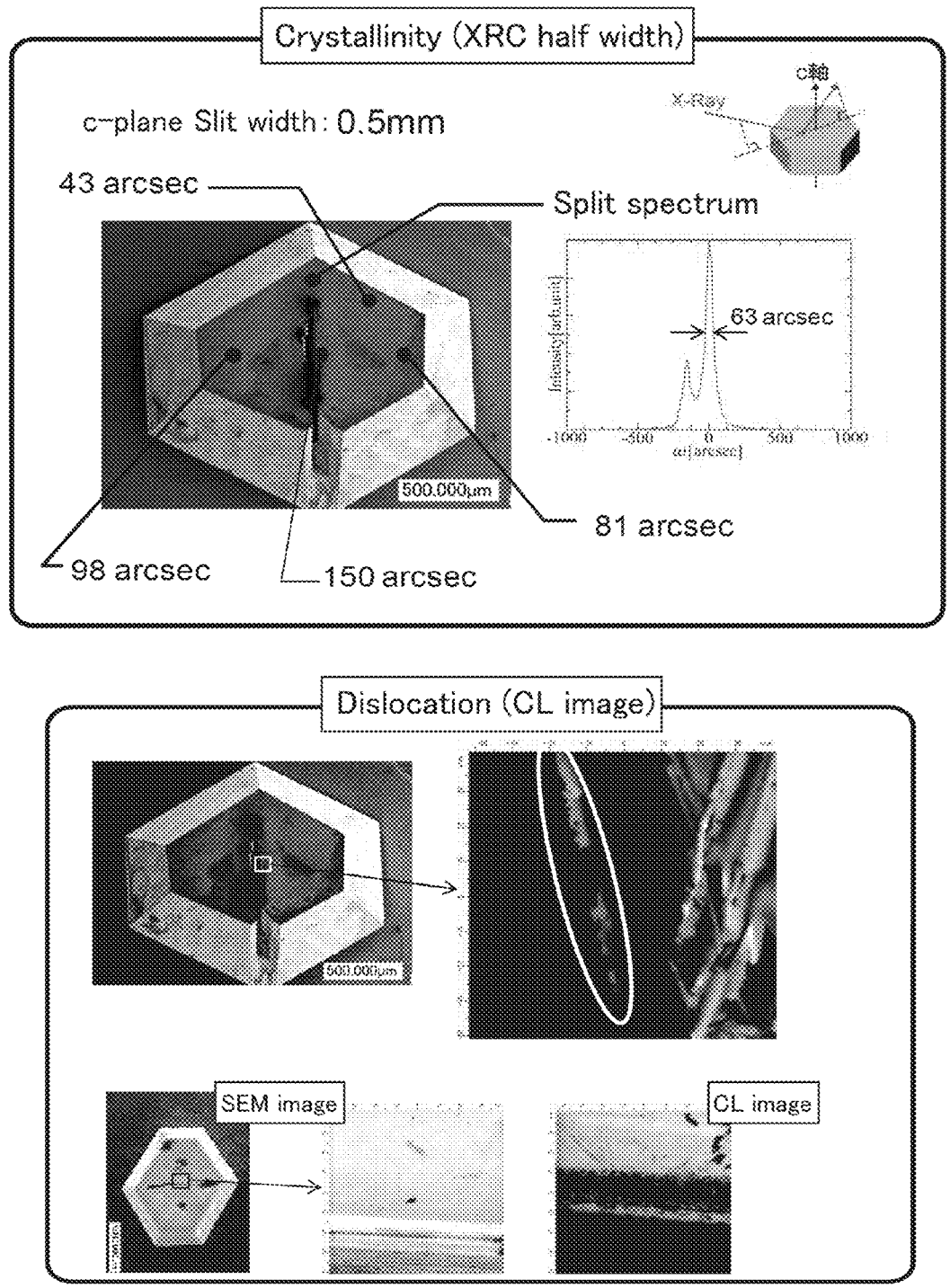
FIG. 28 shows photographs indicating yet another example of a crystal produced in Comparative Example 1.
Figure 29:
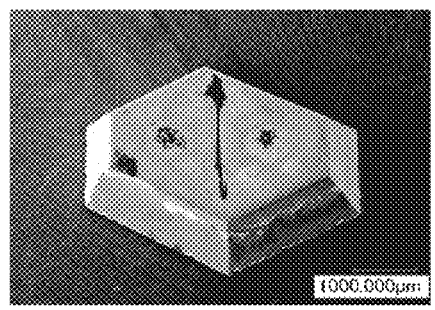
FIG. 29 shows photographs indicating yet another example of a crystal produced in Comparative Example 4.
Figure 29:
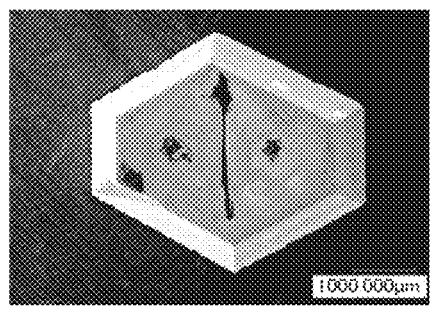
Figure 29:
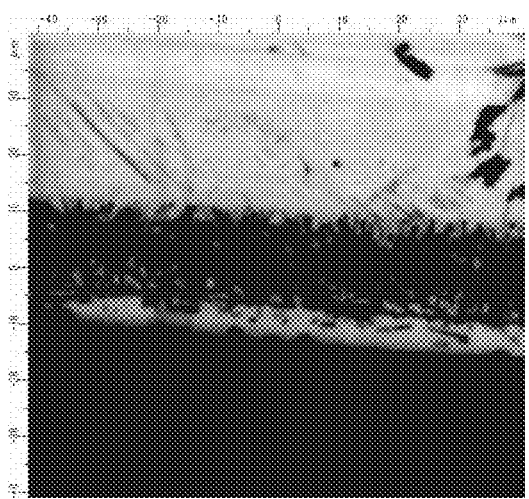
Figure 29:
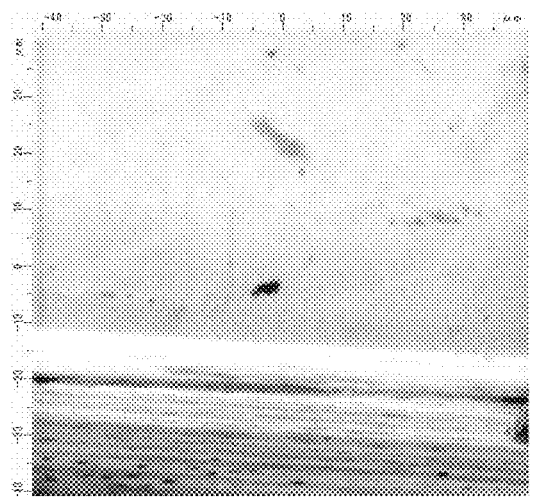

FIGS. 26 to 29 show photographs and XRC results of these crystals. The cross-sectional photographs of the lower part (early stage of crystal growth) of the crystal in Comparative Example 1 after dicing it in parallel with the c-plane are shown on the upper side of FIG. 26 and FIG. 28. In FIG. 28, the XRC result (in the graph, the horizontal axis indicates a half width, and the vertical axis indicates intensity), CL (cathode luminescence) images, and SEM images are shown together. The cross-sectional photographs of the lower part (early stage of crystal growth) of the crystal in Comparative Example 2 after dicing it in parallel with the c-plane are shown on the lower side of FIG. 26. FIG. 27 shows photographs of the crystal in Comparative Example 3. FIG. 29 shows cross-sectional photographs of the lower part (early stage of crystal growth) of the crystal in Comparative Example 4 after dicing it in parallel with the c-plane. As shown in FIGS. 26 to 29, in each of Comparative Examples 1 to 4 in which reaction conditions were variously changed, defects such as a void, an inclusion, and the like in the association site (binding site) of two crystals were observed by visual check. As shown in FIG. 27, specifically, a defect at the gas-liquid interface side of the crucible was significant. As shown in FIG. 28, the XRC half width around the void in the association site (binding site) of two crystals was particularly large, and dislocations were observed in the CL images and the SEM images. Thus, it was demonstrated that there were many dislocations, particularly around the void.

Comparative Example 5

A GaN crystal was produced in the same manner as in Example 1 except that three seed crystals (c-planes of a GaN crystal layer 11 exposed from through holes 12a) were arranged at the respective apexes of an equilateral triangle so that m-axes of the seed crystals that were adjacent to each other coincided with each other, the double amounts of Ga and Na by mole of Example 1 with the same ratio Ga:Na of 15:85 by mole as in Example 1 were used, and the crystal growth time was 95 hours.

Figure 30:
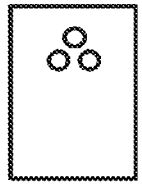
FIG. 30 shows photographs indicating yet another example of a crystal produced in Comparative Example 5.
Figure 30:
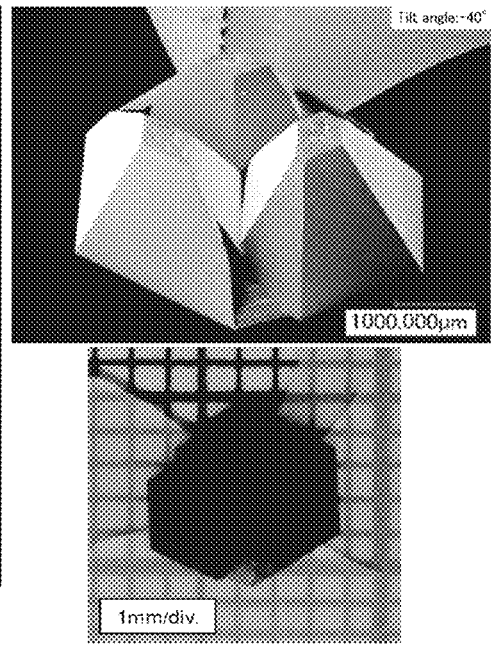

FIG. 30 shows photographs of the obtained GaN crystal. The photograph on the lower side of FIG. 30 is a photograph taken in light from behind. As shown in FIG. 30, as in Comparative Examples 1 to 4, the binding state was worse at the site at which m-planes (sides of hexagon) of the crystals face (coincide with) and associate with each other, and there were defects in the crystal.

<XRC Half Width>

Figure 31:
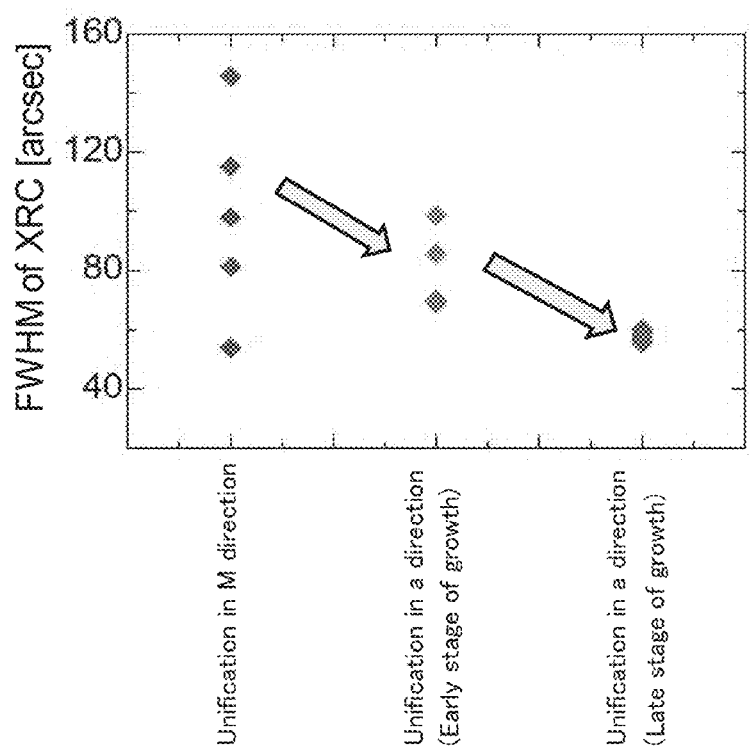
FIG. 31 is a graph showing half widths (FWHM) of crystals produced in the examples and the comparative examples, measured by XRC.

The XRC half widths (FWHM) measured in Examples 1 to 4 and Comparative Examples 1 to 5 were together shown in the graph of FIG. 31. As shown in FIG. 31, the XRC half width (FWHM) of the respective parts of each crystal in the comparative examples (unification in the m direction) varied widely. Specifically, the XRC half width (FWHM) was large in the association site (binding site) in each crystal. Thus, it was demonstrated that there was a large crystal defect such as a dislocation. In contrast, the XRC half widths (FWHM) in the early stage of crystal growth in the examples (unification in the a direction) varied slightly, and the XRC half widths (FWHM) in the late stage of crystal growth in the examples (unification in the a direction) varied more slightly. That is, it was demonstrated that, according to the examples, a GaN crystal with few defects and high quality was obtained, and a GaN crystal with fewer defect and higher quality was obtained in the late stage of crystal growth.

Example 7

Figure 32:
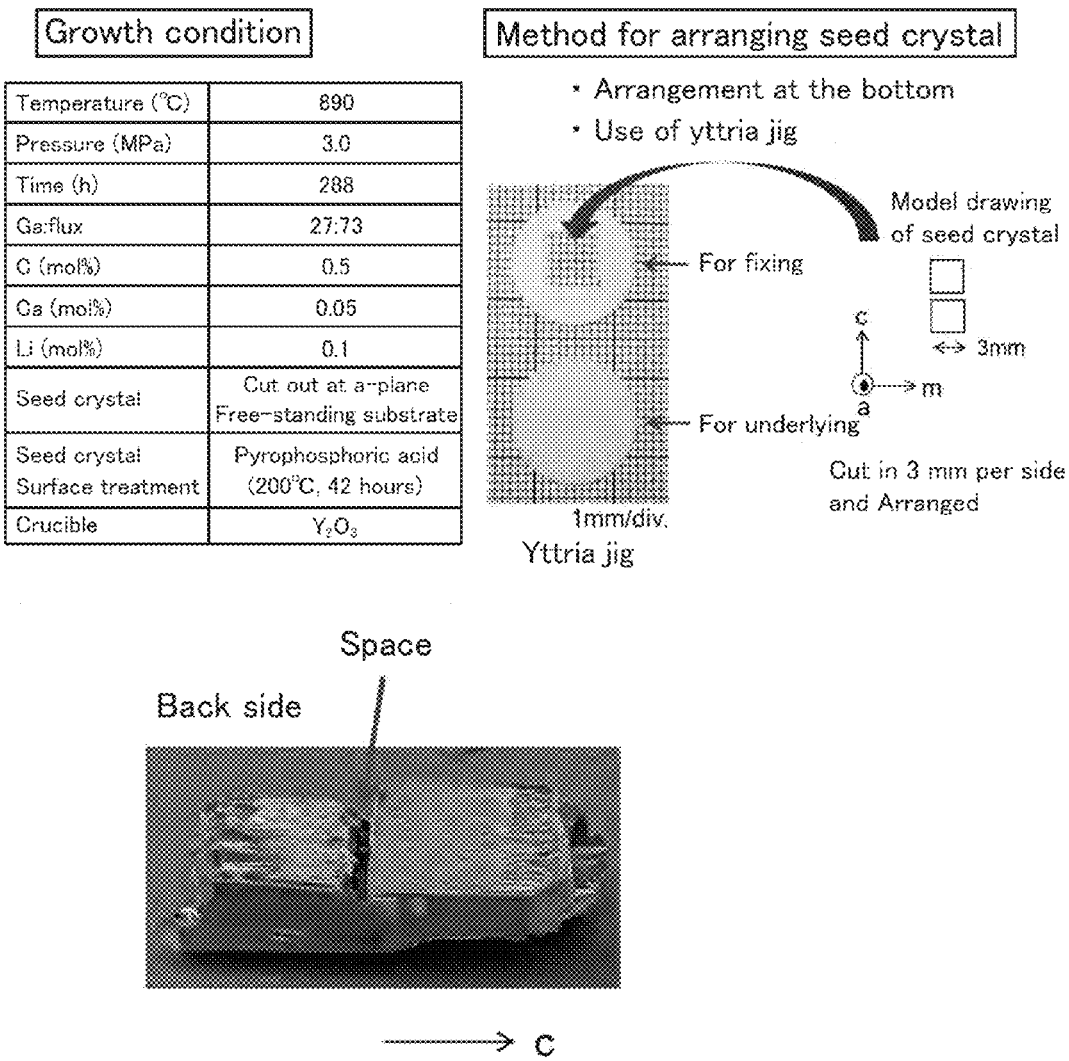
FIG. 32 shows photographs indicating yet another example of a crystal produced in Example 7.

A substrate (free-standing substrate) having the a-plane was cut out from a GaN crystal. Further, this free-standing substrate was cut in 3 mm per side so that the a-plane thereof became a crystal growth plane, and the m-axis and the c-axis thereof became parallel with each side. Thus, a seed crystal was obtained. Then, as shown on the upper right side of FIG. 32, the two seed crystals were arranged using an yttria jig so that c-axes of the seed crystals almost coincide with each other and the distance between the seed crystals was about 0.5 mm. Subsequently, crystal growth was performed under the growth conditions shown in the table on the upper left side of FIG. 32 to produce a Group III nitride crystal. A photograph of the produced Group III nitride crystal is shown on the lower side of FIG. 32. The upper surface of the crystal shown in FIG. 32 (photograph) is the a-plane, and the side surface facing the plane of paper is the m-plane. As shown in the photograph on the lower side of FIG. 32, a crystal in which the seed crystals were bound with few defects in the association site (binding site) and with high quality in the direction in which the c-axes (c-planes) of the seed crystals almost coincided with each other was obtained. Although the crystal on the a-plane side had a space in FIG. 32 (photograph), this space was a space derived from unevenness of the yttria jig and was not a crystal defect.

It was demonstrated that, according to Example 7, grown crystals were bound with few defects in the association site (binding site) of the grown crystals and high quality in the direction in which the c-axes of seed crystals that were adjacent to each other almost overlapped with each other. Further, it was demonstrated that, according to Examples 1 to 6, as mentioned above, grown crystals were bound with few defects in the association site (binding site) of the grown crystals and high quality in the direction in which the a-axes of seed crystals that were adjacent to each other almost overlapped with each other. Therefore, it was demonstrated that crystals grown from seed crystals that were adjacent to each other were bound with few defects and high quality in the c-axis (c-plane) direction and the a-axis (a-plane) direction, using the m-plane seed crystal in which the m-plane (side surface on the plane-of-paper side in the crystal shown in the photograph of FIG. 32) was a crystal growth plane. Thus, a Group III nitride crystal in a large size with few defects and high quality can be produced.

Example 8

A GaN crystal was produced in the same manner as in Example 5 except that the distance between seed crystals (the distance between through holes that are adjacent to each other in a sapphire mask) was 1 cm. Accordingly, a GaN crystal in a large size of the maximum height of 13.5 mm and the maximum diameter of 19.8 mm with few defects in the association site (binding site) of the crystals and high quality was obtained with an LPE yield of 50% (71.90 g) which was high.

Figure 34:
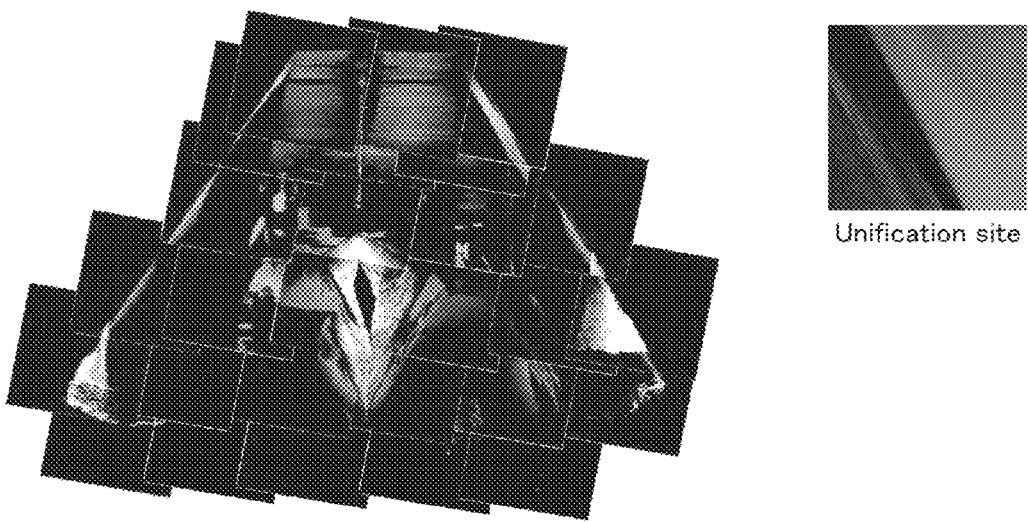
FIG. 34 shows an example of a CL (cathode luminescence) image of a crystal produced in Example 8.
Figure 35:
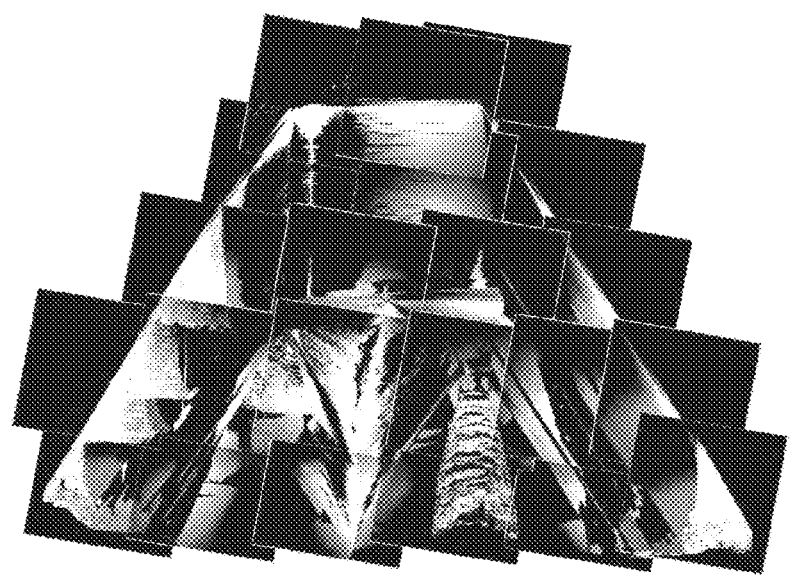
FIG. 35 shows another example of a CL (cathode luminescence) image of a crystal produced in Example 8.
Figure 36:
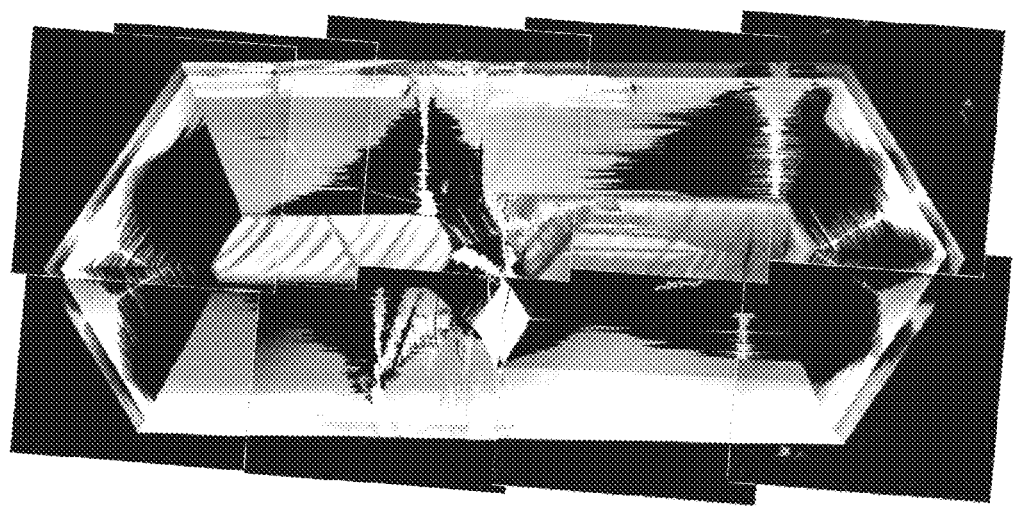
FIG. 36 shows yet another example of a CL (cathode luminescence) image of a crystal produced in Example 8.

<CL Image>
FIGS. 34 to 36 show CL images of the GaN crystal in Example 8. FIGS. 34 and 35 show cross-sectional photographs after dicing in parallel with the m-plane (lengthwise), and FIG. 36 shows cross-sectional photographs after dicing in parallel with the c-plane (crosswise). As shown in FIGS. 34 to 36, a large crystal defect was not observed. Specifically, as shown in FIG. 34, no crystal defect was observed in the unification site (means the same as the association site or the binding site) of two crystals.

Example 9

A GaN crystal was produced in the same manner as in Example 8 except that germanium (Ge) further was placed in the crucible in the crystal growth (liquid phase growth). In this case, the amount of the germanium (Ge) by mole was 0.25% by mole realative to the total amount of the Gallium (Ga) and the germanium (Ge) by mole. That is, the relationship between the amount of the gallium (Ga) by mole and the amount of the germanium (Ge) by mole was represented by the following mathematical formula (I):

$$\{Ge/(Ga+Ge)\} \times 100 = 0.25 \ [\% \text{ by mole}] \qquad (I)$$

Figure 47:
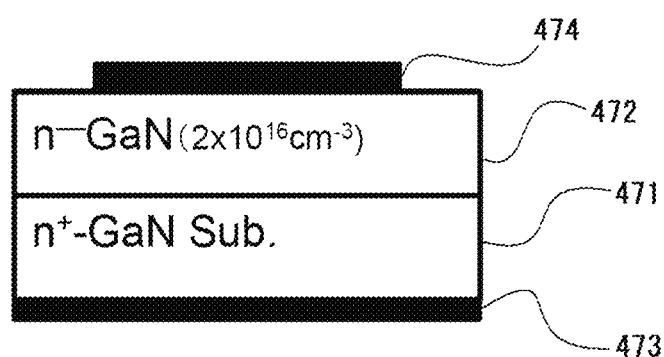
FIG. 47 is a side view schematically showing a structure of a semiconductor device of Example 9.

The GaN crystal produced in the present example was doped with germanium with a concentration of $1 \times 10^{18}$ cm$^{-3}$ as an impurity. This GaN crystal was cut to have a thickness of 0.5 mm. Thus, a GaN substrate was produced. In the present example, this GaN substrate is referred to as an "n$^+$-GaN substrate". Then, as shown in FIG. 47, 7 μm of an n-GaN layer 472 doped with $2 \times 10^{16}$ cm$^{-3}$ Si (silicon) by an organometallic vapor phase epitaxy (MOCVD: Metalorganic Chemical Vapor Deposition) was deposited on an n$^+$-GaN substrate (n$^+$-GaN Sub.) 471. Further, a nickel electrode (ohmic electrode) 473 was formed over the lower surface of the n$^+$-GaN substrate 471, and a titanium/aluminium electrode (Schottky electrode) 474 was formed over the upper surface of the n-GaN layer 472. Thus, a semiconductor device shown in FIG. 47 was obtained. A terminal structure was not formed around the Schottky electrode 474.

Figures 48A, 48B:
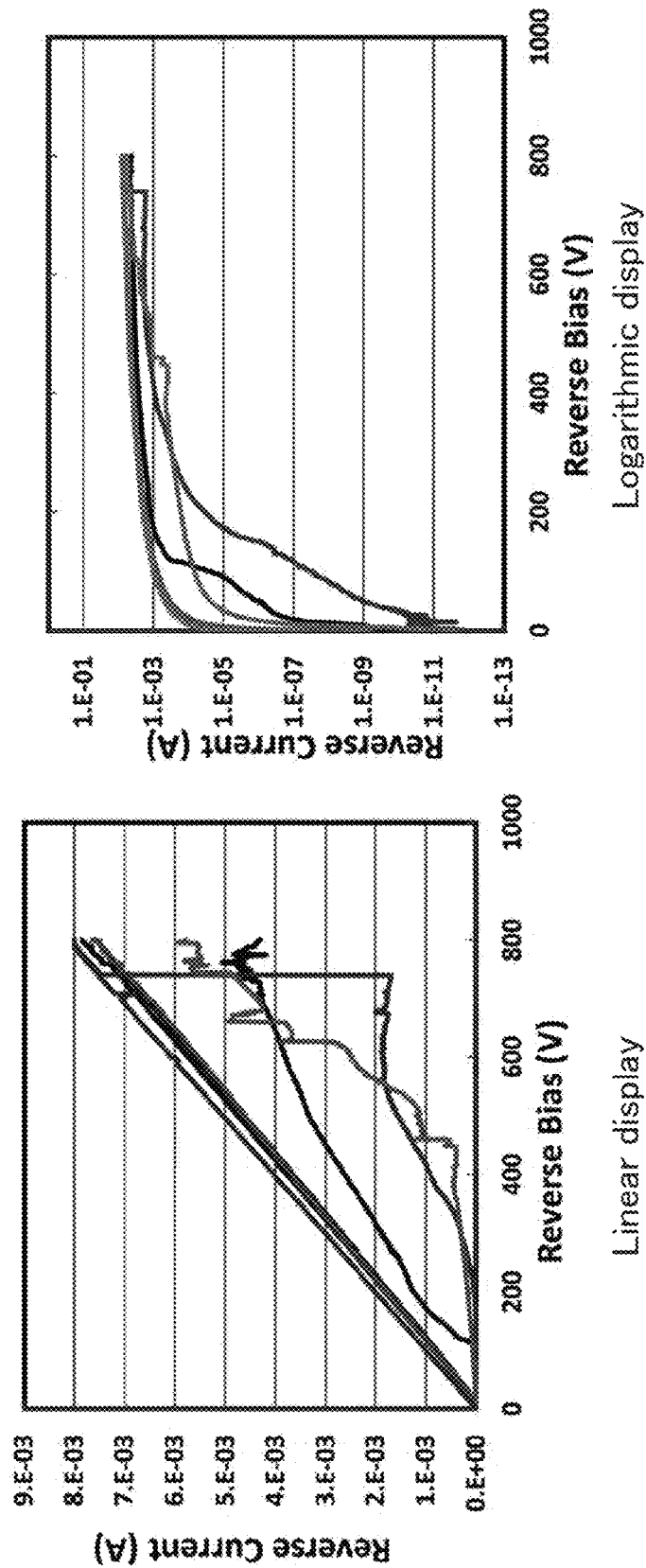
FIG. 48 shows graphs indicating characteristics of reverse withstand voltage in the semiconductor device of FIG. 47.

A voltage (reverse voltage) was applied between the lower side (ohmic electrode 473 side) as a positive side and the upper side (Sshottoky electrode 474 side) as a negative side in the device of FIG. 47, and the magnitude of the current (reverse current) was measured, and a reverse withstand voltage was evaluated. The reverse voltage and the reverse current were measured at each of measurement points in the device. The results are shown in the graphs of FIG. 48. Each of the graphs on the right side and the left side of FIG. 48 is a graph showing a relationship between the reverse voltage and the reverse current. In each of the graphs, the horizontal axis (Reverse Bias (V)) indicates the reverse voltage (V), and the vertical axis (Reverse Current (A)) indicates the reverse current (A). The left graph of FIG. 48 is a graph represented by linear display, and the right graph of FIG. 48 is a graph represented by logarithmic display. In the scales on the vertical axis, for example, "4.E-03" represents $4 \times 10^{-3}$, and "1.E-11" represents $1 \times 10^{-11}$. As shown in FIG. 48, in the device (semiconductor device) of the present example, even when the magnitude of the reverse voltage was increased to 800 V, the magnitude of the reverse current was about $8 \times 10^{-3}$ A at a maximum. Thus, it was demonstrated that the device had a really high reverse withstand voltage. It is considered that, by optimizing the growth conditions of the n-GaN layer 472 to obtain a device with higher quality, the reverse withstand voltage of the device is further improved, and the device can withstand a reverse voltage of 1 kV or more.

As shown in Examples 1 to 8 above, it was demonstrated that, according to the Group III nitride crystal production method of the present invention, a (high-performance) Group III nitride crystal in a large size with few defects and high quality could be produced. As mentioned above, it was verified by the measurements of the X-ray half width, the dislocation density, and the like that the GaN crystals produced in the examples had few defects and high quality. Moreover, the semiconductor device of Example 9, using this GaN crystal was a high-performance semiconductor device that is really superior in characteristics of reverse withstand voltage.

INDUSTRIAL APPLICABILITY

As described above, according to the present invention, a method for producing a Group III nitride crystal, capable of producing a Group III nitride crystal in a large size with few defects and high quality, a Group III nitride crystal produced by the production method, and a semiconductor device using the Group III nitride crystal can be provided. For example, by using a nitride crystal produced by the present invention as a substitute for Si in a semiconductor device such as a power device generally required to have a large diameter of Si (silicon), LED, or the like, the performance can be further improved. Therefore, the present invention exerts a great impact on the semiconductor industry. Moreover, the present invention is not limited thereby and is applicable to other semiconductor devices and other applications besides the semiconductor devices.

| Explanation of reference numerals | |
|---|---|
| 10 | substrate |
| 10a | jig |
| 11 | Group III nitride crystal layer |
| 12 | mask |
| 12a | through hole |
| 13 | Group III nitride crystal |
| 14 | cut plane |
| 52 | substrate |
| 52a | convex portion |
| 53 | Group III nitride crystal layer |
| 54 | cut plane |
| 201 | Group III nitride crystal |
| 202 | mask |
| 203 | Group III nitride crystal |
| 204 | crystal defect |
| 361 | raw material gas tank |
| 362 | pressure adjuster |
| 363 | valve for leakage |
| 364 | stainless container |
| 365 | electric furnace |
| 366 | crucible |
| 370 | electric furnace |
| 371 | chamber |
| 372 | furnace cover |
| 373 | heater |
| 3700a, 3700b, 3700c | zone |
| 374a, 374b, 374c | thermocouple |
| 375 | furnace tube |
| 376 | crucible |
| 377 | melt |
| 378 | substrate-fixing part |
| 379a, 379b | rotating motor |
| 3701 | propeller |
| 3702 | gas source |
| 3703 | pressure adjuster |
| 3704 | gas purification part |
| 380 | rocking-type LPE device |
| 381 | growth furnace |

-continued

| Explanation of reference numerals | |
|---|---|
| 382 | heater |
| 383 | thermocouple |
| 384 | crucible-fixing stage |
| 385 | crucible |
| 386 | melt |
| 387 | seed crystal |
| 388 | flow rate adjuster |
| 389 | pipe |
| 3800 | direction in which atmospheric gas is supplied |
| 3801 | rotation direction |
| 3802 | rotation axis |
| 1002 | sapphire substrate |
| 1003 | GaN crystal |
| 471 | n$^+$-GaN substrate |
| 472 | n-GaN layer |
| 473 | nickel electrode |
| 474 | titanium/aluminium electrode |

The invention claimed is:

1. A method for producing a Group III nitride crystal, comprising:
    a seed crystal selection step of selecting plural parts of previously-provided Group III nitride as seed crystals for generation and growth of Group III nitride crystals;
    a contact step of causing the surfaces of the seed crystals to be in contact with an alkali metal melt;
    a crystal growth step of causing a Group III element and nitrogen to react with each other under a nitrogen-containing atmosphere in the alkali metal melt to generate and grow Group III nitride crystals, wherein
    the seed crystals are hexagonal crystals,
    in the seed crystal selection step, the seed crystals are arranged so that a-axes or c-axes of the respective seed crystals that are adjacent to each other almost coincide with each other, and the angle formed between the a-axes or the c-axes is 5° or less, and
    in the crystal growth step, the plural Group III nitride crystals grown from the plural seed crystals by the growth of the Group III nitride crystals are bound, wherein the dislocation density of the produced Group III nitride crystal is $1.0 \times 10^4$ cm$^{-2}$ or less.

2. The method according to claim 1, wherein
    the seed crystals have the respective c-planes,
    in the seed crystal selection step, the c-planes are selected as crystal growth planes of the respective seed crystals, and
    the seed crystals are arranged so that a-axes of the seed crystals that are adjacent to each other almost coincide with each other.

3. The method according to claim 1, wherein
    in the seed crystal selection step, the previously-provided Group III nitride is a Group III nitride crystal layer, and the step of selecting plural parts of previously-provided Group III nitride as seed crystals includes:
        arranging a mask having plural through holes on the Group III nitride crystal layer, and selecting planes of the Group III nitride crystal layer exposed from the through holes as the seed crystals, or
    in the seed crystal selection step, the previously-provided Group III nitride comprises plural Group III nitride crystals arranged on a substrate, and the plural Group III nitride crystals are selected as the seed crystals.

4. The method according to claim 3, wherein
    in the seed crystal selection step,
    the previously-provided Group III nitride is a Group III nitride crystal layer, a mask having plural through holes is arranged on the Group III nitride crystal layer, planes of the Group III nitride crystal layer exposed from the through holes are selected as the seed crystals, and the mask does not adhere to the Group III nitride crystal layer.

5. The method according to claim 3, wherein in the seed crystal selection step, the contact step, and the crystal growth step, plural units each composed of the Group III nitride crystal layer and the mask or plural units each composed of the substrate and the Group III nitride layer are adjacently arranged in parallel, and in the crystal growth step, the Group III nitride crystals grown from the respective units that are adjacent to each other are bound by the growth of the Group III nitride crystals.

6. The method according to claim 3, wherein the mask or the substrate comprises at least one selected from the group consisting of $Al_xGa_{1-x}N$ (0<x≤1), an oxide of the $Al_xGa_{1-x}N$ (0<x≤1), diamond-like carbon, silicon nitride, silicon oxide, silicon oxynitride, aluminum oxide, aluminum oxynitride, silicon carbide, yttrium oxide, yttrium aluminum garnet (YAG), tantalum, rhenium, and tungsten.

7. The method according to claim 3, wherein the through holes of the mask or convex portions of the substrate each has a dot shape.

8. The method according to claim 7, wherein the diameter of the dot is in the range from 0.01 to 10 mm.

9. The method according to claim 3, wherein a distance between the through holes of the mask adjacent to each other or a distance between convexes of the substrate adjacent to each other is 0.05 mm or more.

10. The method according to claim 1, wherein the Group III nitride crystals generated and grown in the crystal growth step are Group III nitride crystals represented by $Al_xGa_yIn_{1-x-y}N$ (0≤x≤1, 0≤y≤1, x+y≤1).

11. The method according to claim 1, wherein the diameter of the produced Group III nitride crystal is 15 cm or more.

* * * * *